(12) United States Patent
Gogotsi et al.

(10) Patent No.: US 12,048,132 B2
(45) Date of Patent: Jul. 23, 2024

(54) TRANSITION METAL CARBONITRIDE MXENE FILMS FOR EMI SHIELDING

(71) Applicants: KOREA INSTITUTE OF SCIENCE AND TECHNOLOGY, Seoul (KR); DREXEL UNIVERSITY, Philadelphia, PA (US)

(72) Inventors: Yury Gogotsi, Philadelphia, PA (US); Kanit Hantanasirisakul, Philadelphia, PA (US); Chong Min Koo, Seoul (KR); Aamir Iqbal, Seoul (KR); Soon Man Hong, Seoul (KR); Seon Joon Kim, Seoul (KR); Seung Sang Hwang, Seoul (KR); Kyung Youl Baek, Seoul (KR); Albert Lee, Seoul (KR); Sangho Cho, Seoul (KR)

(73) Assignees: Korea Institute of Science and Technology, Seoul (KR); Drexel University, Philadelphia, PA (US)

( * ) Notice: Subject to any disclaimer, the term of this patent is extended or adjusted under 35 U.S.C. 154(b) by 590 days.

(21) Appl. No.: 17/179,332

(22) Filed: Feb. 18, 2021

(65) Prior Publication Data

US 2021/0261415 A1 Aug. 26, 2021

Related U.S. Application Data

(60) Provisional application No. 62/979,365, filed on Feb. 20, 2020.

(51) Int. Cl.
| | |
|---|---|
| H05K 9/00 | (2006.01) |
| C01B 21/082 | (2006.01) |
| C23C 16/30 | (2006.01) |

(52) U.S. Cl.
CPC ....... H05K 9/0088 (2013.01); C01B 21/0828 (2013.01); C23C 16/30 (2013.01);
(Continued)

(58) Field of Classification Search
None
See application file for complete search history.

(56) References Cited

U.S. PATENT DOCUMENTS 10,756,345 B2 * 8/2020 Beidaghi ............. H01M 10/054
11,278,862 B2 * 3/2022 Gogotsi ............... B01J 20/0214
(Continued)

OTHER PUBLICATIONS

Bu et al. (Nano Today 30, 2020, 100803). (Year: 2020).*
(Continued)

*Primary Examiner* — Kevin M Bernatz
(74) *Attorney, Agent, or Firm* — Rabin & Berdo, P.C.

(57) ABSTRACT

In an aspect, the present disclosure provides a heat-treated transition metal carbonitride MXene film annealed at high temperatures and a polymer composite comprising the same. In another aspect, the present disclosure provides a method for producing a heat-treated transition metal carbonitride MXene film comprising: obtaining a MXene aqueous solution containing dispersed 2-dimensional (2D) MXenes through an acid etching process; filtering the obtained MXene aqueous solution through a vacuum filtration process to produce a free-standing film; and annealing the produced free-standing film at high temperatures to obtain a heat-treated transition metal carbonitride MXene film. In still another aspect, the present disclosure provides an electromagnetic interference (EMI) shielding method comprising: superposing a coating comprising a heat-treated transition metal carbonitride MXene film on at least one surface of an object in a contact or non-contact manner.

13 Claims, 70 Drawing Sheets

(52) U.S. Cl.
CPC ..... *B32B 2255/205* (2013.01); *C01P 2004/04* (2013.01); *C01P 2006/14* (2013.01); *C01P 2006/40* (2013.01)

(56) References Cited

U.S. PATENT DOCUMENTS

| | | | | |
|---|---|---|---|---|
| 11,296,243 | B2* | 4/2022 | Ghidiu | C04B 35/56 |
| 11,456,527 | B2* | 9/2022 | Gogotsi | H01Q 1/368 |
| 11,470,424 | B2* | 10/2022 | Spinelli | C01B 32/90 |
| 11,554,961 | B2* | 1/2023 | Barsoum | C01B 32/921 |
| 11,773,480 | B2* | 10/2023 | Gu | C04B 35/4682 427/126.3 |

OTHER PUBLICATIONS

Faisal Shahzad et al., "Electromagnetic interference shielding with 2D transition metal carbides (MXenes)", Materials Science, Sep. 9, 2016, pp. 1137-1140, vol. 353, Issue 6304.

Yu Han et al., "Crackle template based metallic mesh with highly homogeneous light transmission for high-performance transparent EMI shielding", Scientific Reports, May 6, 2016, pp. 1-11, vol. 6, No. 25601.

Bin Shen et al., "Ultrathin Flexible Graphene Film: An Excellent Thermal Conducting Material with Efficient EMI Shielding", Advanced Functional Materials, 2014, pp. 4542-4548, vol. 24.

Wen-Tae Cao et al., "Binary Strengthening and Toughening of MXene/Cellulose Nanofiber Composite Paper with Nacre-Inspired Structure and Superior Electromagnetic Interference Shielding Properties", ACS NANO, 2018, pp. 4583-4593, vol. 12.

Guo-Ming Weng et al., "Layer-by-Layer Assembly of Cross-Functional Semi-transparent MXene-Carbon Nanotubes Composite Films for Next-Generation Electromagnetic Interference Shielding", Advanced Functional Materials, 2018, pp. (1-9), vol. 28, No. 1803360.

Zongping Chen et al., "Lightweight and Flexible Graphene Foam Composites for High-Performance Electromagnetic Interference Shielding", Advanced Materials, 2013, pp. 1296-1300, vol. 25.

Xinli Liu et al., "Electromagnetic interference shielding effectiveness of titanium carbide sheets", Materials Letters, 2017, pp. 261-263, vol. 205.

Mohammed H. Al-Saleh et al., "EMI shielding effectiveness of carbon based nanostructured polymeric materials: A comparative study", Carbon, 2013, pp. 146-156, vol. 60.

Ning Li et al., "Electromagnetic Interference (EMI) Shielding of Single-Walled Carbon Nanotube Epoxy Composites", Nano Letters, 2006, pp. 1141-1145, vol. 6, No. 6.

Mao-Sheng Cao et al., "Ultrathin graphene: electrical properties and highly efficient electromagnetic interference shielding", Journal of Materials Chemistry C, 2015, pp. 6589-6599, vol. 3.

Zhenyu Li et al., "Theoretical Study of Electromagnetic Interference Shielding of 2D MXenes Films", Metals, 2018, pp. 1-8, vol. 8, No. 652.

Ji Liu et al., "Hydrophobic, Flexible, and Lightweight MXene Foams for High-Performance Electromagnetic-Interference Shielding", Advanced Materials, 2017, pp. 1-6, vol. 29, No. 1702367.

Renhui Sun et al., "Highly Conductive Transition Metal Carbide/ Carbonitride-(Mxene)@polystyrene Nanocomposites Fabricated by Electrostatic Assembly for Highly Efficient Electromagnetic Interference Shielding", Advanced Functional Materials, 2017, pp. 1-11, vol. 27, No. 1702807.

Meikang Han et al., "Anisotropic MXene Aerogels with a Mechanically Tunable Ratio of Electromagnetic Wave Reflection to Absorption", Advanced Optical Materials, 2019, pp. 1-7, vol. 7, No. 1900267.

Pradeep Sambyal et al., "Ultralight and Mechanically Robust TisC2Tx Hybrid Aerogel Reinforced by Carbon Nanotubes for Electromagnetic Interference Shielding", ACS Applied Materials & Interfaces, 2019, pp. 38046-38054, vol. 11.

Kanit Hantanasirisakul te al., "Electronic and Optical Properties of 2D Transition Metal Carbides and Nitrides (MXenes)", Advanced Materials, 2018, pp. 1-30, vol. 30, No. 1804779.

Kanit Hantanasirisakul et al., "Effects of Synthesis and Processing on Optoelectronic Properties of Titanium Carbonitride MXene", Chemistry of Materials, 2019, pp. 2941-2951, vol. 31.

M. Radovic et al., "Elastic properties and phonon conductivities of $Ti_3Al$ $(C_{0.5}, N_{0.5})_2$ and $Ti_{2Al}$ $(C_{0.5}, N_{0.5})$ solid solutions", J. Mater. Res., Jun. 2008, pp. 1517-1521, vol. 23, No. 6.

Michael Naguib et al., "Two-Dimensional Nanocrystals Produced by Exfoliation of $Ti_3AlC_2$", Advanced Materials, 2011, pp. 4248-4253, vol. 23.

Meikang Han et al., "$Ti_3C_2$ MXenes with Modified Surface for High-Performance Electromagnetic Absorption and Shielding in the X-Band, ACS Applied Materials & Interfaces, 2016, pp. 21011-21019, vol. 8.

Ravi P. Pandey et al., "Ultrahigh-flux and fouling-resistant membranes based on layered silver/MXene ($Ti_3C_2T_x$) nanosheets", Journal of Material Chemistry A, 2018, pp. 3522-3533, vol. 6.

Seon Joon Kim et al., "Metallic $Ti_3C_2T_x$ MXene Gas Sensors with Ultrahigh Signal-to-Noise Ratio", ACS Nano, 2018, pp. 986-993, vol. 12.

James L. Hart et al., "Control of MXenes' electronic properties through termination and intercalation", Nature Communications, 2019, 1-10, vol. 10, No. 522.

Guanglong Liu et al., "Synthesis, characterization and photocatalytic evaluation of visible light activated C-doped $TiO_2$ nanoparticles", Nanotechnology, 2012, pp. 1-10, vol. 23, No. 294003.

Yu Xu et al., "Light-Weight Silver Plating Foam and Carbon Nanotube Nybridized Epoxy Composite Foams with Exceptional Conductivity and Electromagnetic Shielding Property", ACS Applied Materials & Interfaces, 2016, pp. 24131-24142, vol. 8.

Touseef Habib et al., "Heating of $Ti_3C_2T_x$ MXene/polymer composites in response to Radio Frequency fields", Scientific Reports, 2019, pp. 1-7, vol. 9, No. 16489.

Rick Moore, "Electromagnetic Composites Handbook", Second Edition, McGraw-Hill Education, 2016, pp. 63-87.

Max Born et al., "Principles of Optics", Electromagnetic Theory of Propagation, Interference and Diffraction of Light, Cambridge University Press, 2016, pp. 1-20.

Rakhesh S. Kshetrimayum, "A brief intro to metamaterials", IEEE Potentials, 2005, pp. 44-46, vol. 23.

N. I. Landy et al., "Perfect Metamaterial Absorber", Physical Review Letters, May 23, 2008, vol. 100, No. 207402.

K. L. Kaiser, "Electromagnetic Shielding", Taylor & Francis, 2005, pp. 1-18.

J. Joo et al., "High frequency electromagnetic interference shielding response of mixtures and multilayer films based on conducting polymers", Journal of Applied Physics, 2000, pp. 513-518, vol. 88, No. 1.

Grant R. Fowles, "Introduction to Modern Optics", Dover Publications, 1989.

Lu Zhang et al., "Preparation and characterization of graphene paper for electromagnetic interference shielding", Carbon, 2015, pp. 353-359, vol. 82.

Jiabin Xi et al., "Graphene aerogel films with expansion enhancement effect of high-performance electromagnetic interference shielding", Carbon, 2018, pp. 44-51, vol. 135.

Luo Kong et al., "Macroscopic bioinspired graphene sponge modified with in-situ grown carbon nanowires and its electromagnetic properties", Carbon, 2017, 94-102, vol. 111.

Qiang Song et al., "Carbon Nanotube-Multilayered Graphene Edge Plane Core-Shell Hybrid Foams for Ultrahigh-Performance Electromagnetic-Interference Shielding", Advanced Materials, 2017, pp. 1-8, vol. 29, No. 1701583.

Ding-Xiang Yan et al., "Structured Reduced Graphene Oxide/ Polymer Composites for Ultra-Efficient Electromagnetic Interference Shielding", Advanced Functional Materials, 2015, pp. 559-566, vol. 25.

Ding-Xiang Yan et al., "Efficient electromagnetic interference shielding of lightweight graphene/polystyrene composite", Journal of Materials Chemistry, 2012, pp. 18772-18774, vol. 22.

(56) References Cited

OTHER PUBLICATIONS

Nidhi Agnihotri et al., "Highly efficient electromagnetic interference shielding using graphite nanoplatelet/poly(3,4-ethylenedioxythiophene)-poly(styrenesulfonate) composites with enhanced thermal conductivity", RSC Advances, 2015, pp. 43765-43771, vol. 5.
Fan Xu et al., "Superflexible Interconnected Graphene Network Nanocomposites for High- Performance Electromagnetic Interference Shielding", ACS Omega, 2018, pp. 3599-3607, vol. 3.
Bin Shen et al., "Lightweight, Multifunctional Polyetherimide/Graphene@Fe3O4 Composite Foams for Shielding of Electromagnetic Pollution", ACS Applied Materials & Interfaces, 2013, pp. 11383-11391, vol. 5.
Jianqiang Ling et al., "Facile Preparation of Lightweight Microcellular Polyetherimide/Graphene Composite Foams for Electromagnetic Interference Shielding", ACS Applied Materials & Interfaces, 2013, pp. 2677-2684, vol. 5.
Yang Li et al., "Polyimide/graphene composite foam sheets with ultrahigh thermostability for electromagnetic interference shielding", RSC Advances, 2015, pp. 24342-24351, vol. 5.
Jaber Nasrollah Gavgani et al., "Lightweight flexible polyurethane/reduced ultralarge graphene oxide composite foams for electromagnetic interference shielding", RSC Advances, 2016, pp. 27517-27527, vol. 6.
Ying Wu et al., "Ultralight Graphene Foam/Conductive Polymer Composites for Exceptional Electromagnetic Interference Shielding", ACS Applied Materials & Interfaces, 2017, pp. 9059-9069, vol. 9.
Wei-Li Song et al., "Magnetic and conductive graphene papers toward thin layers of effective electromagnetic shielding", Journal of Materials Chemistry A, 2015, pp. 2097-2107, vol. 3.
Nariman Yousefi et al., "Highly Aligned Graphene/Polymer Nanocomposites with Excellent Dielectric Properties for High-Performance Electromagnetic Interference Shielding", Advanced Materials, 2014, pp. 5480-5487, vol. 26.
Yuhang Liu et al., "Hydrated aramid nanofiber network enhanced flexible expanded graphite films towards high EMI shielding and thermal properties", Composites Science and Technology, 2018, pp. 28-37, vol. 168.
Yuan-Qing Li et al., "Lightweight and Highly Conductive Aerogel-like Carbon from Sugarcane with Superior Mechanical and EMI Shielding Properties", ACS Sustainable Chemistry & Engineering, 2015, pp. 1419-1427, vol. 3.
Liying Zhang et al., "Phthalonitrile-Based Carbon Foam with High Specific Mechanical Strength and Superior Electromagnetic Interference Shielding Performance", ACS Applied Materials and Interfaces, 2016, pp. 7422-7430, vol. 8.
F. Moglie et al., "Electromagnetic shielding performance of carbon foams", Carbon, 2012, pp. 1972-1980, vol. 50.
Shaowei Lu et al., "Flexible, mechanically resilient carbon nanotube composite films for high- efficiency electromagnetic interference shielding", Carbon, 2018, pp. 387-394, vol. 136.
Yonglai Yang et al., "Novel Carbon Nanotube-Polystyrene Foam Composites for Electromagnetic Interference Shielding", Nano Letters, 2005, pp. 2131-2134, vol. 5, No. 11.
Anisha Chaudhary et al., "Lightweight and Easily Foldable MCMB-MWCNTs Composite Paper with Exceptional Electromagnetic Interference Shielding", ACS Applied Materials and Interfaces, 2016, pp. 10600-10608, vol. 8.
Shailaja Pande et al., "Mechanical and electrical properties of multiwall carbon nanotube/polycarbonate composites for electrostatic discharge and electromagnetic interference shielding application", RSC Advances, 2014, pp. 13839-13849, vol. 4.
Mohammad Arjmand et al., "Comparative study of electromagnetic interference shielding properties of injection molded versus compression molded multi-walled carbon nanotube/polystyrene composites", Carbon, 2012, pp. 5126-5134, vol. 50.
Zhihui Zeng et al., "Lightweight and Anisotropic Porous MWCNT/WPU Composites for Ultrahigh Performance Electromagnetic Interference Shielding", Advanced Functional Materials, 2016, pp. 303-310, vol. 26.
Erzhen Zhou et al., "Synergistic effect of graphene and carbon nanotube for high-performance electromagnetic interference shielding films", Carbon, 2018, pp. 316-322, vol. 133.
Dongwei Lu et al., "Flexible, lightweight carbon nanotube sponges and composites for high-performance electromagnetic interference shielding", Carbon, 2018, pp. 457-463, vol. 133.
Keju Ji et al., "Fabrication and electromagnetic interference shielding performance of open-cell foam of a Cu—Ni alloy integrated with CNTs", Applied Surface Science, 2014, pp. 351-356, vol. 311.
Aboutaleb Ameli et al., "Lightweight Polypropylene/Stainless-Steel Fiber Composite Foams with Low Percolation for Efficient Electromagnetic Interference Shielding", ACS Applied Materials & Interfaces, 2014, pp. 11091-11100, vol. 6.
Seung Hwan Lee et al., "Density-tunable lightweight polymer composites with dual-functional ability of efficient EMI shielding and heat dissipation", Nanoscale, 2017, pp. 13432-13440, vol. 9.
Xiaoping Shui et al., "Nickel Filament Ploymer-Matrix Composites with Low Surface Impedance and High Electromagnetic Interference Shielding Effectiveness", Journal of Electronic Materials, 1997, pp. 928-934, vol. 26, No. 8.
Yan-Jun Wan et al., "Anticorrosive, Ultralight, and Flexible Carbon-Wrapped Metallic Nanowire Hybrid Sponges for Highly Efficient Electromagnetic Interference Shielding", Small, 2018, pp. 1-11, vol. 14, No. 1800534.
Zhihui Zeng et al., "Ultralight and Flexible Polyurethane/Silver Nanowire Nanocomposites with Unidirectional Pores for Highly Effective Electromagnetic Shielding", ACS Applied Materials & Interfaces, 2017, pp. 32211-32219, vol. 9.
Jingjing Ma et al., "A comparative study of structure and electromagnetic interference shielding performance for silver nanostructure hybrid polyimide foams", RSC Advances, 2015, pp. 65283-65296, vol. 5.
Sen Lin et al., "Room-temperature production of silver-nanofiber film for large-area, transparent and flexible surface electromagnetic interference shielding", npj Flexible Electronics, 2019, pp. 1-8, vol. 3, No. 6.
X. Luo et al., Electromagnetic interference shielding reaching 130 dB using flexible graphite, Carbon, 19965, pp. 1293-1303, vol. 34, No. 10.
Qinlong Wen et al., "High performance electromagnetic interference shielding of lamellar $MoSi_2$/glass composite coatings by plasma spraying", Journal of Alloys and Compounds, 2016, pp. 359-365, vol. 666.
Avanish Pratap Singh et al., "Encapsulation of v-$Fe_2O_3$ decorated reduced graphene oxide in polyanile core-shell tubes as an exceptional tracker for electromagnetic environmental pollution", Journal of Materials Chemistry A, 2014, pp. 3581-3593, vol. 2.
Kuldeep Singh et al., "Nanostructured graphene/$Fe_3O_4$ incorporated polyaniline as a high performance shield against electromagnetic pollution", Nanoscale, 2013, pp. 2411-2420, vol. 5.
Avanish Pratap Singh et al., "Probing the engineered sandwich network of vertically aligned carbon nanotube-reduced graphene oxide composites for high performance electromagnetic interference shielding applications", Carbon, 2015, pp. 79-88, vol. 85.
Qing Yuchang et al., Graphene nanosheets/$BaTiO_3$ ceramics as highly efficient electromagnetic interference shielding materials in the X-band, Journal of Materials Chemistry C, 2016, pp. 371-375, vol. 4.
Cheng Xiang et al., "Lightweight and ultrathin $TiO_2$—$Ti_3C_2T_x$/graphene film with electromagnetic interference shielding", Chemical Engineering Journal, 2019, pp. 1158-1166, vol. 360.

\* cited by examiner

25 °C

150 °C

TRANSITION METAL CARBONITRIDE MXENE FILMS FOR EMI SHIELDING

CROSS REFERENCE TO RELATED APPLICATIONS

This application claims the benefit of U.S. Provisional Patent Application No. 62/979,365, filed Feb. 20, 2020 and entitled "Transition Metal Carbonitride MXene Films EMI Shielding" the entire contents of which are incorporated herein by reference.

BACKGROUND

1. Field

The present disclosure relates to a 2-dimensional (2D) transition metal carbonitride MXene film for efficiently absorbing electromagnetic waves, a method of producing the same, and a method for electromagnetic interference (EMI) shielding and electromagnetic absorption using the same.

DESCRIPTION OF GOVERNMENT-FUNDED RESEARCH AND DEVELOPMENT

This research is conducted by Korea Institute of Science and Technology under the support of building technology research project of the Ministry of Land, Infrastructure and Transport (Development of EMP shielding construction materials and subsidiary materials, Project Series No.: 1615010726), individual basic research project of the Ministry of Science and ICT (Development of technology for synthesis of transition metal carbide MXene 2D nanomaterials and electromagnetic shielding/absorption/control using the same, Project Series No.: 1711084370), and future material discovery support of the Ministry of Science and ICT (Development of original technology for 2D nanomaterial based millimeter wave shielding/absorption/radiation multifunctional composite materials, Project Series No.: 1711098073).

2. Background Art

Telecommunication devices and electronic circuits receive, transmit and/or propagate electromagnetic waves (EMWs) of a broad range of frequencies. The technology development towards smaller and smarter electronic devices inevitably raises an electromagnetic interference (EMI) issue due to electromagnetic induction by electromagnetic waves. EMI has a greater influence on a short range, and causes cross-talk of signals between an electronic device and a circuit during operation, device malfunction, device performance degradation, data loss and data misinterpretation. Moreover, in the aerospace technology including military aircraft, warships and other strategic components, EMI may cause serious device malfunction and failure and threaten the national security. Additionally, EMI may adversely affect human health.

Recently, with the dramatic rises in the number of electronic devices and elements and the increasing exposure to electromagnetic communication such as Wi-Fi and Internet of Things (IOT), it is very important to provide suitable shielding against the adverse impact of EMI, and the importance of development of high-tech EMI shielding materials is also growing. When considering recent commercialization of 5G wireless devices and vulnerability of high-tech electronic devices, it is required that new EMI shielding materials to be developed will have high conductivity, mechanical flexibility, easy processability and outstanding shielding and absorption properties even at a small thickness.

However, the most commonly used conducting and non-magnetic shielding materials, such as pure metals and carbon-based nanomaterials including graphene and carbon nanotubes, hardly meet these requirements.

Additionally, EMI shielding by absorption rather than by reflection is ideal, and shielding by reflection has a risk of secondary damage caused by the reflected EMWs. However, common shielding materials are based on reflection shielding due to their high electrical conductivity, and there is a need for development of shielding materials with improved absorption properties.

MXene materials are 2-dimensional (2D) crystalline nanomaterials including transition metal carbide, transition metal nitride, and transition metal carbonitride. $Ti_3C_2T_x$ MXene is a typical MXene and has a strong potential in EMI shielding applications, and specifically, it has been reported that 45 μm-thick $Ti_3C_2T_x$ MXene films have good mechanical flexibility and processability and exhibit the EMI shielding effectiveness (SE) of 92 dB. The $Ti_3C_2T_x$ MXenes are described in U.S. patent application Ser. No. 16/092,338, filed Apr. 21, 2017, the disclosure of which is incorporated by reference herein in its entirety at least for the teaching of compositions, properties and production methods of $Ti_3C_2T_x$ MXenes.

$Ti_3C_2T_x$ MXenes having high electrical conductivity ($\sigma$=~4500 S/cm) exhibit strong reflection of EMWs due to high electron density, such strong reflection may cause secondary pollution, and there is a further need for development of MXene materials with improved absorption properties.

Meanwhile, 2D MXenes with the general formula $M_{n+1}X_nT_x$ can be synthesized from MAX phases, and specifically, they are obtained by selectively removing the "A" element of Group 13 or 14 elements (for example, Al, Si, etc.) through the chemical etching process in acidic aqueous conditions, and in the general formula, M represents an early transition metal (Ti, Mo, Nb, Hf, V, Sc, Cr, Ta, Zr, W, etc.), X represents carbon and/or nitrogen, and $T_x$ represents terminating groups such as —OH, =O, —F and —Cl. The quality and diversity of MAX phases can be optimized by tuning the composition of each element, i.e., M, A, and X, resulting in perfect structures or solid solutions. There are mono-transition metal (M) and double-transition metal (M' and M" where the number of M layers is 3 or greater) MAX phases by modifying the M element, and the MAX phases are transformed to corresponding MXenes. Transition metal carbonitride is MXene where X is a solid solution of carbon (C) and nitrogen (N), and the tunable chemical elements of MXenes provide a wide range of electrical, optical and mechanical properties. More than 100 MAX phases have been experimentally reported so far, and transformations of approximately 30 MAX phases of them to MXenes are presented. All the MXenes possess different properties depending on their frameworks and thus differently work depending on specific situations.

SUMMARY

In an aspect, the present disclosure is directed to providing a heat-treated transition metal carbonitride MXene film with even more outstanding electromagnetic interference (EMI) shielding and absorption effectiveness than high conductivity metal foils and the existing materials including $Ti_3C_2T_x$ MXenes known as having the highest EMI shielding properties at similar thickness of tens of micrometers.

The present disclosure provides, as an embodiment, a heat-treated transition metal carbonitride MXene film annealed at high temperatures and a polymer composite comprising the same.

The present disclosure provides, as another embodiment, a method for producing a heat-treated transition metal carbonitride MXene film comprising: obtaining a MXene aqueous solution containing dispersed 2-dimensional (2D) MXenes through an acid etching process; filtering the obtained MXene aqueous solution through a vacuum filtration process to produce a free-standing film; and annealing the produced free-standing film at high temperatures to obtain a heat-treated transition metal carbonitride MXene film.

The present disclosure provides, as still another embodiment, an EMI shielding method comprising: superposing a coating comprising a heat-treated transition metal carbonitride MXene film on at least one surface of an object in a contact or non-contact manner.

The heat-treated transition metal carbonitride MXene film according to the present disclosure has even more outstanding EMI shielding and absorption effectiveness than $Ti_3C_2T_x$ MXenes having higher electrical conductivity values than the existing shielding materials and transition metal carbonitride, and can be used in EMI shielding and a wide range of related applications.

In addition to the outstanding EMI shielding effectiveness, the heat-treated transition metal carbonitride MXene film according to the present disclosure has low weight, sufficient mechanical strength and flexibility and high adhesive strength, and can be used in various types of electronic device applications.

BRIEF DESCRIPTION OF DRAWINGS

The present disclosure is described in more detail with reference to the accompanying drawings. Although exemplary embodiments for describing the present disclosure are shown in the drawings, the disclosed subject matter is not limited to the disclosure in the drawings. Additionally, the drawings are not necessarily drawn to scale.

In FIGS. 20A to 20C, the EMI absolute shielding effectiveness $SE_T$, $SE_R$, and $SE_A$ values were measured at 8.2 GHz frequency.

In FIGS. 21A to 21C, the EMI absolute shielding effectiveness $SE_T$, $SE_R$, and $SE_A$ values were measured at 8.2 GHz frequency.

Figure 1A:
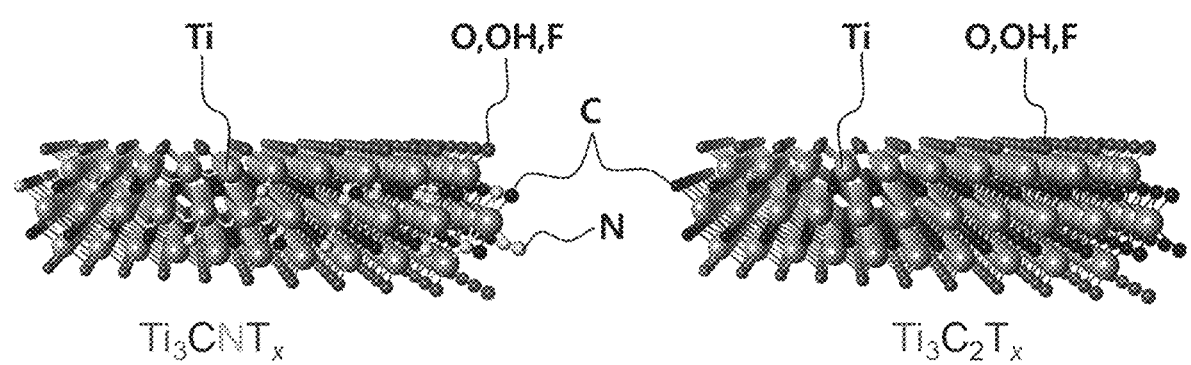
FIG. 1A schematically shows the atomic crystal structure of $Ti_3CNT_x$ and $Ti_3C_2T_x$ MXenes.

DETAILED DESCRIPTION $Ti_3C_2T_x$ MXene, which is a typical 2-dimensional (2D) MXene material, has the highest electrical conductivity among MXenes, and accordingly, it has been expected that $Ti_3C_2T_x$ MXene would provide the best electromagnetic interference (EMI) shielding properties, but due to high electron density, $Ti_3C_2T_x$ MXene shows strong reflection of EMWs, and there was a risk of secondary damage caused by the strong reflection.

To solve the problem, the inventors developed MXene materials with improved electromagnetic absorption properties. The heat-treated transition metal carbonitride MXene film disclosed herein has improved absorption properties by changes of surface terminations through annealing and pore formation in the film, and consequential significant increase in EMI shielding effectiveness (SE).

Accordingly, the present disclosure relates to a transition metal carbonitride MXene film which is effective for EMI shielding and absorption and a method producing the same, and an EMI shielding method using the same.

In an aspect, the present disclosure may relate to a heat-treated transition metal carbonitride MXene film annealed at 100-500° C.

In an embodiment, the heat-treated transition metal carbonitride MXene film may be annealed at the temperature of 100° C. or more, 110° C. or more, 120° C. or more, 130° C. or more, 140° C. or more, 150° C. or more, 160° C. or more, 170° C. or more, 180° C. or more, 190° C. or more, 200° C. or more, 210° C. or more, 220° C. or more, 230° C. or more, 240° C. or more, 250° C. or more, 260° C. or more, 270° C. or more, 280° C. or more, 290° C. or more, 300° C. or more, 310° C. or more, 320° C. or more, 330° C. or more, 340° C. or more, 350° C. or more, 360° C. or more, 370° C. or more, 380° C. or more, 390° C. or more, 400° C. or more, 410° C.

or more, 420° C. or more, 430° C. or more, 440° C. or more, 450° C. or more, 460° C. or more, 470° C. or more, 480° C. or more, or 490° C. or more, and the heat-treated transition metal carbonitride MXene film may be annealed at the temperature of 500° C. or less, 490° C. or less, 480° C. or less, 470° C. or less, 460° C. or less, 450° C. or less, 440° C. or less, 430° ° C. or less, 420° C. or less, 410° C. or less, 400° C. or less, 390° C. or less, 380° C. or less, 370° C. or less, 360° C. or less, 350° C. or less, 340° C. or less, 330° C. or less, 320° C. or less, 310° C. or less, 300° C. or less, 290° C. or less, 280° C. or less, 270° C. or less, 260° C. or less, 250° C. or less, 240° C. or less, 230° C. or less, 220° C. or less, 210° C. or less, 200° C. or less, 190° C. or less, 180° C. or less, 170° C. or less, or 160° C. or less.

In an embodiment, the MXene film may have a porous structure with laminated transition metal carbonitride 2D MXenes. That is, the MXene film may have a porous structure such that MXene layers of free-standing 2D assemblies with a continuous crystal structure are laminated and pores are formed between the MXene layers.

In an embodiment, the transition metal carbonitride 2D MXenes may comprise at least one layer, each layer comprising a 2D array of crystalline cells having an empirical formula of $M_{n+1}X_n$. Here, each X may be positioned within an octahedral array of M, M may be a transition metal selected from the group consisting of Group IIIB metal, Group IVB metal, Group VB metal and Group VIB metal, X may be a solid solution of C and N, and n may be 1, 2 or 3.

In an embodiment, M may be, for example, Sc, Y, Lu, Ti, Zr, Hf, V, Nb, Ta, Cr, Mo, W or a combination thereof, but is not limited thereto, and the empirical formula of $M_{n+1}X_n$ may be, for example, $Ti_3CN$ and $Ti_2C_{0.5}N_{0.5}$, but is not limited thereto. In an embodiment, the transition metal carbonitride 2D MXenes may comprise at least one layer, each layer comprising a 2D array of crystalline cells having an empirical formula of $M'_2M''_nX_{n+1}$.

Here, each X may be positioned within an octahedral array of M' and M'', M' and M'' may be different transition metals selected from the group consisting of Group IIIB metal, Group IVB metal, Group VB metal and Group VIB metal, X may be a solid solution C and N, and n may be 1 or 2.

In an embodiment, M may be, for example, Ti, V, Nb, Ta, Cr, Mo or a combination thereof, but is not limited thereto, and the empirical formula of $M'_2M''_nX_{n+1}$ may be, for example, $Ti_2MoCN$, but is not limited thereto.

FIG. 1A schematically shows the atomic crystal structure of $Ti_3CNT_x$ and $Ti_3C_2T_x$ MXenes.

As shown in FIG. 1A, one or two surfaces of each layer of 2D MXenes may include hydrophilic terminations indicated by $T_x$ during synthesis from MAX phases, and in an embodiment, the terminations may be selected from alkoxide, carboxylate, halide, hydroxide, hydride, oxide, sub-oxide, nitride, sub-nitride, sulfide, thiol or a combination thereof, and may be selected from, for example, —OH, =O, —F or a combination thereof.

In an embodiment, the porosity of the heat-treated transition metal carbonitride MXene film may be 2-90% (v/v). More specifically, the porosity of the heat-treated transition metal carbonitride MXene film may be 2% (v/v) or more, 4% (v/v) or more, 6% (v/v) or more, 8% (v/v) or more, 9% (v/v) or more, 10% (v/v) or more, 11% (v/v) or more, 12% (v/v) or more, 13% (v/v) or more, 14% (v/v) or more, 15% (v/v) or more, 16% (v/v) or more, 17% (v/v) or more, 18% (v/v) or more, 19% (v/v) or more, 20% (v/v) or more, 23% (v/v) or more, 25% (v/v) or more, 27% (v/v) or more, 30% (v/v) or more, 33% (v/v) or more, 35% (v/v) or more, 37% (v/v) or more, 40% (v/v) or more, 45% (v/v) or more, 50% (v/v) or more, 55% (v/v) or more, 60% (v/v) or more, 65% (v/v) or more, 70% (v/v) or more, 75% (v/v) or more, 80% (v/v) or more, or 85% (v/v) or more, and the porosity of the heat-treated transition metal carbonitride MXene film may be 90% (v/v) or less, 85% (v/v) or less, 80% (v/v) or less, 75% (v/v) or less, 70% (v/v) or less, 65% (v/v) or less, 60% (v/v) or less, 55% (v/v) or less, 50% (v/v) or less, 47% (v/v) or less, 45% (v/v) or less, 40% (v/v) or less, 37% (v/v) or less, 35% (v/v) or less, 33% (v/v) or less, 30% (v/v) or less, 27% (v/v) or less, 25% (v/v) or less, 23% (v/v) or less, 20% (v/v) or less, 19% (v/v) or less, 18% (v/v) or less, 17% (v/v) or less, 16% (v/v) or less, 15% (v/v) or less, 14% (v/v) or less, 13% (v/v) or less, 12% (v/v) or less, 11% (v/v) or less, 10% (v/v) or less, 9% (v/v) or less, 8% (v/v) or less, 6% (v/v) or less, or 4% (v/v) or less.

In an embodiment, the heat-treated transition metal carbonitride MXene film may have surface electrical conductivity of 10-5,000 S/cm. More specifically, the heat-treated transition metal carbonitride MXene film may have surface electrical conductivity of 10 S/cm or more, 50 S/cm or more, 100 S/cm or more, 200 S/cm or more, 300 S/cm or more, 400 S/cm or more, 500 S/cm or more, 600 S/cm or more, 700 S/cm or more, 800 S/cm or more, 900 S/cm or more, 1,000 S/cm or more, 1,050 S/cm or more, 1,100 S/cm or more, 1,120 S/cm or more, 1,125 S/cm or more, 1,150 S/cm or more, 1,200 S/cm or more, 1,300 S/cm or more, 1,400 S/cm or more, 1,500 S/cm or more, 1,600 S/cm or more, 1,700 S/cm or more, 1,800 S/cm or more, 1,900 S/cm or more, 2,000 S/cm or more, 2,100 S/cm or more, 2,200 S/cm or more, 2,300 S/cm or more, 2,400 S/cm or more, 2,450 S/cm or more, 2,500 S/cm or more, 2600 S/cm or more, 2,800 S/cm or more, 3,000 S/cm or more, 3,200 S/cm or more, 3,400 S/cm or more, 3,600 S/cm or more, 3,800 S/cm or more, 4,000 S/cm or more, 4,200 S/cm or more, 4,400 S/cm or more, 4,600 S/cm or more, or 4,800 S/cm or more, and the heat-treated transition metal carbonitride MXene film may have surface electrical conductivity of 5,000 S/cm or less, 4,800 S/cm or less, 4,600 S/cm or less, 4,400 S/cm or less, 4,200 S/cm or less, 4,000 S/cm or less, 3,800 S/cm or less, 3,600 S/cm or less, 3,400 S/cm or less, 3,200 S/cm or less, 3,000 S/cm or less, 2,800 S/cm or less, 2,600 S/cm or less, 2,490 S/cm or less, 2,480 S/cm or less, 2,475 S/cm or less, 2,400 S/cm or less, 2,300 S/cm or less, 2,200 S/cm or less, 2,100 S/cm or less, 2,000 S/cm or less, 1,900 S/cm or less, 1,800 S/cm or less, 1,700 S/cm or less, 1,600 S/cm or less, 1,500 S/cm or less, 1,400 S/cm or less, 1,300 S/cm or less, 1,200 S/cm or less, 1,100 S/cm or less, 1,000 S/cm or less, 900 S/cm or less, 800 S/cm or less, 700 S/cm or less, 600 S/cm or less, 500 S/cm or less, 400 S/cm or less, 300 S/cm or less, 200 S/cm or less, 100 S/cm or less, or 50 S/cm or less.

In an embodiment, the heat-treated transition metal carbonitride MXene film may exhibit EMI SE of 50-200 dB in the frequency range of 0.1-100 GHz. More specifically, the heat-treated transition metal carbonitride MXene film may exhibit EMI SE of 50 dB or more, 55 dB or more, 60 dB or more, 70 dB or more, 80 dB or more, 90 dB or more, 100 dB or more, 110 dB or more, 120 dB or more, 130 dB or more, 140 dB or more, 150 dB or more, 160 dB or more, 170 dB or more, 180 dB or more, or 190 dB or more in the frequency range of 0.1 GHz or more, 0.3 GHZ or more, 0.5 GHz or more, 1 GHz or more, 2 GHz or more, 3 GHz or more, 5 GHz or more, 8 GHz or more, 9 GHz or more, 10 GHz or more, 11 GHz or more, 12 GHz or more, 15 GHz or more, 20 GHz or more, 30 GHz or more, 40 GHz or more, 50 GHz or more, 60 GHz or more, 70 GHz or more, 80 GHz or more, or 90 GHz or more, and 100 GHz or less, 90 GHz or less, 80 GHz or less, 70 GHz or less, 60 GHz or less, 50 GHz or less, 40 GHz or less, 30 GHz or less, 20 GHz or less, 15 GHz or less, 13 GHz or less, 12 GHz or less, 11 GHz or less, 10 GHz or less, 9 GHz or less, 8 GHZ or less, 5 GHz or less, 3 GHz or less, 2 GHz or less, 1 GHz or less, 0.5 GHz or less, or 0.3 GHz or less, and the heat-treated transition metal carbonitride MXene film may exhibit EMI SE of 200 dB or less, 190 dB or less, 180 dB or less, 170 dB or less, 160 dB or less, 150 dB or less, 140 dB or less, 130 dB or less, 120 dB or less, 110 dB or less, 100 dB or less, 90 dB or less, 80 dB or less, 70 dB or less, 65 dB or less, 60 dB or less, or 55 dB or less in the above-described frequency range.

In an embodiment, the heat-treated transition metal carbonitride MXene film may be 0.1-5,000 μm in thickness. More specifically, the thickness of the heat-treated transition metal carbonitride MXene film may be 0.1 μm or more, 0.3 μm or more, 0.5 μm or more, 0.7 μm or more, 1 μm or more, 1.5 μm or more, 2 μm or more, 2.5 μm or more, 3 μm or more, 3.5 μm or more, 4 μm or more, 4.5 μm or more, 5 μm or more, 6 μm or more, 7 μm or more, 8 μm or more, 9 μm or more, 10 μm or more, 15 μm or more, 20 μm or more, 25 μm or more, 30 μm or more, 35 μm or more, 40 μm or more, 45 μm or more, 50 μm or more, 70 μm or more, 100 μm or more, 200 μm or more, 300 μm or more, 400 μm or more, 500 μm or more, 600 μm or more, 700 μm or more, 800 μm or more, 900 μm or more, 1,000 μm or more, 1,500 μm or more, 2,000 μm or more, 2,500 μm or more, 3,000 μm or more, 3,500 μm or more, 4,000 μm or more, or 4,500 μm or more, and the thickness of the heat-treated transition metal carbonitride MXene film may be 5,000 μm or less, 4,500 μm or less, 4,000 μm or less, 3,500 μm or less, 3,000 μm or less, 2,500 μm or less, 2,000 μm or less, 1,500 μm or less, 1,000 μm or less, 900 μm or less, 800 μm or less, 700 μm or less, 600 μm or less, 500 μm or less, 400 μm or less, 300 μm or less, 200 μm or less, 100 μm or less, 70 μm or less, 50 μm or less, 45 μm or less, 40 μm or less, 35 μm or less, 30 μm or less, 25 μm or less, 20 μm or less, 15 μm or less, 10 μm or less, 9 μm or less, 8 μm or less, 7 μm or less, 6 μm or less, 5 μm or less, 4.5 μm or less, 4 μm or less, 3.5 μm or less, 3 μm or less, 2.5 μm or less, 2 μm or less, 1.5 μm or less, 1 μm or less, 0.7 μm or less, 0.5 μm or less, or 0.3 μm or less.

In an embodiment, the annealing may be performed for 0.1-24 hours. More specifically, the heat-treated transition metal carbonitride MXene film may be produced by annealing the transition metal carbonitride MXene film for 0.1 hours or more, 0.5 hours or more, 1 hour or more, 2 hours or more, 3 hours or more, 4 hours or more, 5 hours or more, 6 hours or more, 7 hours or more, 8 hours or more, 10 hours or more, 12 hours or more, 14 hours or more, 16 hours or more, 18 hours or more, 20 hours or more, or 22 hours or more, and the heat-treated transition metal carbonitride MXene film may be produced by annealing the transition metal carbonitride MXene film for 24 hours or less, 22 hours or less, 20 hours or less, 18 hours or less, 16 hours or less, 14 hours or less, 12 hours or less, 10 hours or less, 8 hours or less, 7 hours or less, 6 hours or less, 5 hours or less, 4 hours or less, 3 hours or less, 2 hours or less, or 1 hour or less.

In an embodiment, the heat-treated transition metal carbonitride MXene film may be for EMI shielding and electromagnetic absorption.

In another aspect, the present disclosure may relate to a polymer composite for EMI shielding and electromagnetic absorption, comprising the heat-treated transition metal carbonitride MXene film.

In an embodiment, the polymer composite may comprise the heat-treated transition metal carbonitride MXene film sandwiched between polymers.

In an embodiment, the heat-treated transition metal carbonitride MXene film may form a composite with polymer, and the polymer may include organic polymer, to be more specific, thermosetting or thermoplastic polymer or polymer resin, elastomer or a mixture thereof. The polymer may include, for example, polyester, polyethylenenaphthalate (PEN), polybutylene terephthalate (PBT), polyethersulfone (PES), polytetrafluoroethylene (PTFE), polyvinylfluoride (PVF), epoxy resin, polyvinyl chloride (PVC), polypropylene (PP), polyethylene (PE), polyetherimide (PEI), acrylate-based resin, polyamide (PA), acrylonitrile-butadiene-styrene (ABS) resin, polyamide imide (PAI), polybenzoimidazol (PBI), polyphenylene sulfide (PPS), polytetrafluoroethylene (PTFE), polyvinylidene fluoride (PVDF), polyethylene terephthalate (PET), polyoxymethylene (POM), polyetherketone (PEK), polyetheretherketone (PEEK), polyaryletherketone (PAEK), liquid crystal polymer (LCP), polyimide (PI), polycarbonate (PC), sulfonated polyphenylene (SPR), (meth)acrylate-based polymer, urethane(meth)acrylate-based polymer, polystyrene (PS), polyurethane and polysiloxane, but is not limited thereto.

In another aspect, the present disclosure a method for producing the heat-treated transition metal carbonitride MXene film, comprising: obtaining a MXene aqueous solution containing dispersed 2D MXenes from MAX through an acid etching process; filtering the obtained MXene aqueous solution through a vacuum filtration process to produce a free-standing film; and annealing the produced free-standing film at the temperature of 100-500° C. for 0.1-24 hours to obtain a heat-treated transition metal carbonitride MXene film.

Here, M is at least one transition metal selected from the group consisting of Group IIIB metal, Group IVB metal, Group VB metal and Group VIB metal, A is any one selected from Group 13 or 14 elements, X represents carbon and nitrogen, and each of M, A and X is the same as described in detail above.

In an embodiment, an etchant used in the acid etching process may include strong acids containing $F^-$ such as HF, $NH_4HF_2$ or HCl—LiF mixture, but is not limited thereto. The MXene produced by the acid etching process may be indicated by $M_{n+1}X_n(T_x)$ or $M'_2M''_nX_{n+1}(T_x)$, where $T_x$ denotes terminations formed on the surface of the 2D MXene via etching as described in detail above, and may be, for example, —OH, =O, —F or a combination thereof.

Additionally, the MXene aqueous solution prepared by the acid etching process may be an acidic solution with a pH of 1-6, a neutral solution with a pH of 6-7, and a basic solution with a pH of 8-14 by adjusting its pH.

In an embodiment, the annealing may be performed under continuous argon (Ar) flow conditions.

The annealing temperature and time in the annealing step is the same as described in detail above.

In another aspect, the present disclosure may relate to an EMI shielding method comprising: superposing a coating comprising the heat-treated transition metal carbonitride MXene film on at least one surface of an object in a contact or non-contact manner.

That is, the present disclosure may relate to a method for shielding an object from EMI by superposing a coating comprising the heat-treated transition metal carbonitride MXene film according to an aspect of the present disclosure on at least one surface of the object in a contact or non-contact manner.

As an embodiment, the present disclosure may provide the following embodiments, and the following embodiments are provided to supplement the previous description, but not intended to replace or substitute the previous description.

A first embodiment may provide a heat-treated transition metal carbonitride MXene film annealed at 100-500° C.

A second embodiment may provide the heat-treated transition metal carbonitride MXene film according to the first embodiment, wherein the MXene film has a porous structure with laminated transition metal carbonitride 2D MXenes. A third embodiment may provide the heat-treated transition metal carbonitride MXene film according to at least one of the first and second embodiments, wherein the transition metal carbonitride 2D MXenes comprise at least one layer, each layer comprising a 2D array of crystalline cells having an empirical formula of $M_{n+1}X_n$, each X is positioned within an octahedral array of M, M is a transition metal selected from the group consisting of Group IIIB metal, Group IVB metal, Group VB metal and Group VIB metal, X is a solid solution of C and N, and n is 1, 2 or 3.

A fourth embodiment may provide the heat-treated transition metal carbonitride MXene film according to at least one of the first to third embodiments, wherein the transition metal carbonitride 2D MXenes comprise at least one layer, each layer comprising a 2D array of crystalline cells having an empirical formula of $M'_2M''_nX_{n+1}$, each X is positioned within an octahedral array of M' and M'', M' and M'' are different transition metals selected from the group consisting of Group IIIB metal, Group IVB metal, Group VB metal and Group VIB metal, X is a solid solution of C and N, and n is 1 or 2.

A fifth embodiment may provide the heat-treated transition metal carbonitride MXene film according to at least one of the first to fourth embodiments, wherein porosity of the MXene film is 2-90% (v/v).

A sixth embodiment may provide the heat-treated transition metal carbonitride MXene film according to at least one of the first to fifth embodiments, wherein surface electrical conductivity of the MXene film is 10-5,000 S/cm.

A seventh embodiment may provide the heat-treated transition metal carbonitride MXene film according to at least one of the first to sixth embodiments, wherein the heat-treated transition metal carbonitride MXene film exhibits EMI SE of 50-200 dB in a frequency range of 0.1-100 GHz.

An eighth embodiment may provide the heat-treated transition metal carbonitride MXene film according to at least one of the first to seventh embodiment, wherein a thickness of the MXene film is 0.1-5,000 μm.

A ninth embodiment may provide the heat-treated transition metal carbonitride MXene film according to at least one of the first to eighth embodiments, wherein the annealing is performed for 0.1-24 hours.

A tenth embodiment may provide the heat-treated transition metal carbonitride MXene film according to at least one of the first to ninth embodiments, wherein the MXene film is for EMI shielding and electromagnetic absorption.

An eleventh embodiment may provide a polymer composite for EMI shielding and electromagnetic absorption, comprising the heat-treated transition metal carbonitride MXene film according to any one of the first to tenth embodiments.

A twelfth embodiment may provide the polymer composite for EMI shielding and electromagnetic absorption according to the eleventh embodiment, wherein the heat-treated transition metal carbonitride MXene film is sandwiched between polymers.

A thirteenth embodiment may provide a method for producing the heat-treated transition metal carbonitride MXene film according to any one of the first to tenth embodiments, comprising: obtaining a MXene aqueous solution containing dispersed 2D MXenes through an acid etching process; filtering the obtained MXene aqueous solution through a vacuum filtration process to produce a free-standing film; and annealing the produced free-standing film at the temperature of 100-500° C. for 0.1-24 hours to obtain a heat-treated transition metal carbonitride MXene film, where M is at least one transition metal selected from the group consisting of Group IIIB metal, Group IVB metal, Group VB metal and Group VIB metal, A is any one selected from Group 13 or 14 elements, and X denotes carbon and nitrogen.

A fourteenth embodiment may provide the method according to the thirteenth embodiment, wherein the annealing is performed under a continuous argon (Ar) flow condition.

A fifteenth embodiment may provide an EMI shielding method comprising: superposing a coating comprising the heat-treated transition metal carbonitride MXene film according to any one of the first to tenth embodiments on at least one surface of an object in a contact or non-contact manner.

The transition metal carbonitride MXene according to an aspect of the present disclosure is a solid solution MXene in which half of carbon atoms occupying octahedral sites in AB-AB hexagonal structure are substituted by nitrogen atoms, and due to the change in chemical composition, the transition metal carbonitride MXene has unique properties that are very different from the counterpart transition metal carbide MXene, i.e., having the same transition metal.

Specifically, the transition metal carbonitride MXene film, according to an aspect of the present disclosure, exhibits a larger interlayer spacing (d-spacing). The large d-spacing of transition metal carbonitride MXene is due to its high tendency to absorb water molecules, and this may be the cause of its low electrical conductivity at room temperature. The following examples confirmed that when the transition metal carbonitride MXene film according to an aspect of the present disclosure is annealed, as the annealing temperature increases, the desorption of water molecules increases and the surface terminations of each layer are removed, and thus the d-spacing value decreases and the electrical conductivity increases.

The removal of water molecules and surface terminations gives rise to porosity in transition metal carbonitride MXene film, and this shows a direct relationship with the annealing temperature. It is expected that the induced porosity will improve the total EMI shielding and electromagnetic absorption in the porous structure of transition metal carbonitride MXene film, and the porous structure has a positive influence on EMI shielding by extending the path length of EMWs before transmission and improving the subsequent absorption phenomenon with the introduction of multiple interfaces acting as scattering sites for the incident EMWs.

Additionally, according to theoretical studies, as the porosity is higher, EMI shielding properties are enhanced and absorption contribution is improved. This factor may be enhanced when high porosity does not reduce the electrical conductivity of shielding materials. The following examples confirmed that in the case of the transition metal carbonitride MXene film according to an aspect of the present disclosure, the porosity linearly increases with the increasing annealing temperature, but as the temperature increases, the film becomes unstable for oxidation, and transition metal oxide nanocrystals which are dielectrics are formed on the surface of the film, resulting in low electrical conductivity, and severe oxidation causes degradation of the electrical properties of the film and degradation of the overall EMI shielding properties.

However, the following examples confirmed that as a result of analyzing the EMI shielding properties of transition metal carbide MXene film annealed in the same condition, as opposed to transition metal carbonitride MXene film, it is stable for oxidation, has a small d-spacing value and high electrical conductivity, and undergoes less volume expansion arising from porosity due to annealing, but rather results in lower final EMI shielding properties.

EXAMPLES

Hereinafter, the following examples are provided to describe the present disclosure in more detail. Each example is regarded as providing each specific embodiment of compositions and fabrication and use methods, but none of the examples should be deemed as limiting the more generic embodiments described herein. In particular, the following examples focus specific 2-dimensional (2D) titanium carbonitride $Ti_3CNT_x$ MXenes and their fabrication methods and their electromagnetic shielding effectiveness, but the described principle may be applied to other 2D transition metal carbonitride MXenes. That is, these examples are provided to help the understanding of the present disclosure and should not be interpreted as limiting the present disclosure, and modifications, substitutions and addition commonly known in the art may be made thereto, and the scope of the present disclosure covers such modifications, substitutions and addition.

In the following examples, attempts have been made to ensure accuracy of the used names and figures (for example, composition, amount, temperature, thickness, etc.), but some experimental errors and deviations should be considered, and unless otherwise stated, the temperature is in degree Celsius (° C.) and the pressure is at or near atmospheric.

Example 1. Materials and Methods

Example 1.1 Materials

TigAlCN MAX powder with a particle size of less than 38 μm was synthesized at the lab scale following Hantanasirisakul, K., et al., *Effects of Synthesis and Processing on Optoelectronic Properties of Titanium Carbonitride MXene.* Chemistry of Materials, 2019. 31: p. 2941-2951, and $Ti_3AlC_2$ MAX powder with a particle size of less than 38 μm was purchased from Carbon-Ukraine ltd. Lithium fluoride (LiF, 98.5%) and hydrochloric acid (HCl, 37%) were purchased from Alfa Aesar, and polypropylene membrane (Celgard, pore size 0.064 μm) was used to obtain MXene films via vacuum-assisted filtration.

Example 1.2 Synthesis of $Ti_3CNT_x$ MXene $Ti_3CNT_x$ was synthesized from TigAlCN MAX phase. In this synthesis protocol, $Ti_3AlCN$ was used instead of $Ti_3AlC_2$. Briefly describing, 1 g of TigAlCN MAX was gradually added to a mixture of 20 mL of 9 M HCl and 1.6 g of LiF in a 100 mL polypropylene bottle with continuous stirring at room temperature for 24 hours. The obtained mixture was washed with deionized water 5-6 times by centrifugation at 3500 rpm to reach close to a neutral pH value. Finally, a stable well-dispersed suspension containing single-to-few layer $Ti_3CNT_x$ MXene flakes was obtained by collecting the supernatant after centrifugation at 3500 rpm for 5 minutes.

Example 1.3 Preparation of $Ti_3CNT_x$ MXene Film

Free-standing films were prepared by filtering a measured amount of MXene dispersion through a Celgard membrane. The thickness of the films was controlled by the volume of the as-synthesized dispersion during vacuum filtration.

Example 1.4 Annealing of $Ti_3CNT_x$ MXene Film

The films with different thicknesses were thermally treated in an inert environment of continuous argon (Ar) flow at different annealing temperatures of 150° C., 250° C. and 350° C. for 6 hours. Additionally, 40 μm-thick $Ti_3CNT_x$ MXene films were annealed at 350° C. for different annealing times of 0.5, 1, 2, 3, 6, 12 and 24 hours.

Example 1.5 Synthesis of $Ti_3C_2T_x$ MXene $Ti_3C_2T_x$ was synthesized from $Ti_3AlC_2$ MAX powder after etching "Al" layers. The synthesis method of $Ti_3C_2T_x$ is the same as described in U.S. patent application Ser. No. 16/092,338 filed on Apr. 21, 2017, and all the conditions were the same as those reported above for $Ti_3CNT_x$ except the synthesis temperature. In this case, the synthesis temperature was increased up to 35° C. to get a higher yield from the reaction. The obtained films (similar in thickness to $Ti_3CNT_x$ film) after vacuum filtration of the solution were annealed at the same temperature as $Ti_3CNT_x$.

Example 1.6 Annealing of Spray-Coated MXene Films on a Glass Substrate

Micrometer-thick $Ti_3CNT_x$ and $Ti_3C_2T_x$ MXene films were spray-coated on a glass substrate and completely dried on a hot plate set to the temperature of 90° C. The spray-coated films were annealed to analyze the adhesive strength of the MXene films during heat treatment. In this instance, the spray-coated $Ti_3CNT_x$ and $Ti_3C_2T_x$ MXene films on the glass substrate were annealed at 350° C. for 6 hours.

Example 2 Materials Characterization

Example 2.1 Characterization

The structure and morphology of pristine and heat-treated $Ti_3CNT_x$ and $Ti_3C_2T_x$ MXene films were investigated by a scanning electron microscope (SEM) (Inspect F50, FEI, USA) and a transmission electron microscope (TEM) (Tecnai F20 G2, FEI, at 200.0 kV voltage). The initial thickness measurements were performed using a highly accurate length gauge (with a tolerance factor of ±0.1 μm) of Heidenhain Instruments (Germany), and were verified using SEM.

A focused ion beam (FIB) (Nova 600 Nanolab, FEI Company, Netherland) was used to cut the cross-section of the films in order to analyze the cross-sectional morphology of the samples using high resolution TEM images and element mapping (high resolution TEM (HRTEM) Talos, FEI Company, F200X).

X-ray diffraction (XRD) patterns were obtained using a D8 diffractometer with Cu-Kα radiation (40 kV and 44 mA) at a 2θ (theta) range of 4° to 70° with a scanning step of 0.02°, a step time of 0.5s, and a window slit of 10×10 mm². Changes in chemical structure were examined using X-ray photoelectron spectroscopy (XPS, PHI 5000 VersaProbe, Ulvac-PHI, Japan) by Al-Kα as the X-ray source with a power of 25 W.

Simultaneous thermogravimetric-mass spectrometry analysis (TGA-MS) was performed on a Discovery SDT 650 model connected to a Discovery mass spectrometer (TA Instruments, DE). Vacuum-filtered films of MXenes were cut into small pieces and packed in a 90 µL alumina pan. Before heating, the analysis chamber was flushed with helium (He) gas at 100 mL/min for 1 hour to reduce residual air. The samples were heated to 350° C. at a constant heating rate of 10° C./min in the He atmosphere (100 mL/min).

The density and porosity were calculated experimentally using the mass and volume of the films.

Electrical conductivity of the samples was measured using an advanced four probe (MCP-TP06P PSP) connected with Loresta-GP meter (Model MCP-T610, Mitsubishi Chemical, Japan). The distance between pins of the probe was 1.5 mm, and the open circuit voltage was set to 10 V. The 4-pin probe was positioned at different locations of the film (a minimum of 5 locations to obtain an average value) and the sheet resistance was recorded. Subsequently, the electrical conductivity of all the samples was calculated by $\sigma = (R_s \times t)^{-1}$, where σ is the electrical conductivity [S/cm], $R_s$ is the sheet resistance [Ω/sq], and t is the thickness [cm] of the sample.

Electromagnetic interference (EMI) shielding effectiveness (SE) of all the samples was measured by WR-90 rectangular waveguide using a 2-port network analyzer (ENA5071C, Agilent Technologies, USA) in the frequency range of 8.2-12.4 GHz (X-band). The standard calibration procedure for equipment calibration was performed using short offset, short and load on both ports. The pristine and annealed samples were cut into rectangular dimensions of 25×12 mm², slightly larger than that of sample holder's opening 22.84×10.14 mm². The samples were mounted carefully to avoid any leakage from the edges of the waveguide and screwed tightly before taking the final measurements.

Example 2.2 EMI Shielding Effectiveness Measurements

EMI SE is the ability of a material to attenuate the energy of incident EMWs. When electromagnetic radiations interact with the material under test (shield), the shielding phenomenon is governed by reflection (R), absorption (A) and transmission (T), collectively must add up to 1. That is, the following equation is given:

$$R + T + A = 1 \tag{1}$$

The reflection (R) and transmission (T) coefficients are obtained from the network analyzer in the form of scattering parameters ($S_{12}$, $S_{12}$, $S_{21}$, $S_{22}$), which can be used to find the R and T coefficients as:

$$R = |S_{11}|^2 = |S_{22}|^2 \tag{2}$$

$$T = |S_{21}|^2 = |S_{12}|^2 \tag{3}$$

The total EMI SE (EMI $SE_T$) is the sum of the contributions from reflection ($SE_R$), absorption ($SE_A$) and multiple internal reflections ($SE_{MR}$). The total EMI $SE_T$ can be written as:

$$SE_T = SE_R + SE_A + SE_{MR} \tag{4}$$

For calculations, $SE_{MR}$ is generally considered negligible when $SE_T$ is higher than 15 dB. $SE_R$ and $SE_A$ can be expressed in terms of reflection and absorption coefficient considering the power of the incident EMWs inside the shielding material as:

$$SE_R = 10\log\left(\frac{1}{1-R}\right) = 10\log\left(\frac{1}{1-|S_{11}|^2}\right) \tag{5}$$

$$SE_A = 10\log\left(\frac{1-R}{T}\right) = 10\log\left(\frac{1-|S_{11}|^2}{|S_{21}|^2}\right) \tag{6}$$

Assuming propagation of EMWs in a nonmagnetic and highly conducting medium, the Fresnel formula for reflection, absorption and multiple reflections, using equation 4, can be given as:

$$SE_T = 10\log\left(\frac{1}{T}\right) = 10\log\left(\frac{E_i}{E_t}\right)^2 = 20\log\left|\frac{(1+N)^2}{4N}e^{-ikd}\left[1 - \left(\frac{1-N}{1+N}\right)^2 e^{2ikd}\right]\right| \tag{7}$$

where $E_i$ and $E_t$ are incident and transmitted intensities of electric field of the EMWs, respectively; N is the complex refractive index of the shield, k is the imaginary part of refractive index, and d is the shield thickness. Due to its excellent conductivity (5,000-10,000 S/cm), the complex refractive index (Nm) of MXene is given as:

$$N_m = \sqrt{\frac{\sigma}{2\omega\varepsilon_0}}(1+i)$$

In equation 7, the quantitative contributions from $SE_R$, $SE_A$ and $SE_{MR}$ are expressed as:

$$SE_R = 20\log\left(\frac{(1+N)^2}{4|N|}\right) = 50 + 10\log\left(\frac{\sigma}{f}\right) \tag{8}$$

$$SE_A = 20\log e^{-kd} = 20\log e^{\alpha d} = 8.686\alpha d = 1.7d\sqrt{\sigma f} \tag{9}$$

$$SE_{MR} = 20\log\left|1 - e^{(2ikd)}\frac{(1-N)^2}{(1+N)^2}\right| \tag{10}$$

In equation 9, α is the attenuation constant indicating the ability of a material to absorb the associated energy of incident EMWs. Neglecting the role of multiple reflection for total shielding efficiency $SE_T$ higher than 15 dB, using equations 4, 8 and 9, $SE_T$ can be written as the following equation known as Simon's formula:

$$SE_T = 50 + 10\log\left(\frac{\sigma}{f}\right) + 1.7d\sqrt{\sigma f} \tag{11}$$

Example 2.3 Theoretical Calculation of EMI Shielding Effectiveness (SE)

Theoretical EMI $SE_T$, $SE_R$, and $SE_A$ for $Ti_3CNT_x$ and $Ti_3C_2T_x$ MXenes were calculated by transfer matrix method.

The transfer matrix method considers analytical solution for calculating transmission, reflection, and absorption of EMWs propagating through a 2D infinite plane interface and layers with known thickness. This method provides an exact solution for multiple reflections between layers having much smaller thickness than the wavelength of incident waves. The transfer equation for the propagation through N thin layers is expressed as follows:

$$\begin{pmatrix} E_t^+ \\ E_t^- \end{pmatrix} M_2 \cdot M_1 \bigg]^N \begin{pmatrix} E_i^+ \\ E_i^- \end{pmatrix} = \begin{pmatrix} a & b \\ c & d \end{pmatrix} \begin{pmatrix} E_i^+ \\ E_i^- \end{pmatrix} \quad (12)$$

where M1 and M2 are the transfer matrices for the propagation through an interface and propagation within a layer, respectively. $E^+$ and $E^-$ represent the electric field amplitudes of the forward and backward EMWs in a medium, respectively.

In homogeneous and isotropic media, the matrices M1 and M2 are expressed as:

$$M_{1(i,j)} = \frac{1}{t_{ij}} \begin{pmatrix} 1 & -r_{ij} \\ -r_{ij} & 1 \end{pmatrix}, \text{ and } M_{2(n,l)} = \begin{pmatrix} \Phi^{-1} & 0 \\ 0 & \Phi \end{pmatrix} \quad (13)$$

Here, $r_{ij}$ and $t_{ij}$ are the complex amplitude reflection and transmission Fresnel coefficients, respectively, and EMWs propagate from the i layer to the j layer through the interfaces. $\phi$ is represented as $\Phi = e^{-i\frac{2\pi n}{\lambda}nl}$, where n and l are the complex refractive index and the thickness, respectively, and $\lambda$ is the wavelength of the EMWs propagating in free space.

From equation 12, the reflection and transmission coefficients are calculated as below:

$$R = -\frac{c}{d} \text{ and } T = a - \frac{bc}{d} \quad (14)$$

Therefore, using equation 14, $SE_T$, $SE_R$ and $SE_A$ can be expressed as below:

$$SE_T = 10\log\left(\frac{1}{T}\right) = 10\log\left(\frac{1}{|t|^2}\right) \quad (15)$$

$$SE_R = 10\log\left(\frac{1}{1-R}\right) = 10\log\left(\frac{1}{1-|r|^2}\right) \quad (16)$$

$$SE_A = SE_T - SE_R \quad (17)$$

Example 3 Analysis Results

Example 3.1 Structural Characterization of MAX and MXene

Figure 1B:
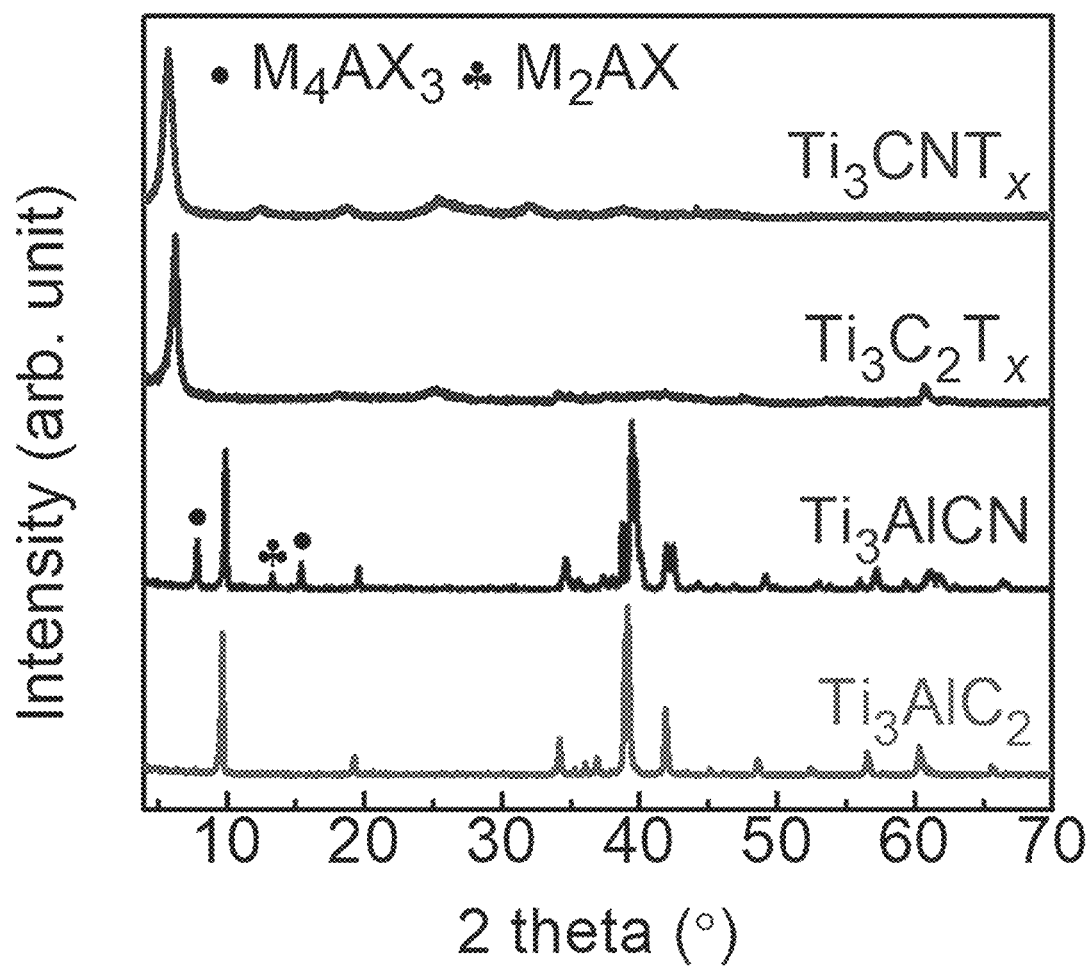
FIG. 1B shows X-ray diffraction (XRD) patterns of $Ti_3AlCN$ and $Ti_3AlC_2$ MAX phases and their corresponding $Ti_3CNT_x$ and $Ti_3C_2 T_x$ MXenes.
Figure 1C:
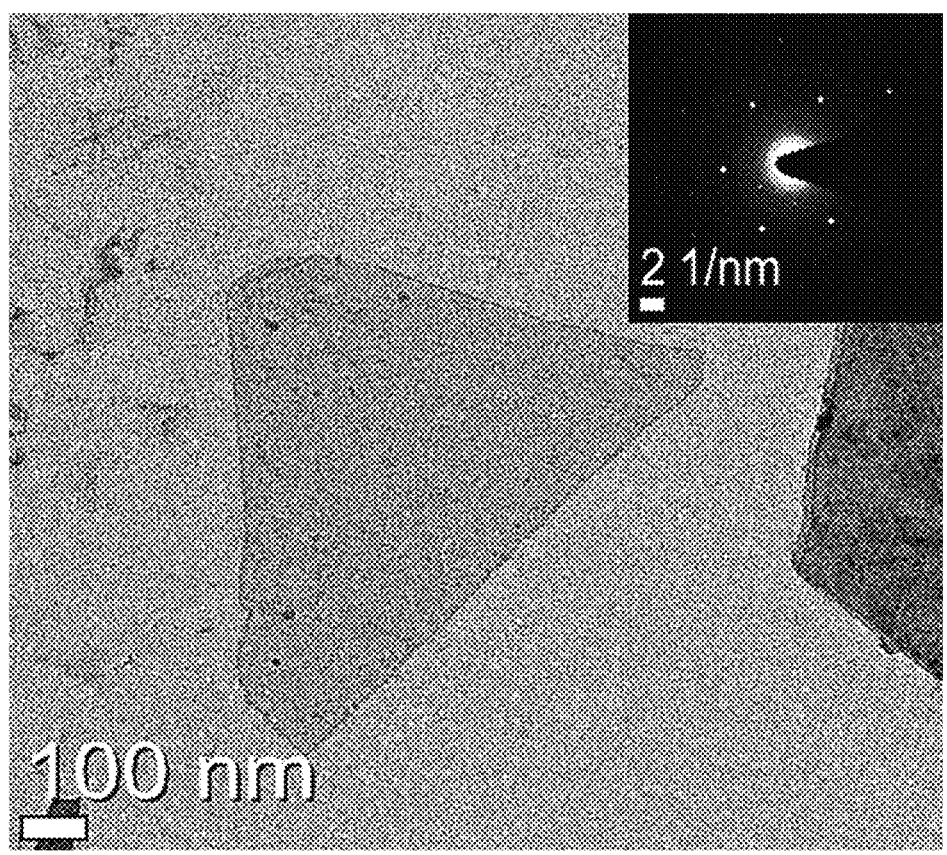
FIG. 1C shows a transmission electron microscopy (TEM) image of monolayer $Ti_3CNT_x$ MXene flake with the selected area electron diffraction (SAED) pattern in the inset.
Figure 1D:
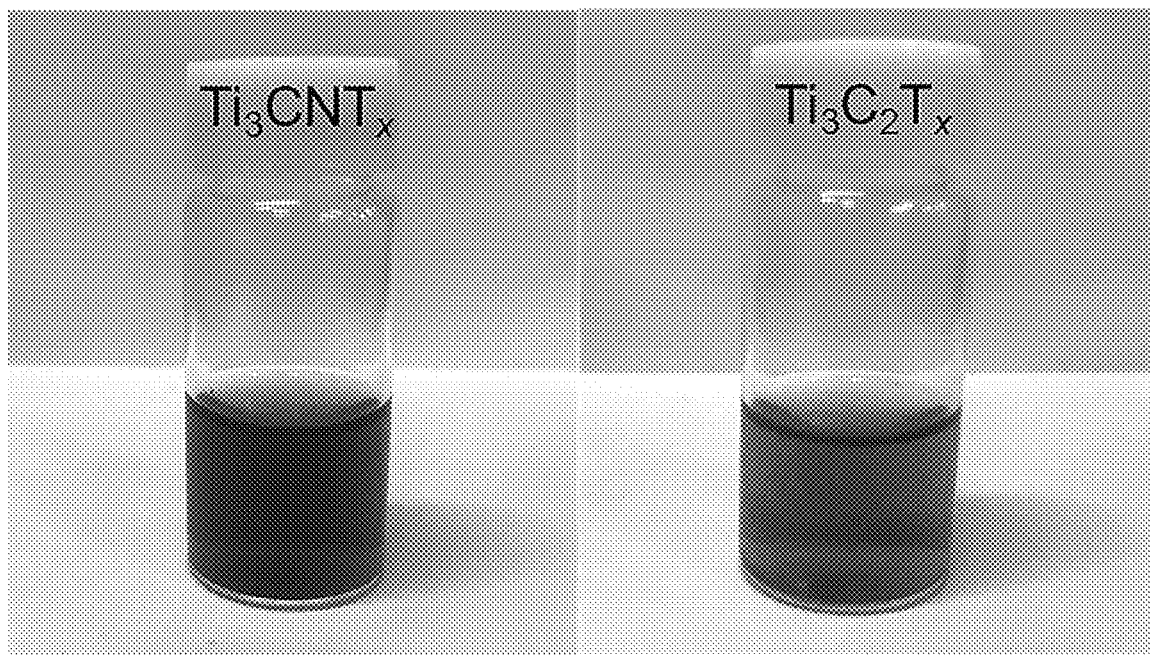
FIG. 1D shows optical images of aqueous dispersions of $Ti_3CNT_x$ and $Ti_3C_2T_x$ MXenes.

As in the above example 1, $Ti_3CNT_x$ and $Ti_3C_2T_x$ MXenes were synthesized by chemical etching of the Al atoms from their parent MAX phases, $Ti_3AlCN$ and $Ti_3AlC_2$, respectively, and XRD patterns of the parent MAX phases and the corresponding MXenes are shown in FIG. 1B. $Ti_3AlC_2$ was a single-phase $M_3AX_2$, whereas the $Ti_3AlCN$ contained traces of $M_4AX_3$ and $M_2AX$ phases, which were below detection limit after etching and delamination. The characteristic (002) peak shifted towards the lower angle with the absence of non-basal plane peaks of MAX phases confirming their complete etching and delamination to $Ti_3CNT_x$ and $Ti_3C_2T_x$ MXenes. FIG. 1C shows a TEM image of monolayer $Ti_3CNT_x$ MXene flake with the selected area electron diffraction (SAED) pattern in the inset. It was found in FIG. 1C that the 2D flake retained the crystallinity and hexagonal structure of the carbonitride layers. FIG. 1D shows an optical image of dilute aqueous dispersions of $Ti_3CNT_x$ (left) and $Ti_3C_2T_x$ (right) MXenes. $Ti_3CNT_x$ MXene showed dark grey color, while green or green tinted black was observed in $Ti_3C_2T_x$ MXene.

Figure 1E:
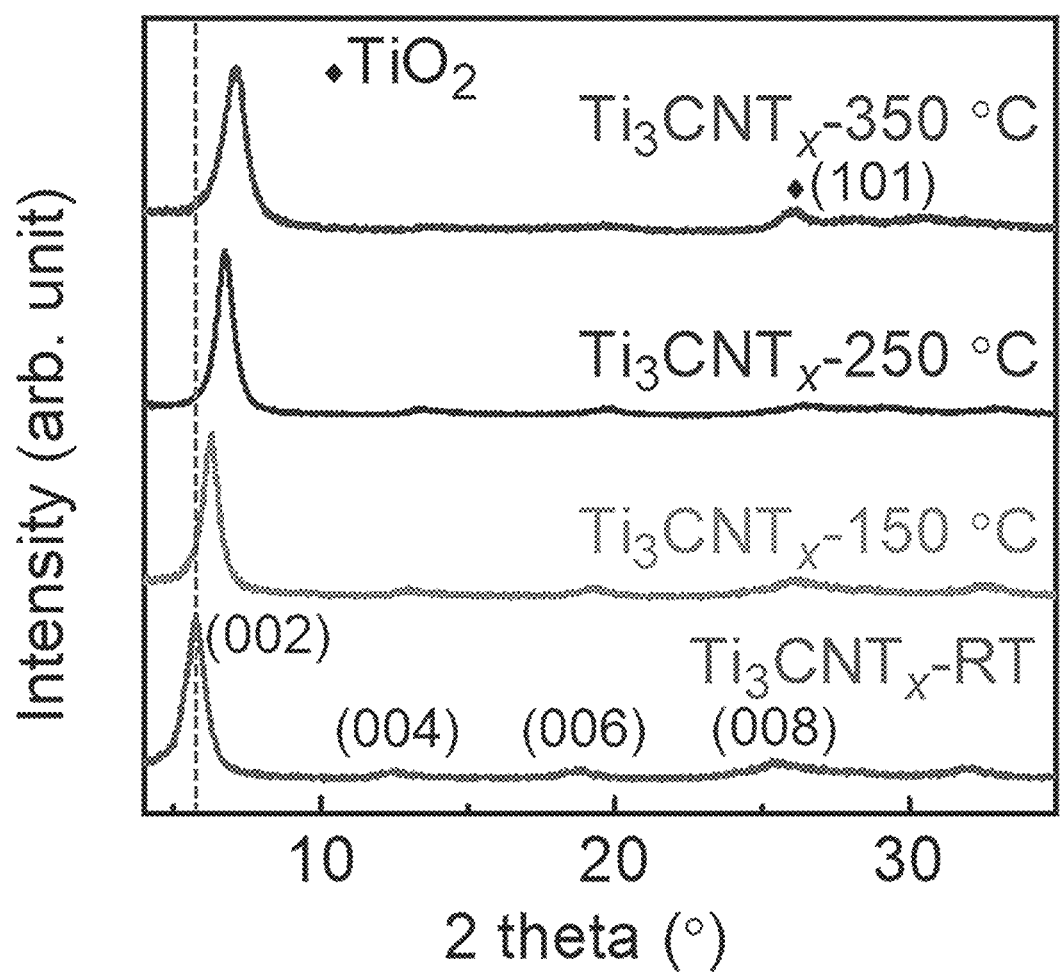
FIG. 1E shows XRD patterns of 40 μm-thick $Ti_3CNT_x$ MXene films annealed at different annealing temperatures.
Figure 1F:
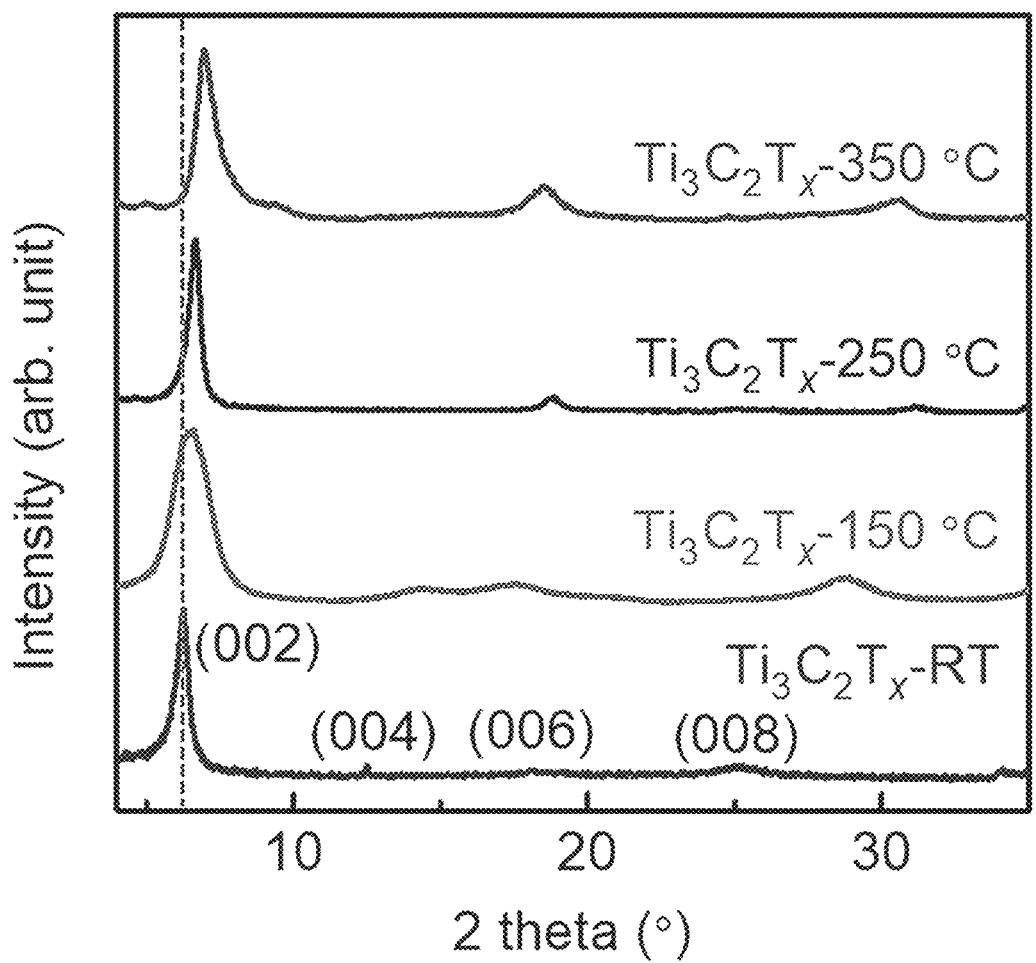
FIG. 1F shows XRD patterns of 40 μm-thick $Ti_3C_2T_x$ MXene films annealed at different annealing temperatures.
Figure 1G:
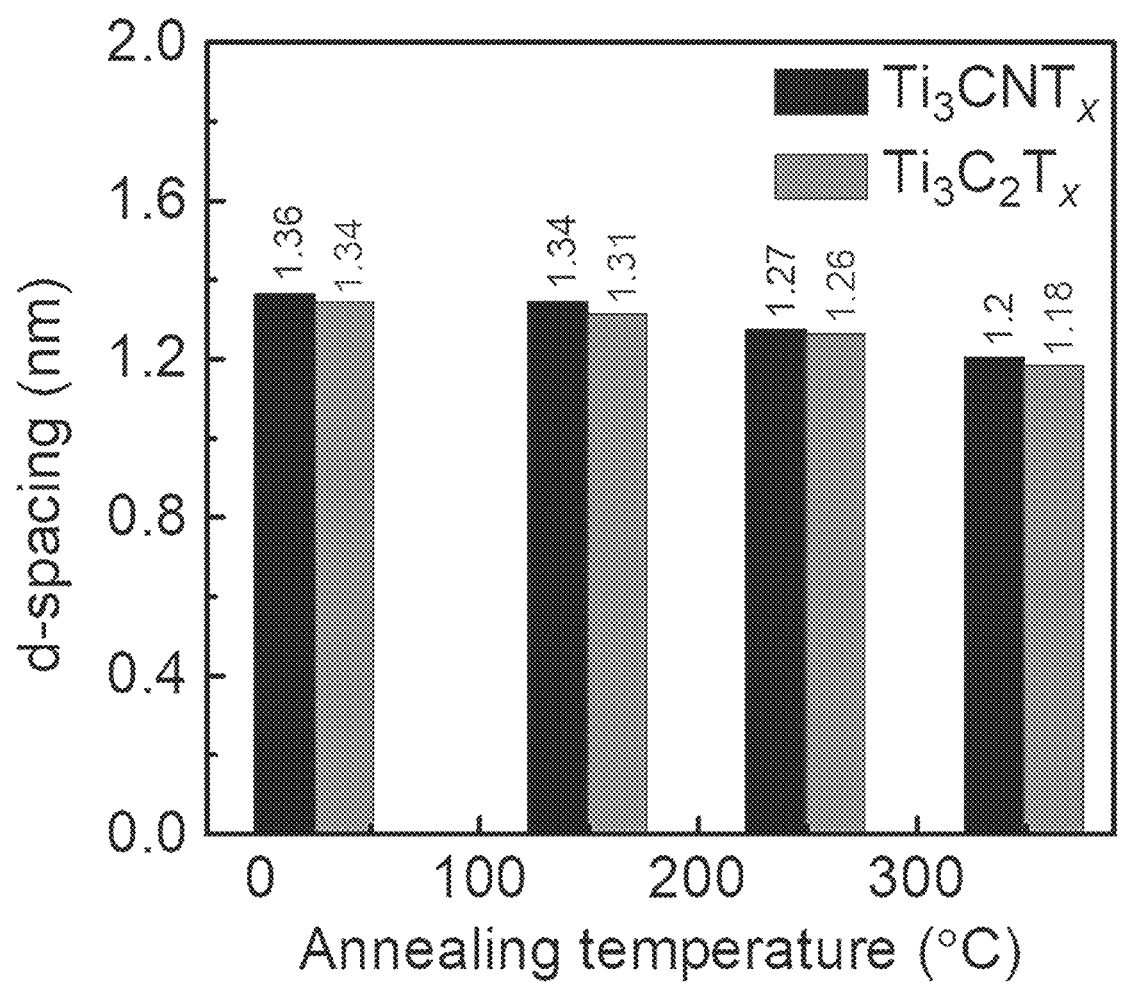
FIG. 1G shows the comparison results of d-spacing values of $Ti_3CNT_x$ and $Ti_3C_2T_x$ MXenes annealed at different annealing temperatures.
Figure 2A:
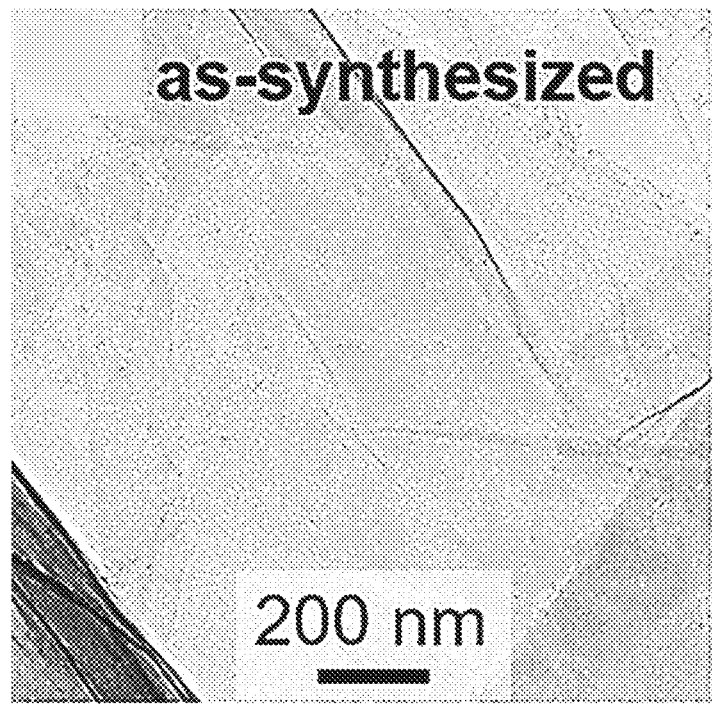
FIGS. 2A to 2C show TEM images (upper) and SAED patterns (lower) of $Ti_3CNT_x$ MXenes as a function of annealing temperature (as-synthesized, 250° C., 350° C.), respectively.
Figure 2A:
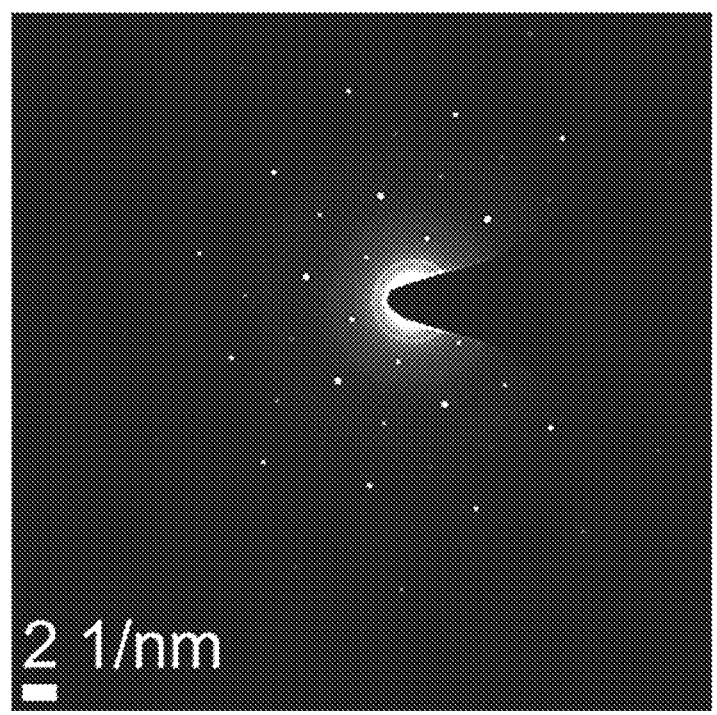
Figure 2B:
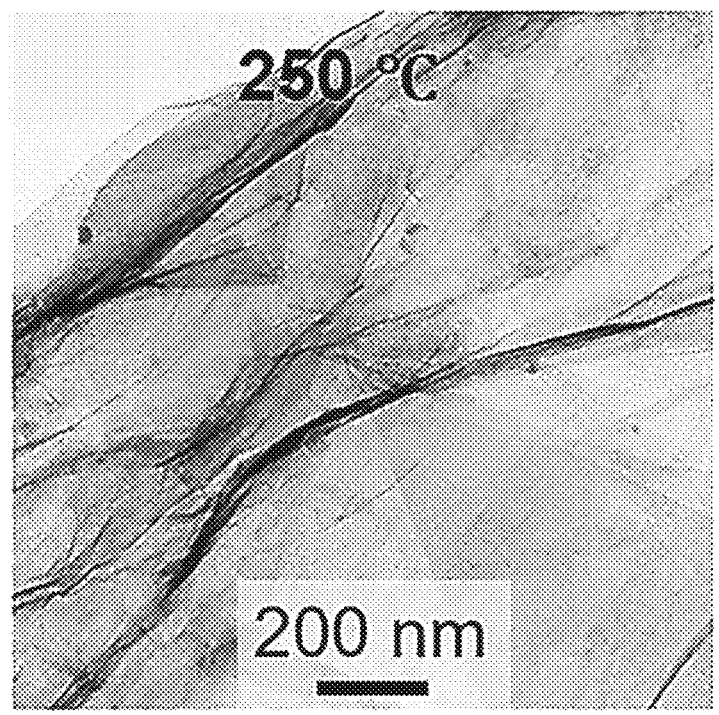
Figure 2B:
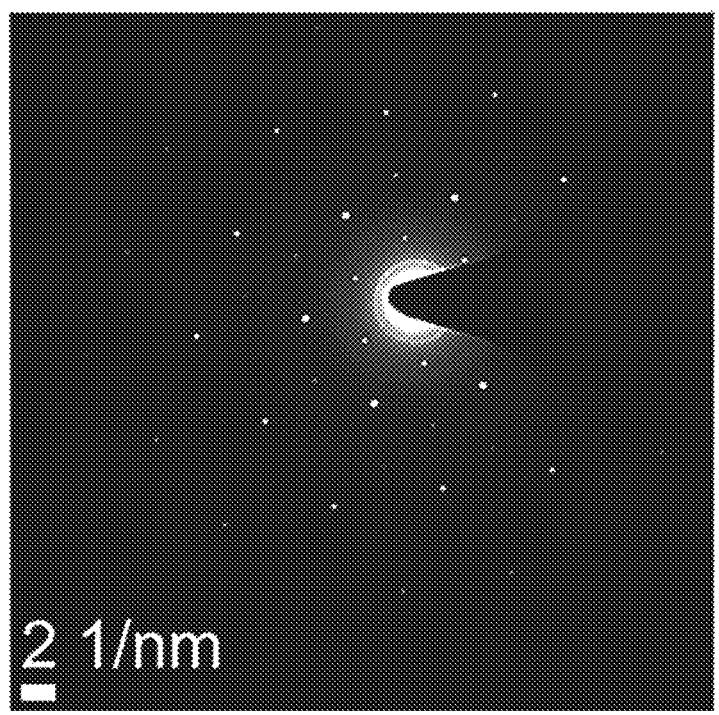
Figure 2C:
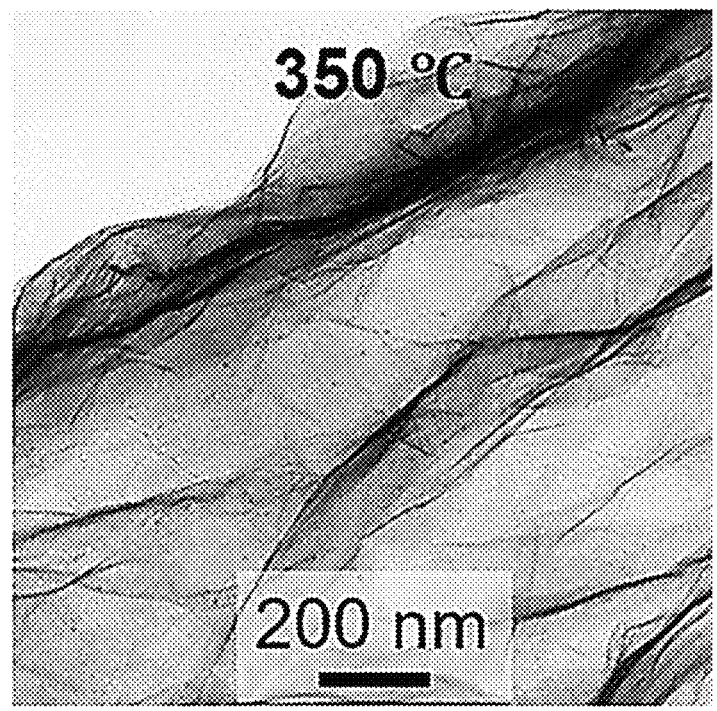
Figure 2C:
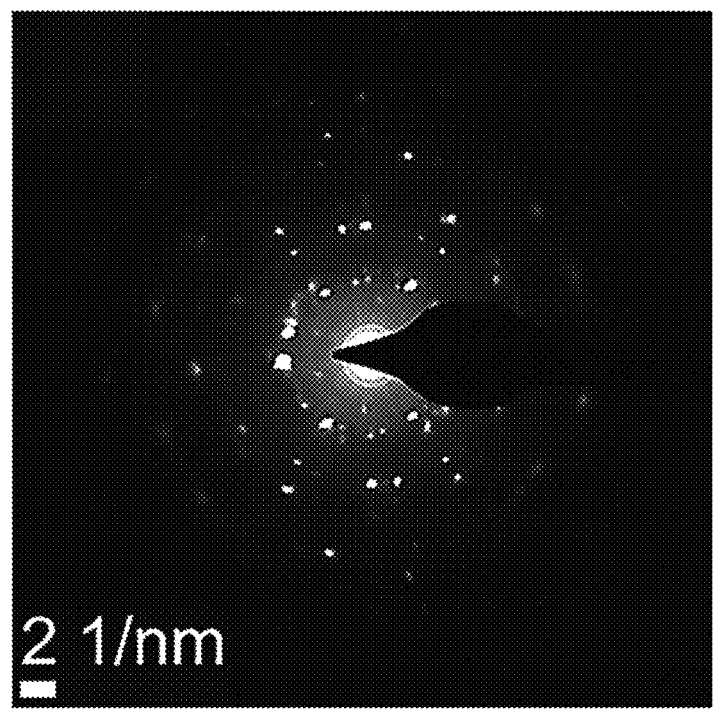
Figure 3A:
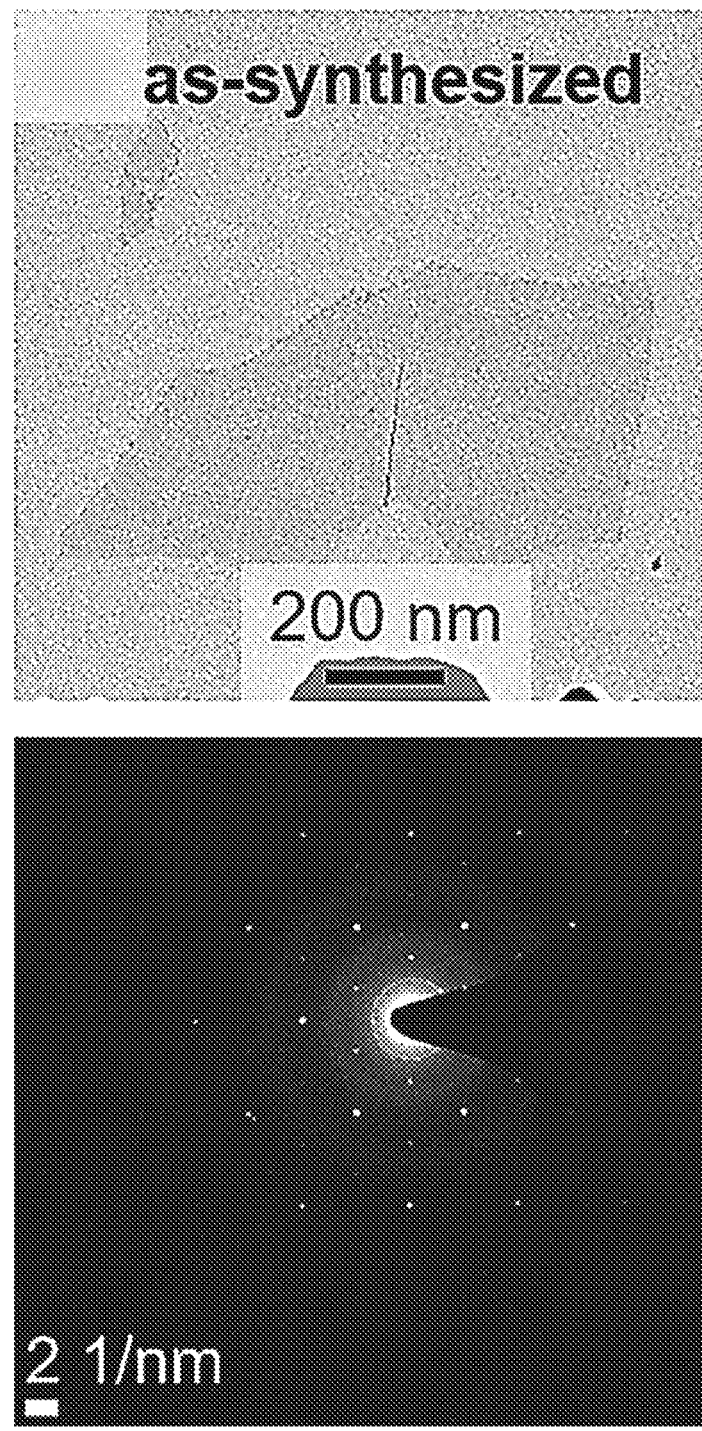
FIGS. 3A to 3C show TEM images (upper) and SAED patterns (lower) of $Ti_3C_2T_x$ MXenes as a function of annealing temperature (as-synthesized, 250° C., 350° C.), respectively.
Figure 3B:
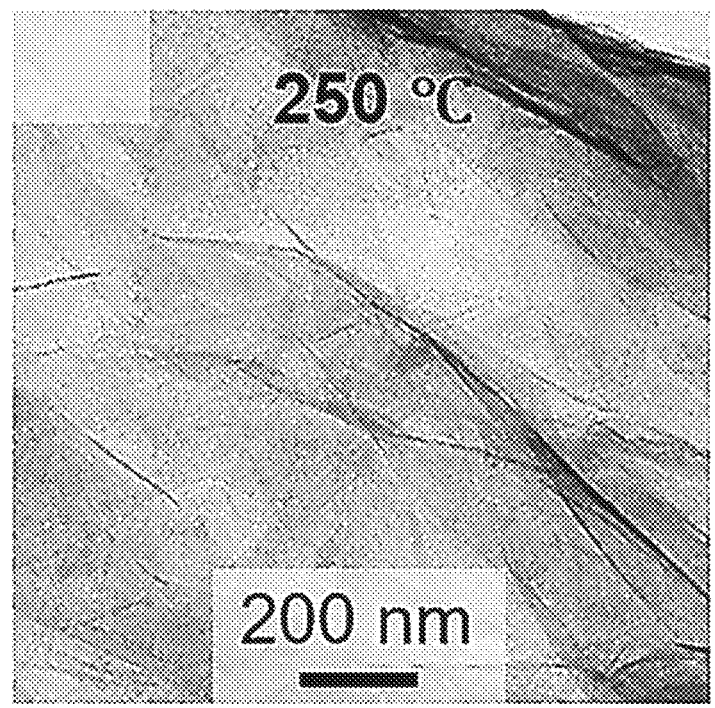
Figure 3B:
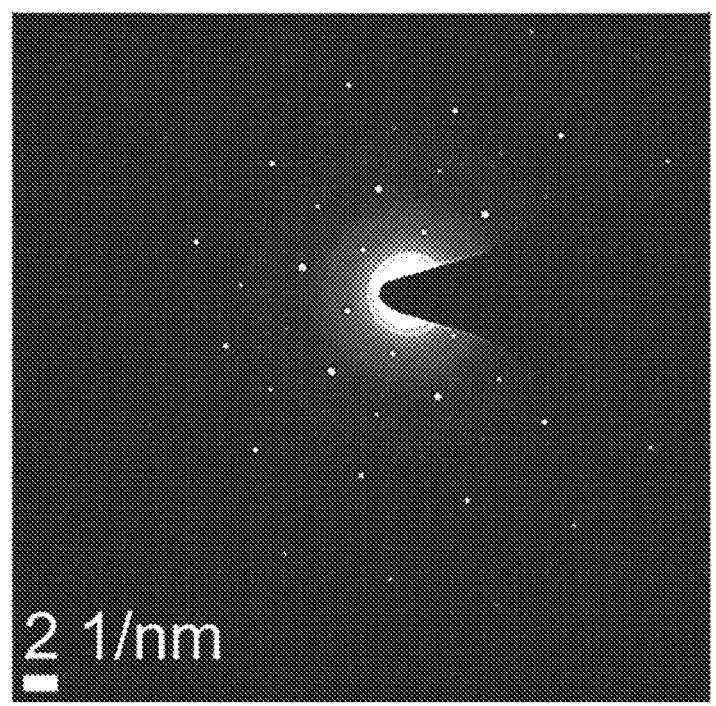
Figure 3C:
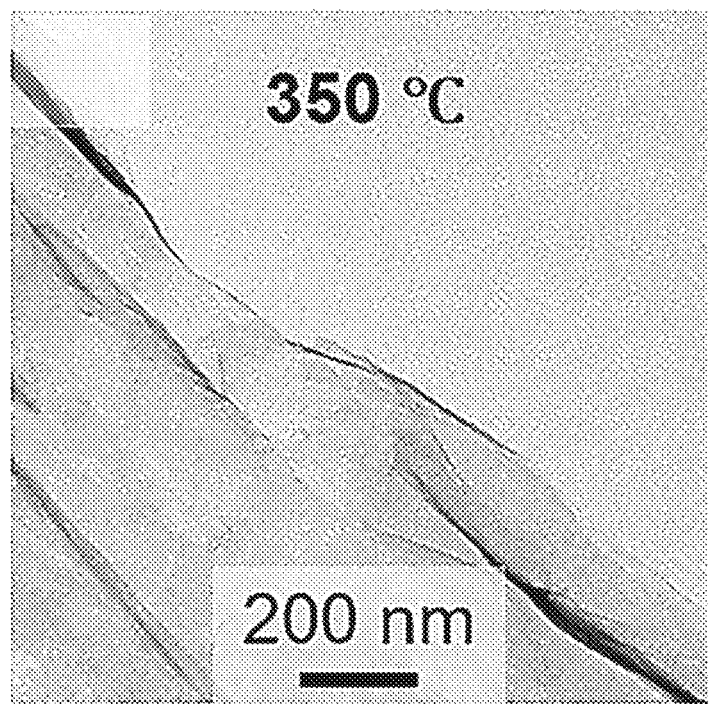
Figure 3C:
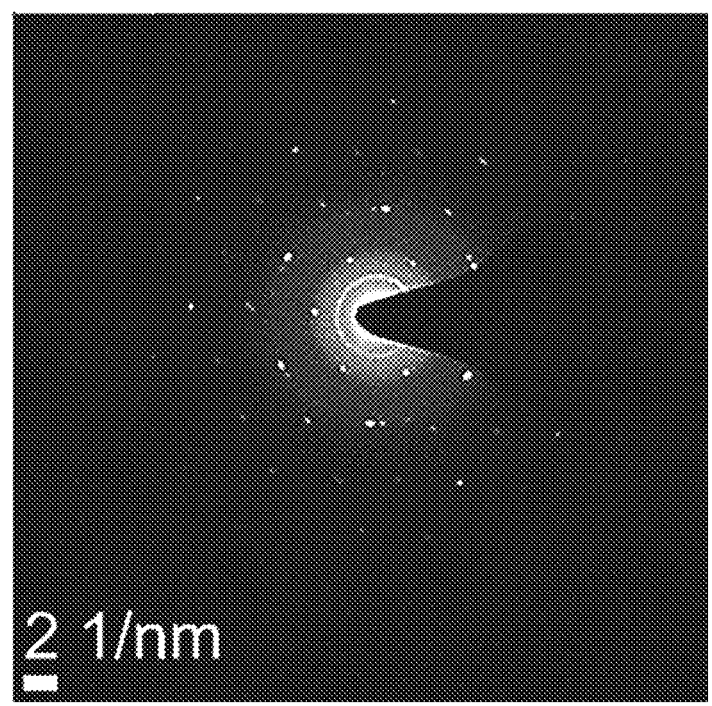

Example 3.2 Fabrication of Free-Standing $Ti_3CNT_x$ and $Ti_3C_2T_x$ MXene Films, Annealing the Same, and Structural Characterization of the Same $Ti_3CNT_x$ and $Ti_3C_2T_x$ free-standing films of different thickness were fabricated via vacuum-assisted filtration of aqueous suspensions of $Ti_3CNT_x$ and $Ti_3C_2T_x$ MXenes, respectively, followed by annealing at different temperatures of 150° C., 250° C. and 350° C. for 6 hours under an argon atmosphere. Structural changes in $Ti_3CNT_x$ and $Ti_3C_2T_x$ MXene films under thermal annealing were analyzed by XRD as shown in FIGS. 1E and 1F, respectively. The (002) peak of the $Ti_3CNT_x$ gradually shifts from 5.76° for the as-synthesized (room temperature) film to higher angles of 6.3°, 6.76° and 7.1° for the films annealed at 150° C., 250° C. and 350° C., respectively. Additionally, as shown in FIG. 1G, the d-spacing of the MXene films gradually decreases from 1.36 nm (room temperature) to 1.34 nm, 1.27 nm and 1.21 nm with increasing annealing temperature. $Ti_3C_2T_x$ also shows similar changes in the d-spacing on annealing. However, it can be seen from FIG. 1G that the d-spacing for $Ti_3CNT_x$ MXene film remains larger than the d-spacing of $Ti_3C_2T_x$ MXene film at the same annealing temperature. The decrement in d-spacing is due to the removal of intercalated water and hydroxyl surface terminations at elevated temperatures. It was found that even though the d-spacing reduced with increasing annealing temperature, the pore size and pore volume gradually increased with temperature annealing temperature. Additionally, unlike $Ti_3C_2T_x$, $Ti_3CNT_x$ MXene films reveal a small $TiO_2$ peak of (101) plane after annealing at 350° C., indicating partial surface oxidation of the films (FIG. 1E). As the temperature increases, severer oxidation occurs and the properties of $Ti_3CNT_x$ films greatly degrade. FIGS. 2A to 2C and FIGS. 3A to 3C show the analysis results of thermal stability of $Ti_3CNT_x$ (FIGS. 2A to 2C) and $Ti_3C_2T_x$ MXenes (FIGS. 3A to 3C). The distorted SAED pattern in the lower drawing of FIG. 2C arises from $TiO_2$ nanocrystals formed on the surface of $Ti_3CNT_x$ MXene flakes, and it confirmed the partial oxidation of MXene film surface.

Figure 4A:
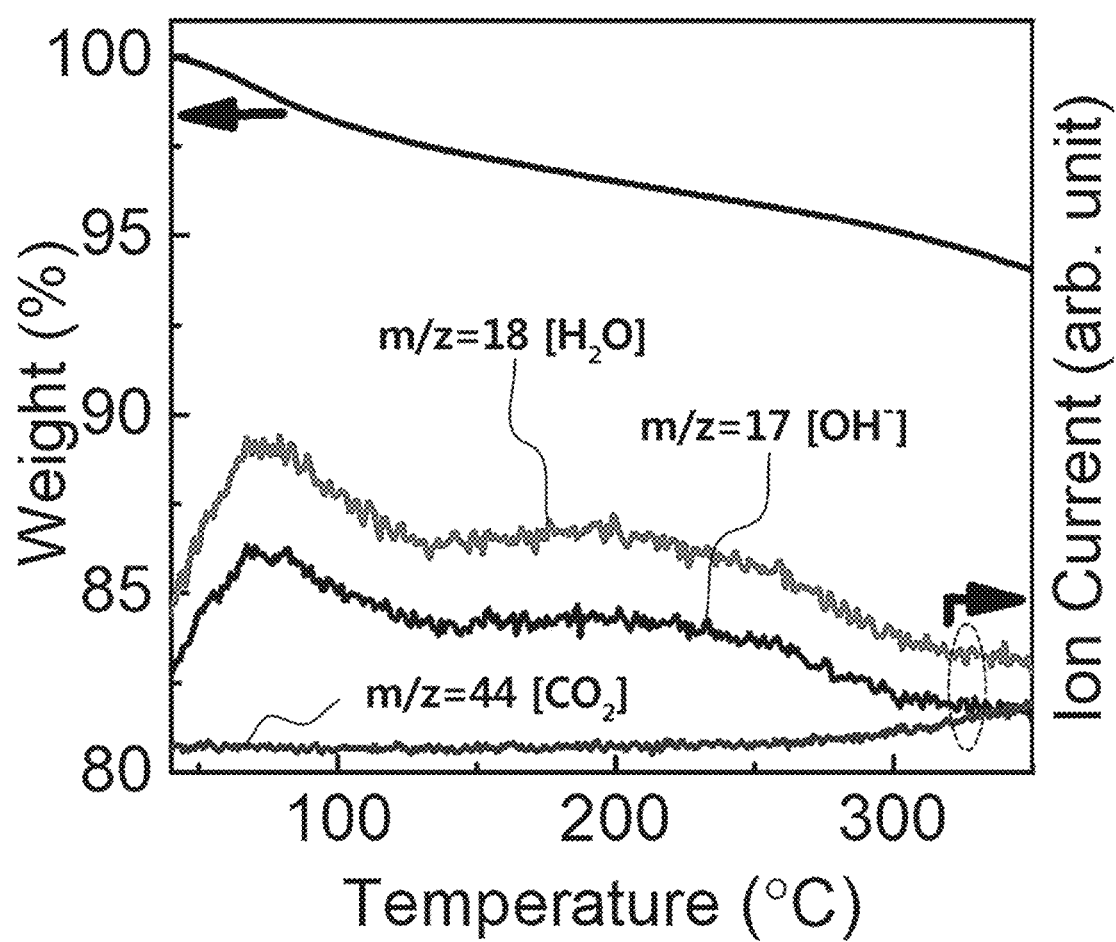
FIG. 4A shows a thermogravimetric analysis-mass spectrometry (TGA-MS) thermogram of $Ti_3CNT_x$ MXene.
Figure 4B:
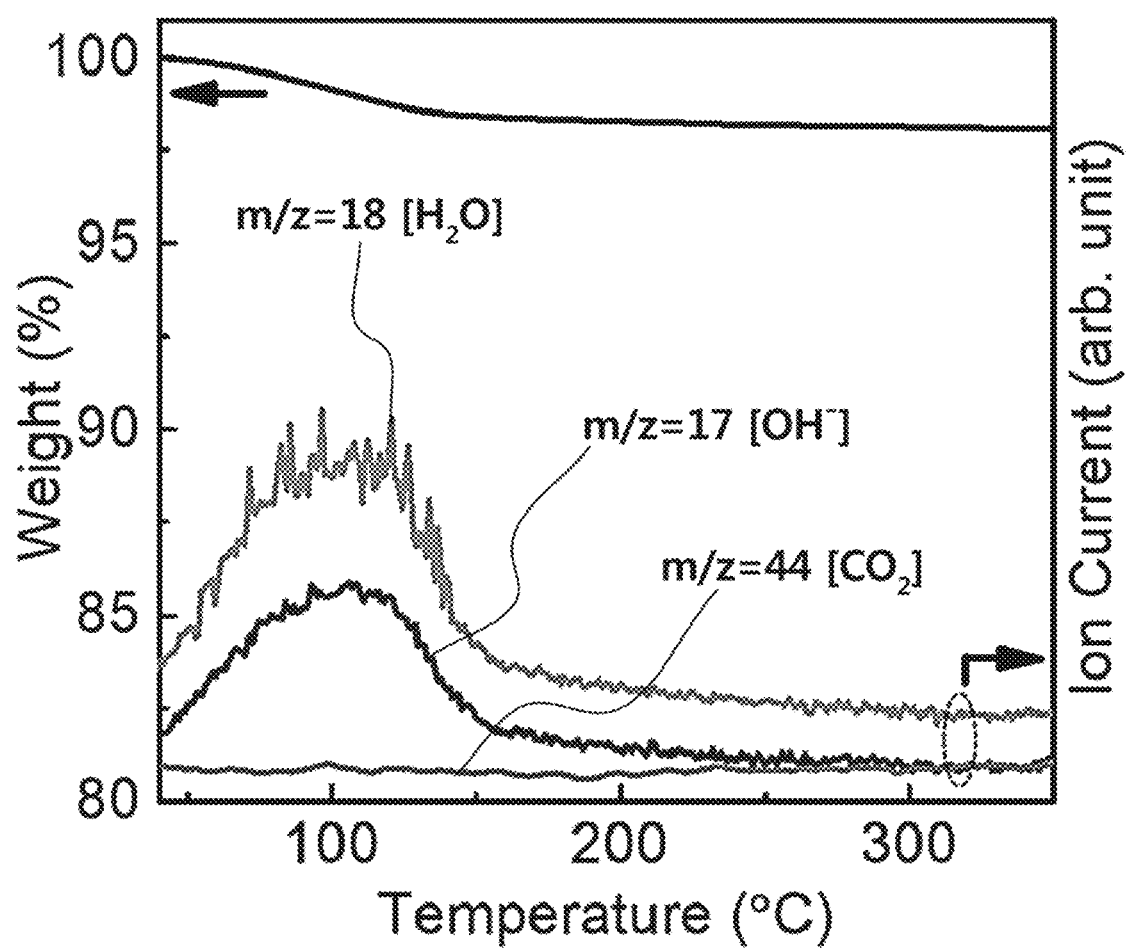
FIG. 4B shows a TGA-MS thermogram of $Ti_3C_2T_x$ MXene.

Example 3.3 Thermogravimetric Analysis of $Ti_3CNT_x$ and $Ti_3C_2T_x$ MXene Film FIGS. 4A and 4B show the thermogravimetric analysis results coupled with the mass spectroscopy (TGA-MS) results of $Ti_3CNT_x$ and $Ti_3C_2T_x$ MXenes, respectively. $Ti_3CNT_x$ and $Ti_3C_2T_x$ exhibit a strong and broad peak at the mass to charge ratio (m/z) of 18 caused by the removal of absorbed water, and a strong peak at the m/z value of 17, representing the removal of the hydroxyl ion. The results indicate that pristine $Ti_3CNT_x$ exhibits a larger weight loss of ~6% as compared to only ~2% in $Ti_3C_2T_x$, indicating that $Ti_3CNT_x$ holds a larger content of water compared to $Ti_3C_2T_x$. Unlike $Ti_3C_2T_x$, $Ti_3CNT_x$ reveals a small signal of m/z=44 attributed to the evolution of $CO_2$ above 300° C., indicating that $Ti_3CNT_x$ is less resistive to oxidation than $Ti_3C_2T_x$ at high temperatures. These results are consistent with the results of FIGS. 2A to 2C and FIGS. 3A to 3C.

Figure 5A:
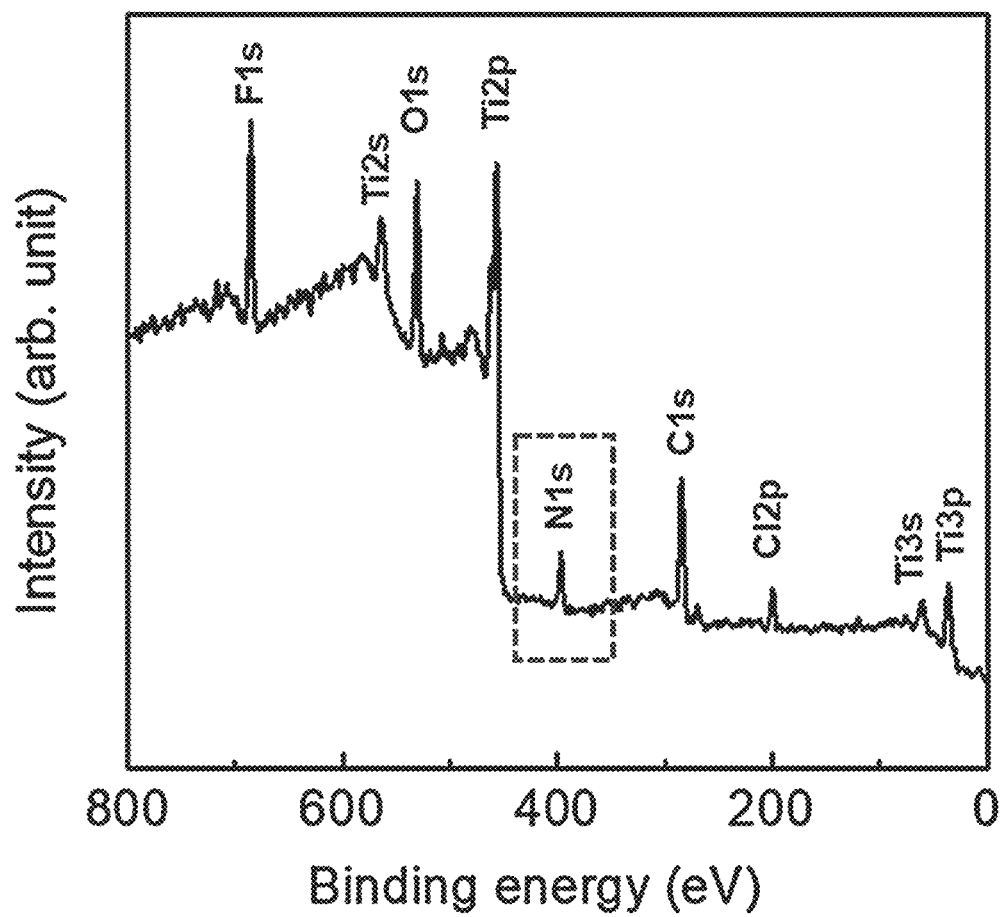
FIG. 5A shows X-ray photoelectron spectroscopy (XPS) survey spectra of as-synthesized $Ti_3CNT_x$ MXene film for chemical composition analysis.
Figure 5B:
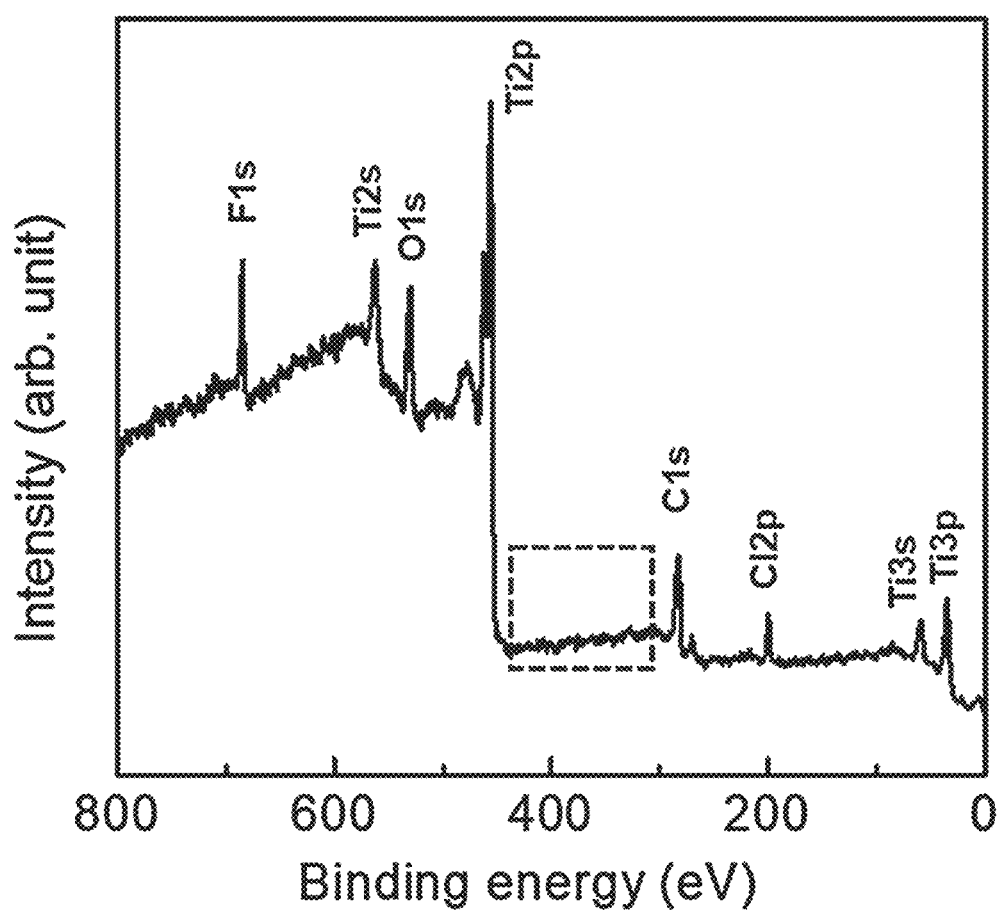
FIG. 5B shows XPS survey spectra of as-synthesized $Ti_3C_2T_x$ MXene film for chemical composition analysis.
Figure 6A:
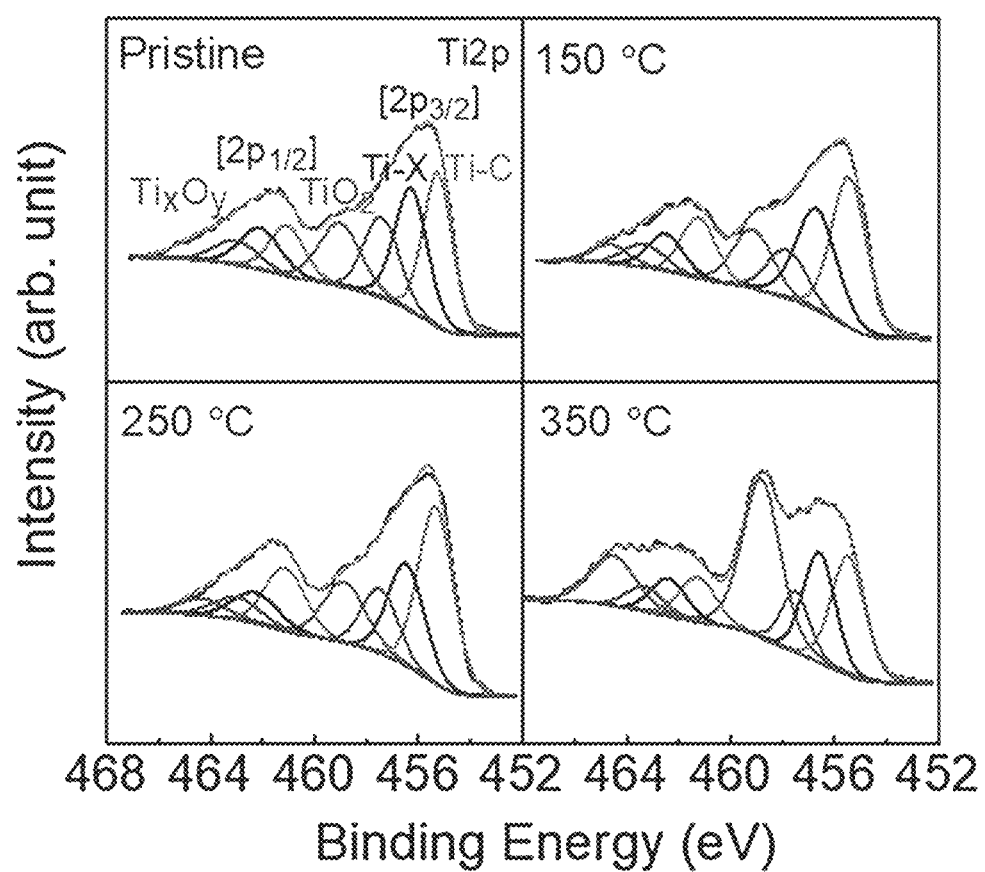
FIG. 6A shows high resolution XPS spectra of Ti 2p peaks of $Ti_3CNT_x$ MXene films annealed at different annealing temperatures.
Figure 6B:
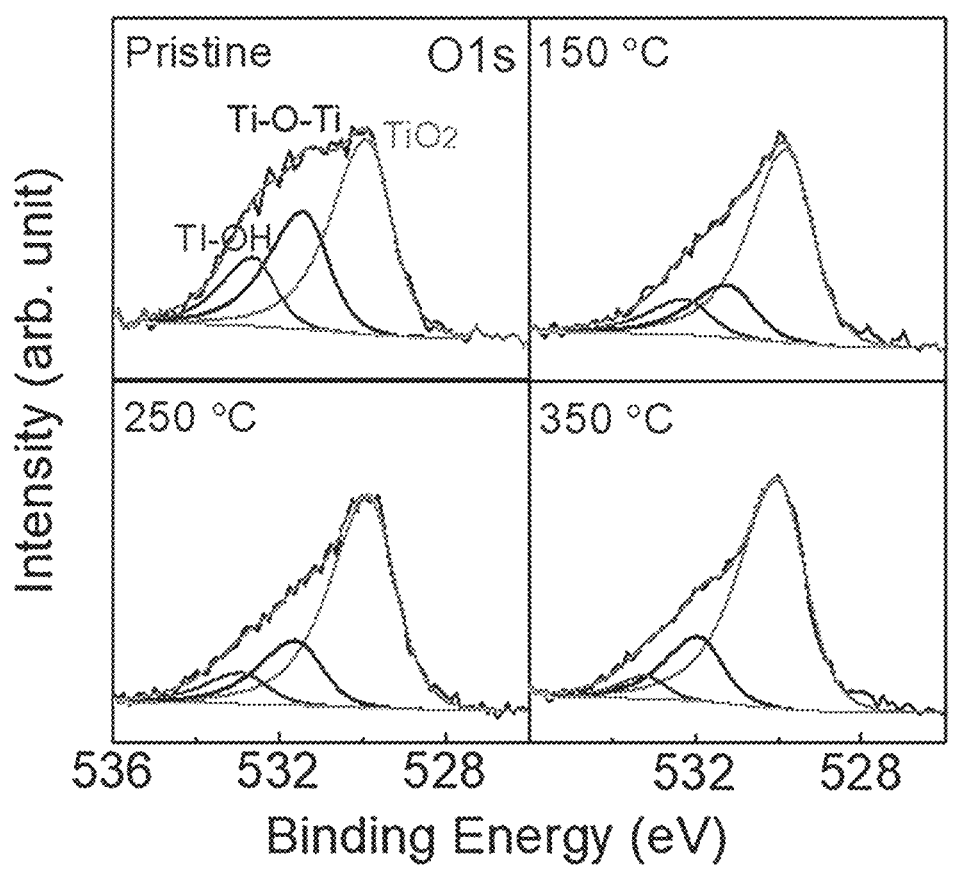
FIG. 6B shows high resolution XPS spectra of O 1s peaks of $Ti_3CNT_x$ MXene films annealed at different annealing temperatures.
Figure 7A:
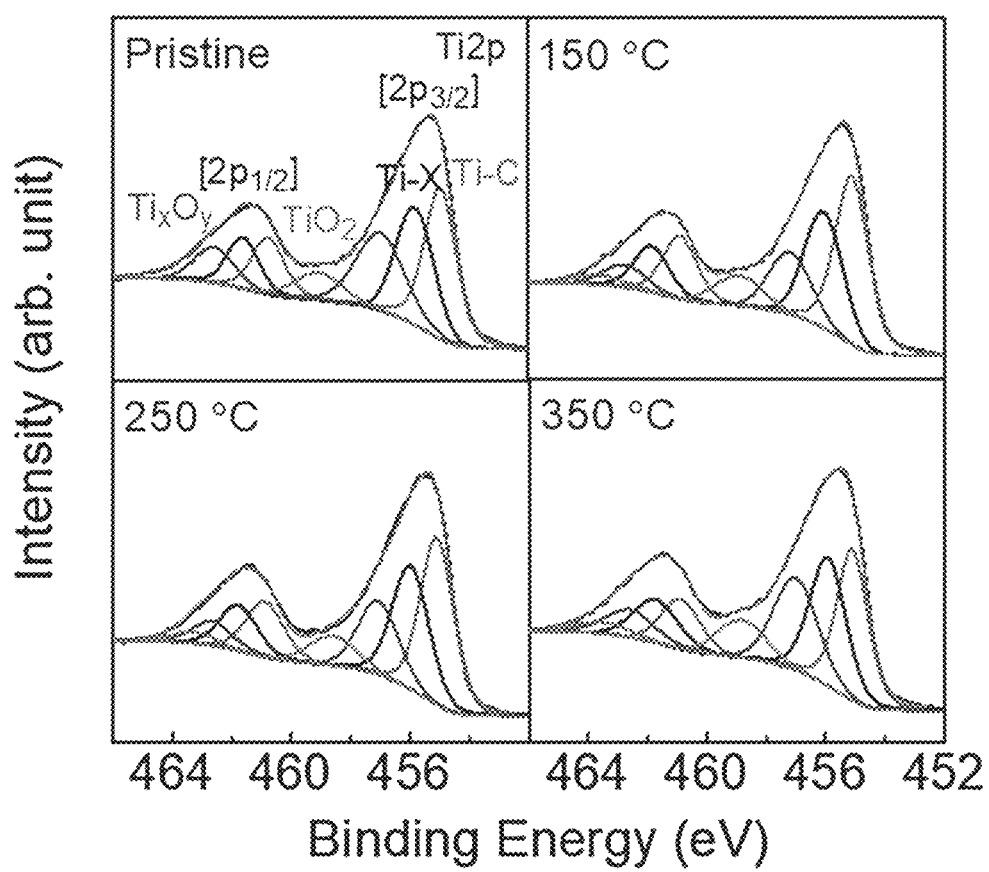
FIG. 7A shows high resolution XPS spectra of Ti 2p peaks of $Ti_3C_2T_x$ MXene films annealed at different annealing temperatures.
Figure 7B:
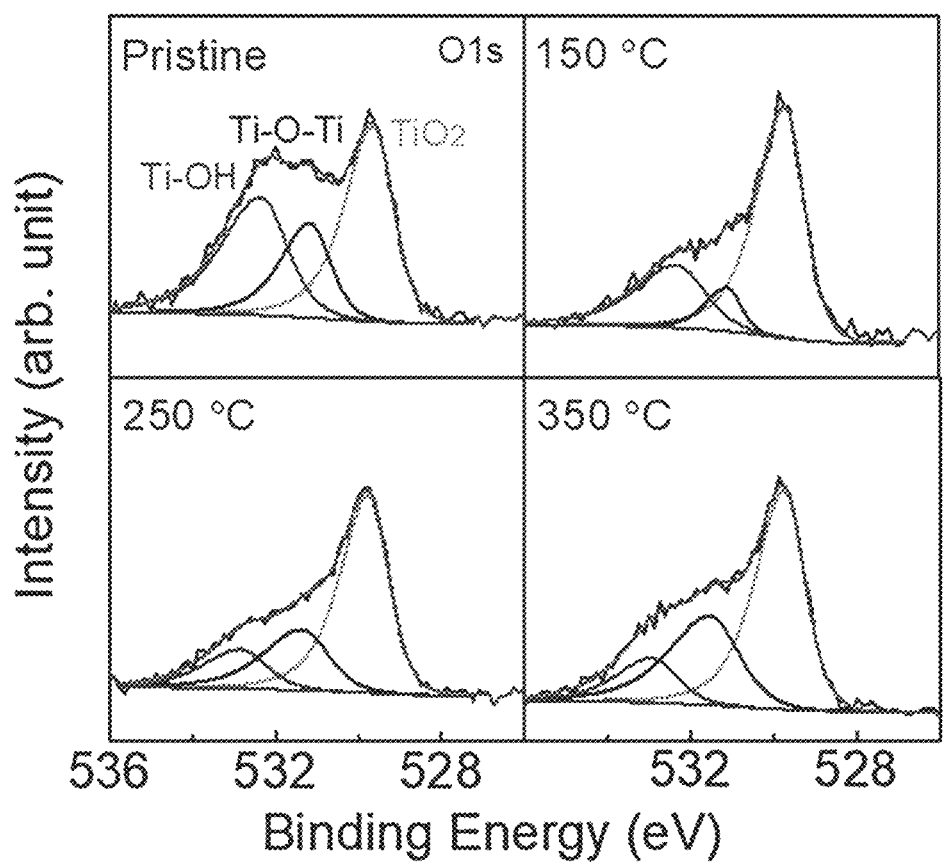
FIG. 7B shows high resolution XPS spectra of O 1s peaks of $Ti_3C_2T_x$ MXene films annealed at different annealing temperatures.

Example 3.4 Structural Analysis of Annealed $Ti_3CNT_x$ and $Ti_3C_2T_x$ MXene Film X-ray photoelectron spectroscopy (XPS) survey spectra before thermal annealing (FIG. 5A) exhibit an N peak in addition to the peaks for Ti, C, F, O and Cl elements, which originate from the titanium carbonitride structure of $Ti_3CNT_x$ with surface terminations. On the other hand, according to FIG. 5B, XPS survey spectra for $Ti_3C_2T_x$ have no N peak, showing the absence of nitrogen. High resolution XPS spectra of Ti2p and O1s of $Ti_3CNT_x$ annealed at different temperatures (150° C., 250° C., 350° C.) are shown in FIGS. 6A and 6B, and reveal that the Ti—OH content decreases with increasing the annealing temperature up to 300° C. but further increase in temperature initiate surface oxidation, resulting in the growth of $TiO_2$ nanocrystals at 350° C. In contrast, $Ti_3C_2T_x$ films did not show the formation of $TiO_2$ crystals under identical annealing conditions (FIGS. 7A and 7B). These results are in good agreement with XRD and TEM analysis results.

Figure 8A:
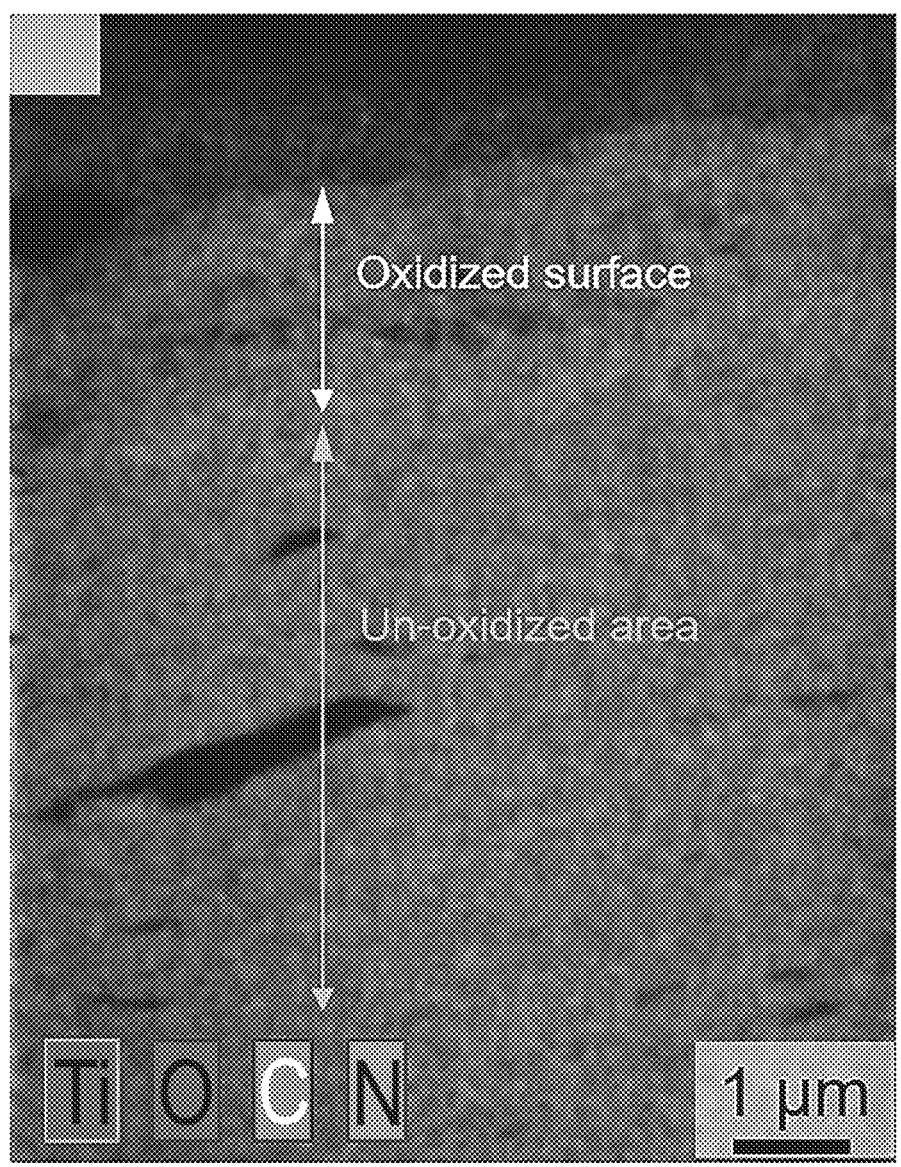
FIG. 8A shows a cross-sectional TEM image of $Ti_3CNT_x$ MXene film annealed at 350° C.
Figure 8B:
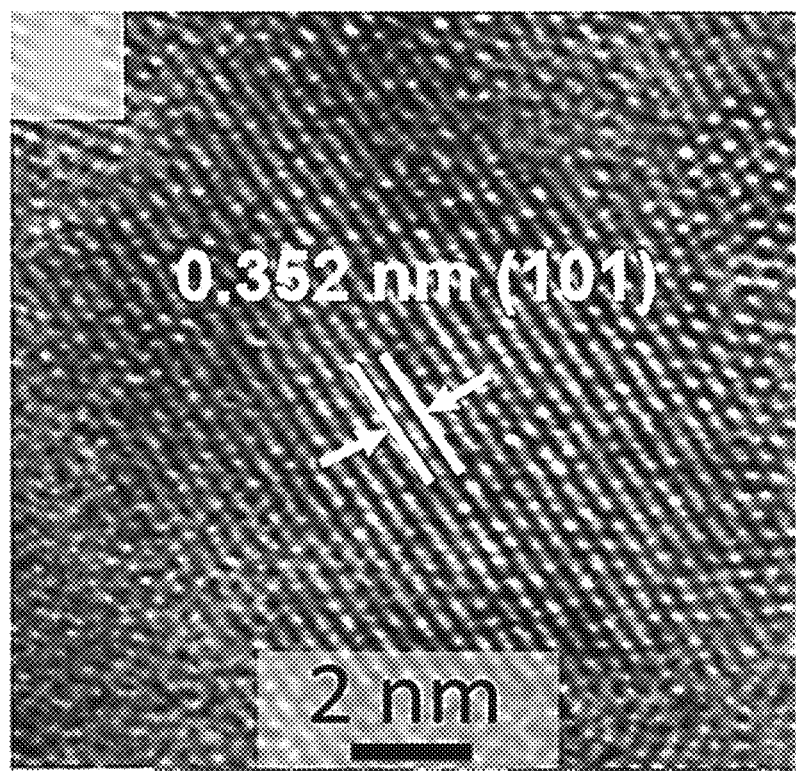
FIG. 8B shows a high resolution TEM image of a partially oxidized upper surface of $Ti_3CNT_x$ MXene film annealed at 350° C. having a lattice d-spacing of 0.352 nm, attributed to anatase $TiO_2$.
Figure 8C:
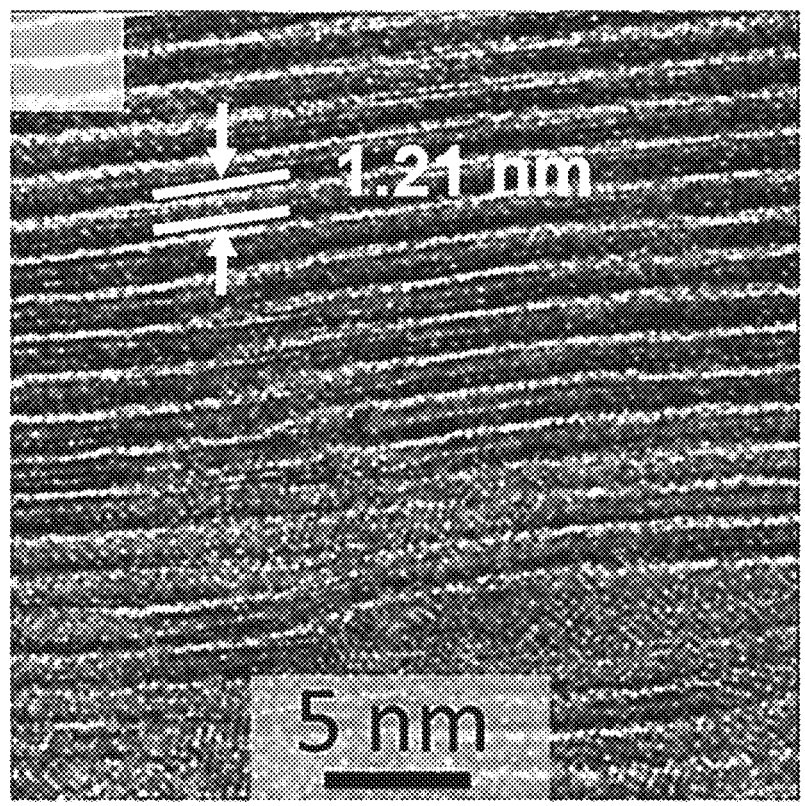
FIG. 8C shows the unoxidized inner part of $Ti_3CNT_x$ MXene film annealed at 350° C.

FIG. 8A shows a cross-sectional TEM image of $Ti_3CNT_x$ film annealed at 350° C., coupled with energy dispersive spectroscopy (EDS) mapping. FIG. 8A reveals that oxidation occurred only in a very thin surface layer and should have a little effect on electrical conductivity measurement. HRTEM image of the surface part of the film depicts a lattice d-spacing of 0.352 nm assigned to (101) plane of anatase $TiO_2$ due to oxidation (FIG. 8B), whereas the inner part of the film (FIG. 8C) shows no oxidation and sustains the layered morphology with d-spacing value of 1.21 nm which is consistent with the XRD data in FIG. 1G.

Figure 9A:
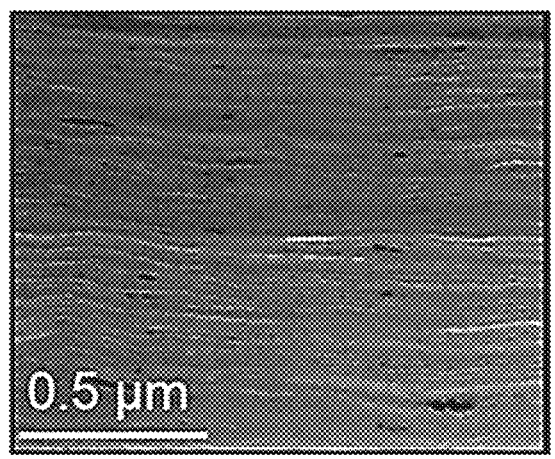
FIG. 9A shows a cross-sectional TEM image of as-synthesized (room temperature) $Ti_3CNT_x$ MXene film.
Figure 9B:
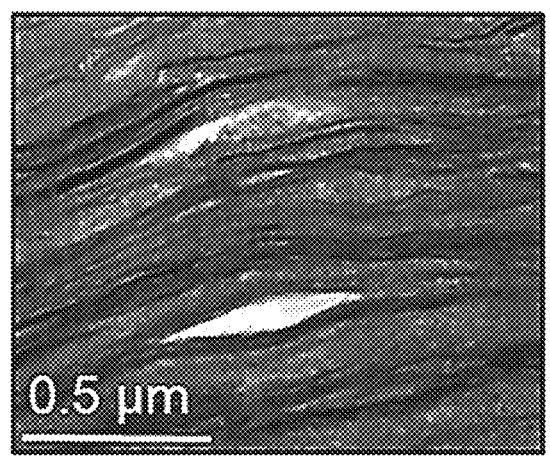
FIG. 9B shows a cross-sectional TEM image of $Ti_3CNT_x$ MXene film annealed at 150° C. for 6 hours.
Figure 9C:
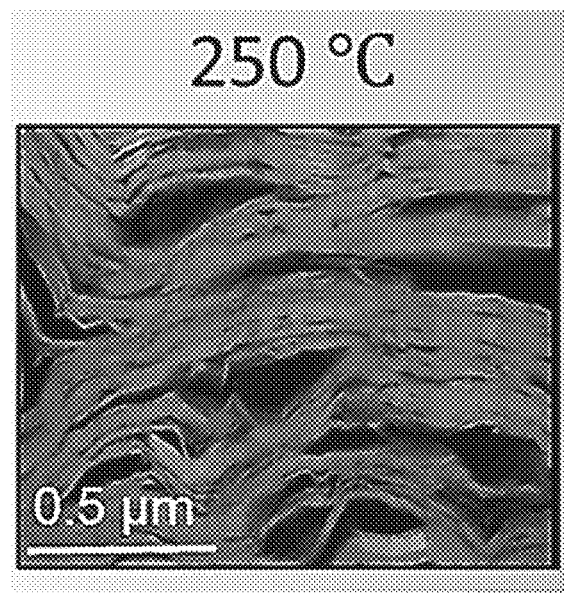
FIG. 9C shows a cross-sectional TEM image of $Ti_3CNT_x$ MXene film annealed at 250° C. for 6 hours.
Figure 9D:
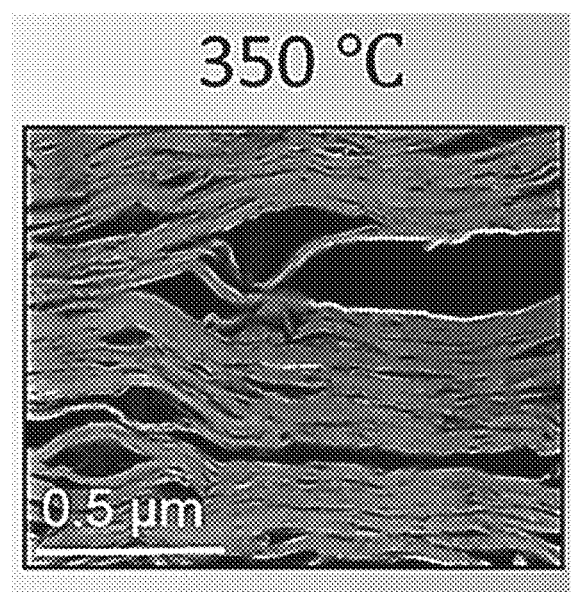
FIG. 9D shows a cross-sectional TEM image of $Ti_3CNT_x$ MXene film annealed as 350° C. for 6 hours.
Figure 10A:
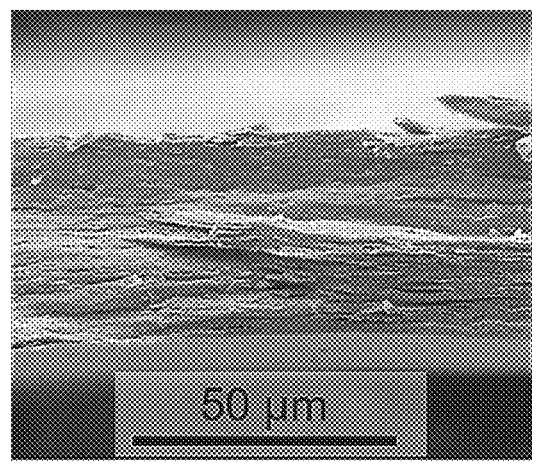
FIG. 10A shows a cross-sectional scanning electron microscopy (SEM) image of as-synthesized 40 μm-thick $Ti_3CNT_x$ MXene film.
Figure 10B:
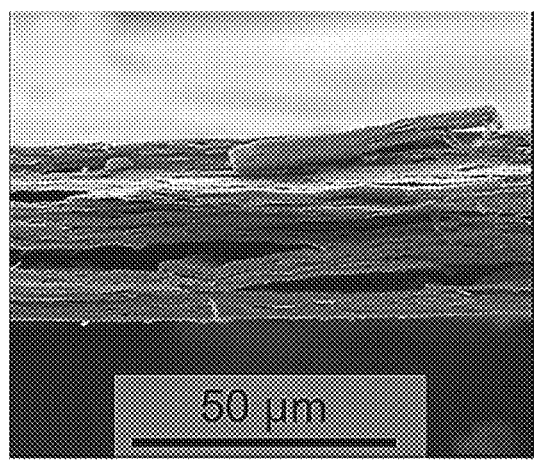
FIG. 10B shows a cross-sectional SEM image of 40 μm-thick $Ti_3CNT_x$ MXene film annealed at 150° C. for 6 hours.
Figure 10C:
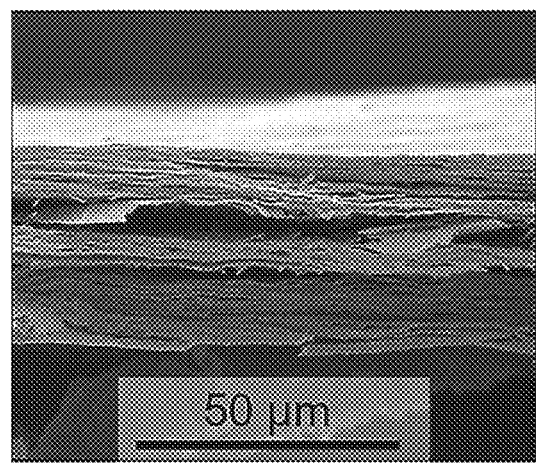
FIG. 10C shows a cross-sectional SEM image of 40 μm-thick $Ti_3CNT_x$ MXene film annealed at 250° C. for 6 hours.
Figure 10D:
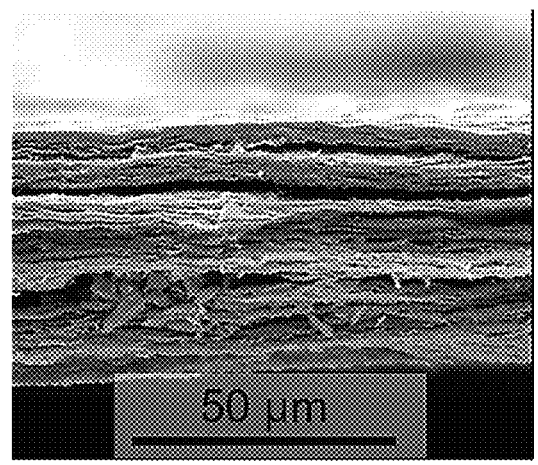
FIG. 10D shows a cross-sectional SEM image of 40 μm-thick $Ti_3CNT_x$ MXene film annealed at 350° C. for 6 hours.
Figure 11A:
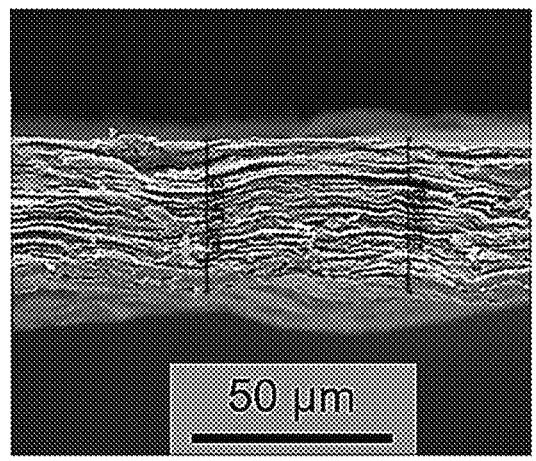
FIG. 11A shows a cross-sectional SEM image of as-synthesized 40 μm-thick $Ti_3C_2T_x$ MXene film.
Figure 11B:
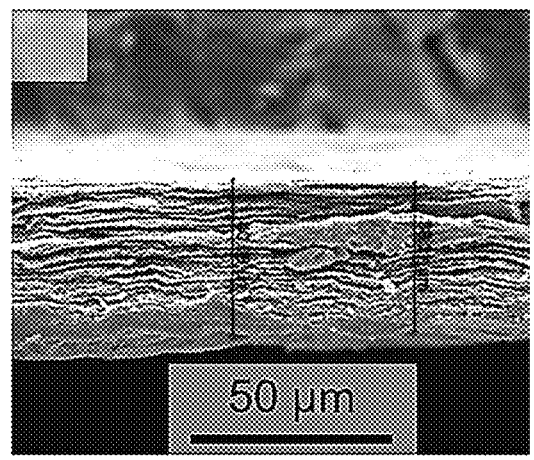
FIG. 11B shows a cross-sectional SEM image of 40 μm-thick $Ti_3C_2T_x$ MXene film annealed at 150° C. for 6 hours.
Figure 11C:
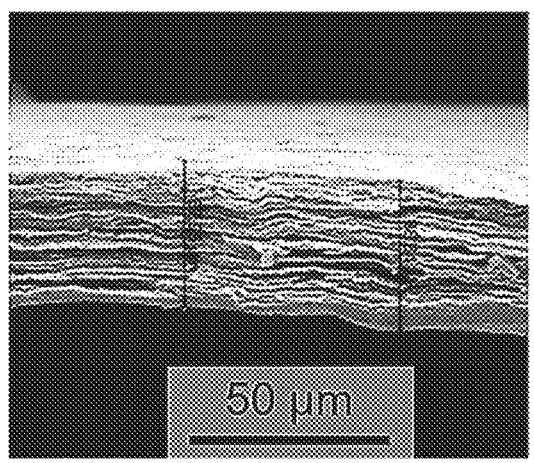
FIG. 11C shows a cross-sectional SEM image of 40 μm-thick $Ti_3C_2T_x$ MXene film annealed at 250° C. for 6 hours.
Figure 11D:
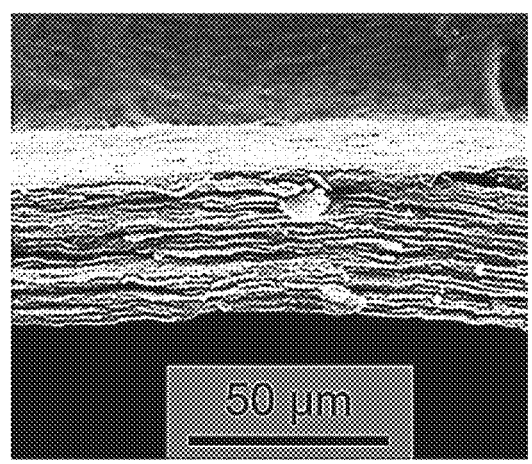
FIG. 11D shows a cross-sectional SEM image of 40 μm-thick $Ti_3C_2T_x$ MXene film annealed at 350° C. for 6 hours.

Example 3.5 Cross-Sectional Morphology of Annealed $Ti_3CNT_x$ and $Ti_3C_2T_x$ MXene Film Cross-sectional high-resolution TEM (HRTEM) images show structural changes in 40-μm-thick $Ti_3CNT_x$ film as a function of annealing temperature (FIGS. 9A to 9D). The low magnification scanning electron microscopy (SEM) images in FIGS. 10A to 10D provide morphological changes more clearly. As shown in FIGS. 9A and 10A, the as-prepared (room temperature) $Ti_3CNT_x$ film shows a compact and well-aligned laminate morphology. In contrast, as shown in FIGS. 9B to 9D and FIGS. 10B to 10D, slit pores were developed in the annealed films with a broad size distribution ranging from tens of nanometers to micrometers, and the pore size and pore volume rapidly increase with the annealing temperature. According to FIGS. 11A to 11D, $Ti_3C_2T_x$ also exhibits similar pore generation behavior in the annealed samples, but the pore size and pore volume is much smaller than $Ti_3CNT_x$ films at the same temperature.

Figure 12:
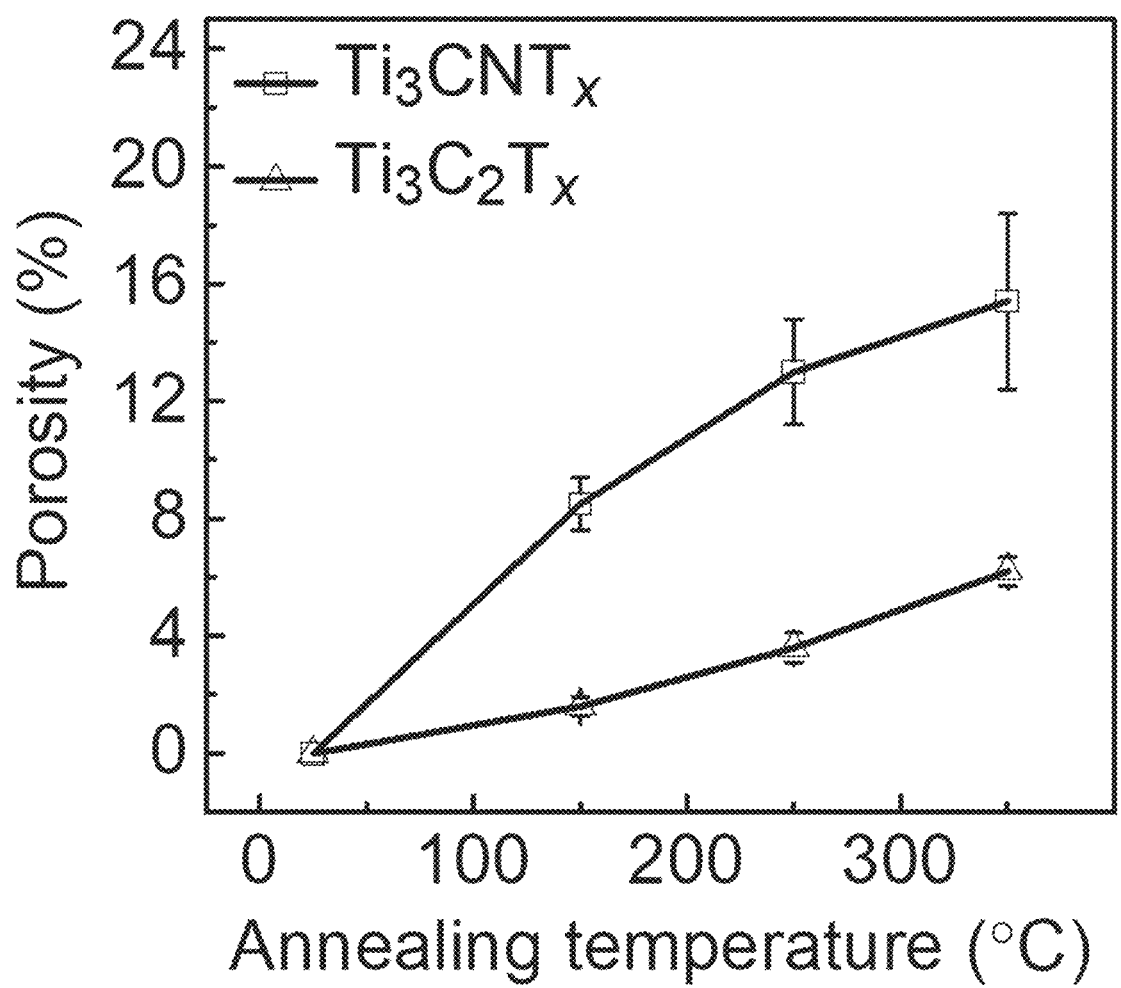
FIG. 12 shows the comparison results of porosity in 40 μm-thick annealed $Ti_3CNT_x$ and $Ti_3C_2T_x$ MXene films as a function of annealing temperature.
Figure 13A:
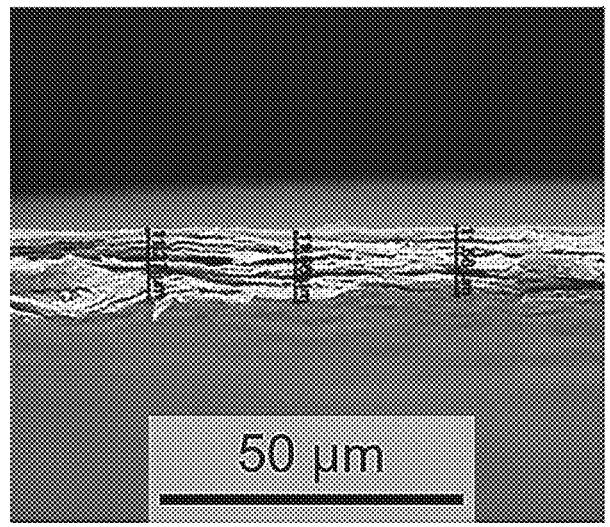
FIG. 13A shows a cross-sectional SEM image of 10 μm-thick $Ti_3CNT_x$ MXene film annealed at 350° C.
Figure 13B:
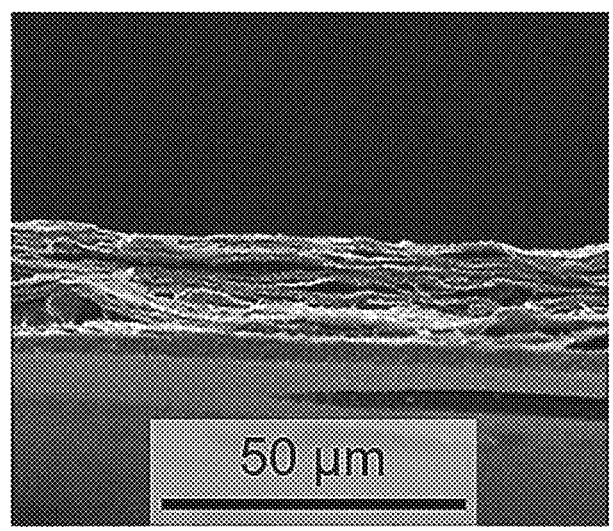
FIG. 13B shows a cross-sectional SEM image of 20 μm-thick $Ti_3CNT_x$ MXene film annealed at 350° C.
Figure 13C:
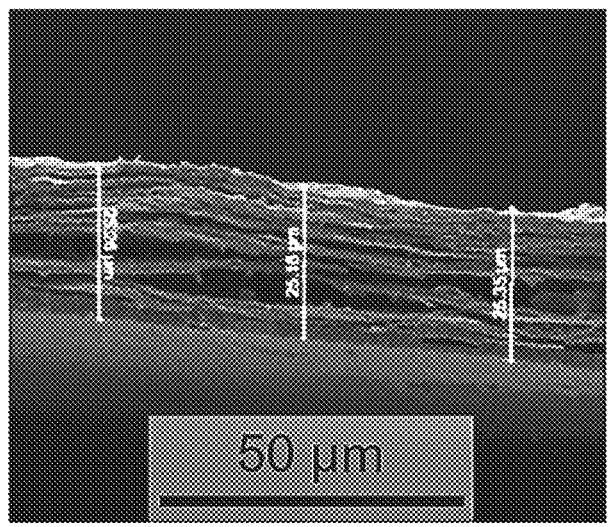
FIG. 13C shows a cross-sectional SEM image of 30 μm-thick $Ti_3CNT_x$ MXene film annealed at 350° C.
Figure 13D:
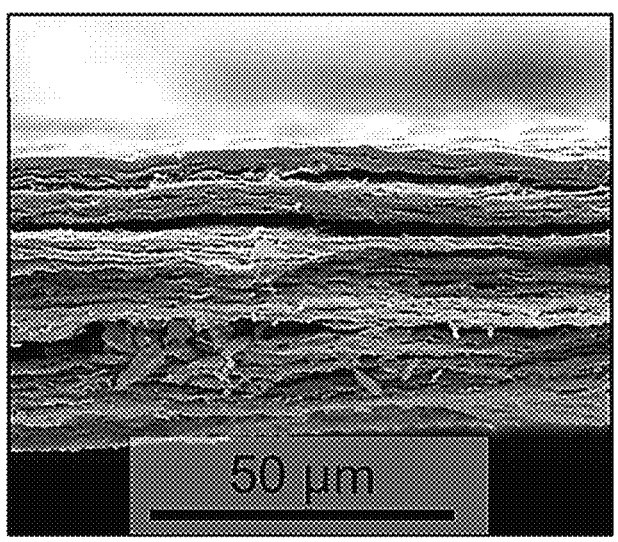
FIG. 13D shows a cross-sectional SEM image of 40 μm-thick $Ti_3CNT_x$ MXene film annealed at 350° C.
Figure 14:
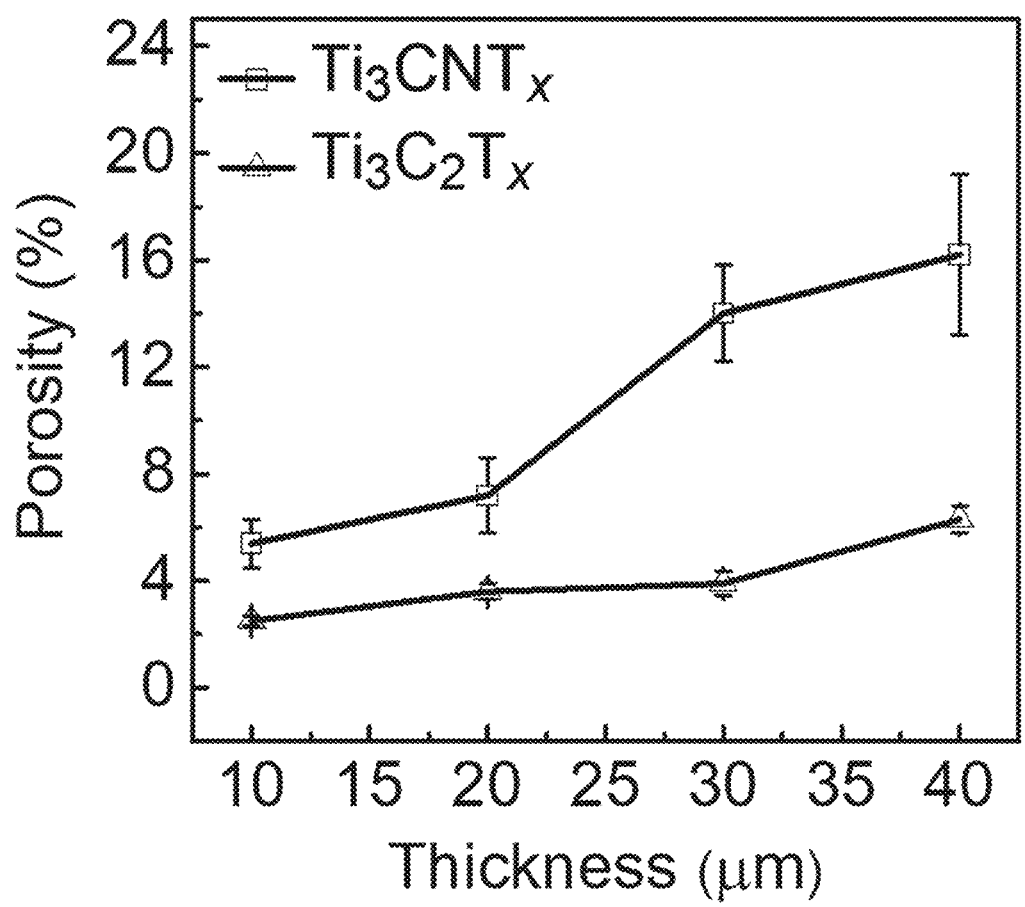
FIG. 14 shows the comparison of porosity in annealed $Ti_3CNT_x$ and $Ti_3C_2T_x$ MXene as a function of initial thickness of the films.

As shown in FIG. 12, at the film thickness of 40 μm, the porosity increases with annealing temperature and this effect is much larger in the case of $Ti_3CNT_x$ films compared to $Ti_3C_2T_x$. The pores are mainly generated by the loss of intercalated water and the loosely-absorbed molecules on the surface as well as the hydroxyl terminal groups for both $Ti_3CNT_x$ and $Ti_3C_2T_x$ as observed in FIGS. 4A and 4B. The larger pore size and porosity of $Ti_3CNT_x$ films are due to the larger amount of intercalated water compared to $Ti_3C_2T_x$ films under the same condition as suggested by TGA-MS result.

The porosity also depends on the initial thickness of the films annealed at fixed temperature of 350° C. as shown in FIGS. 13A to 13D and FIG. 14. The larger porosity in thicker film is attributed to the fact that larger amounts of gaseous compounds generated during heat treatment are entrapped in the film because of difficulty in escaping from the thick and compact laminate structure, resulting in creation of larger pores and localized ruptures in the thicker laminates.

Figure 15:
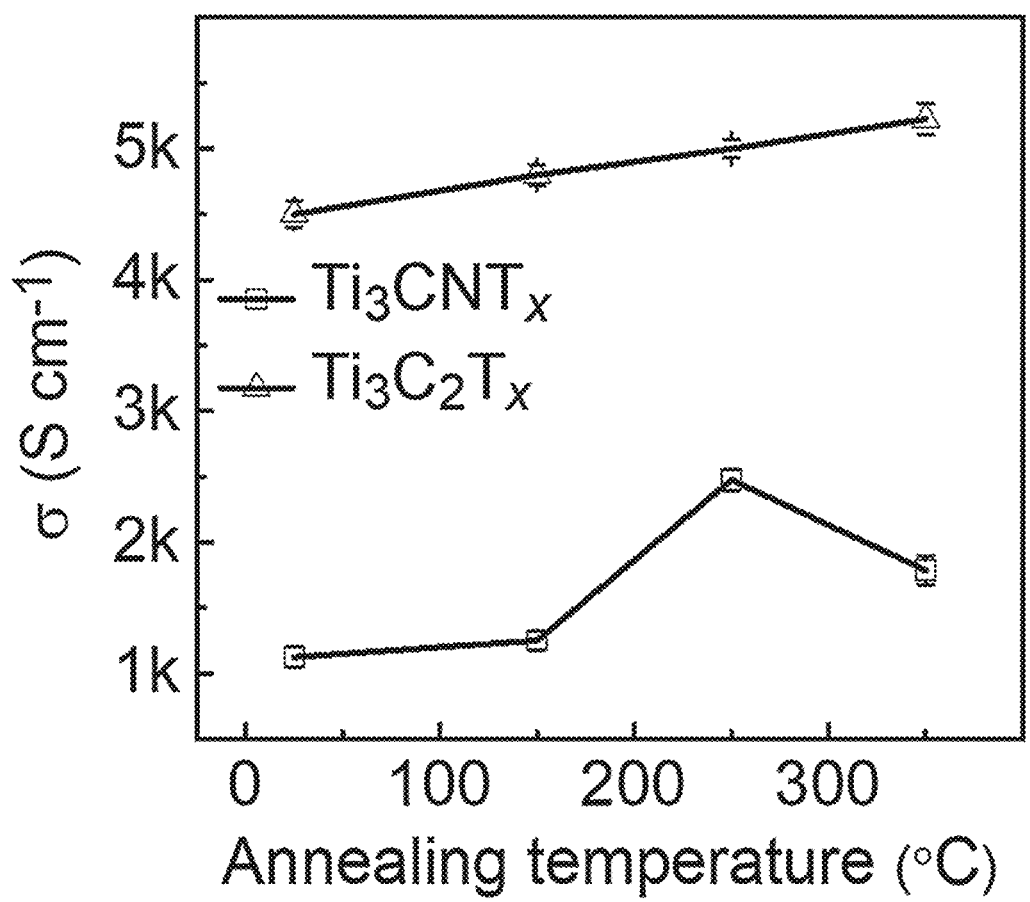
FIG. 15 shows the comparison of electrical conductivity of $Ti_3CNT_x$ and $Ti_3C_2T_x$ MXene films as a function of annealing temperature.

Example 3.6 Electrical Conductivity of Annealed $Ti_3CNT_x$ and $Ti_3C_2T_x$ MXene Film FIG. 15 shows the electrical conductivity of $Ti_3CNT_x$ and $Ti_3C_2T_x$ MXene films before and after annealing. As shown in FIG. 15, as-synthesized (room temperature) $Ti_3CNT_x$ has an average electrical conductivity of 1125 S/cm which gradually increases with annealing temperature and reaches a maximum value of 2475 S/cm at 250° C. which is 120% higher than that of as-synthesized films. This increase in electrical conductivity is due to the removal of intercalated water and other molecules leading to the reduction in interlayer spacing in the annealed samples. The reduced d-spacing decreases the inter-flake resistance between MXene sheets to facilitate electron conduction. A further increase in annealing temperature above 250° C. results in some decrease in conductivity to 1786 S/cm at 350° C. primarily because of increasing pore volume.

On the contrary, $Ti_3C_2T_x$ films showed a monotonous increment in electrical conductivity from 4500 to 5225 S/cm with increasing annealing temperature, indicating that $Ti_3C_2T_x$ films are more stable and develop less porosity as compared to $Ti_3CNT_x$ films.

Example 3.7 EMI Shielding of Annealed $Ti_3CNT_x$ and $Ti_3C_2T_x$ MXene Film

Figure 16A:
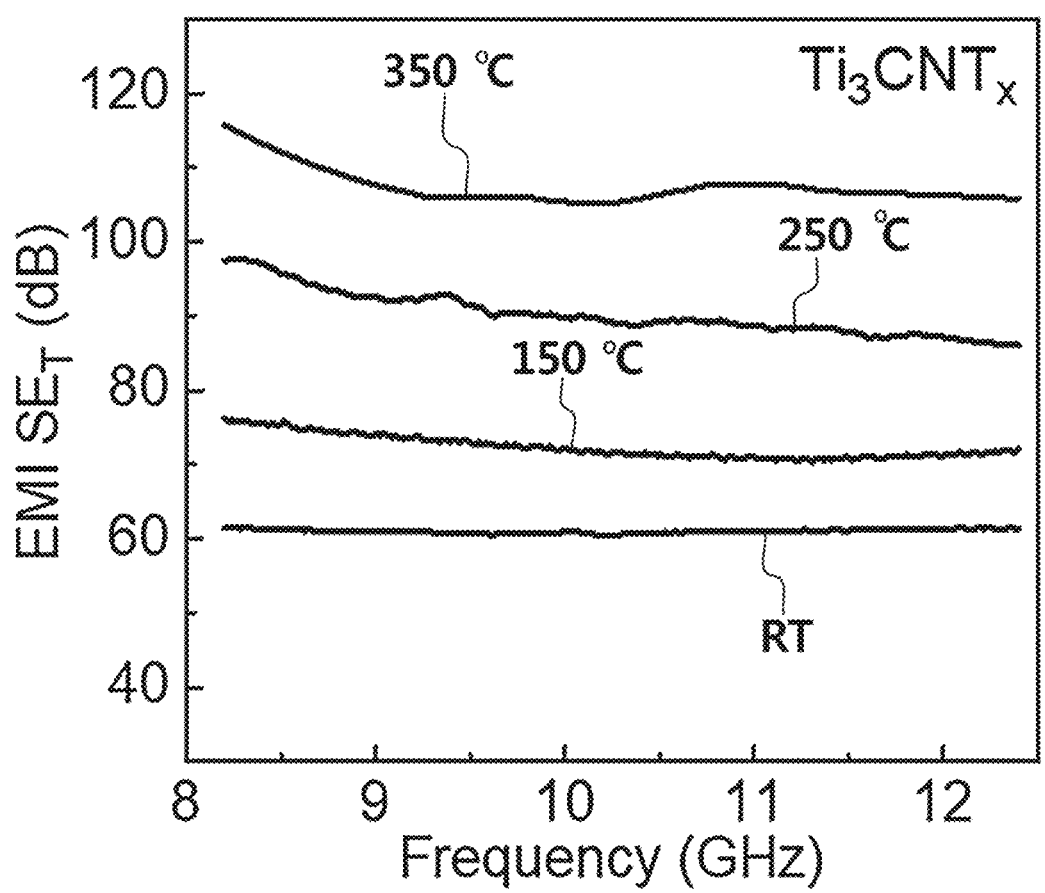
FIG. 16A shows the total electromagnetic interference (EMI) shielding efficiency ($SE_T$) of 40 μm-thick $Ti_3CNT_x$ MXene films annealed at different annealing temperatures.
Figure 16B:
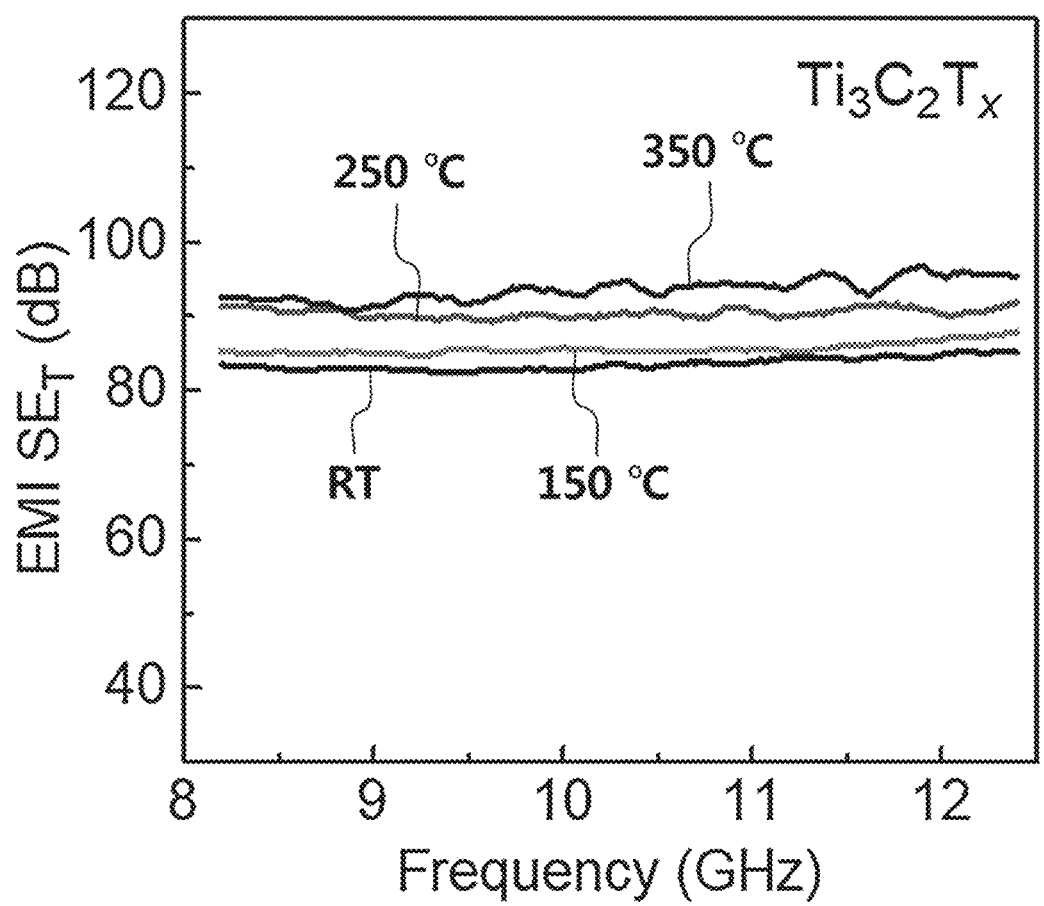
FIG. 16B shows the total EMI shielding efficiency ($SE_T$) of 40 μm-thick $Ti_3C_2T_x$ MXene films annealed at different temperatures.
Figure 16C:
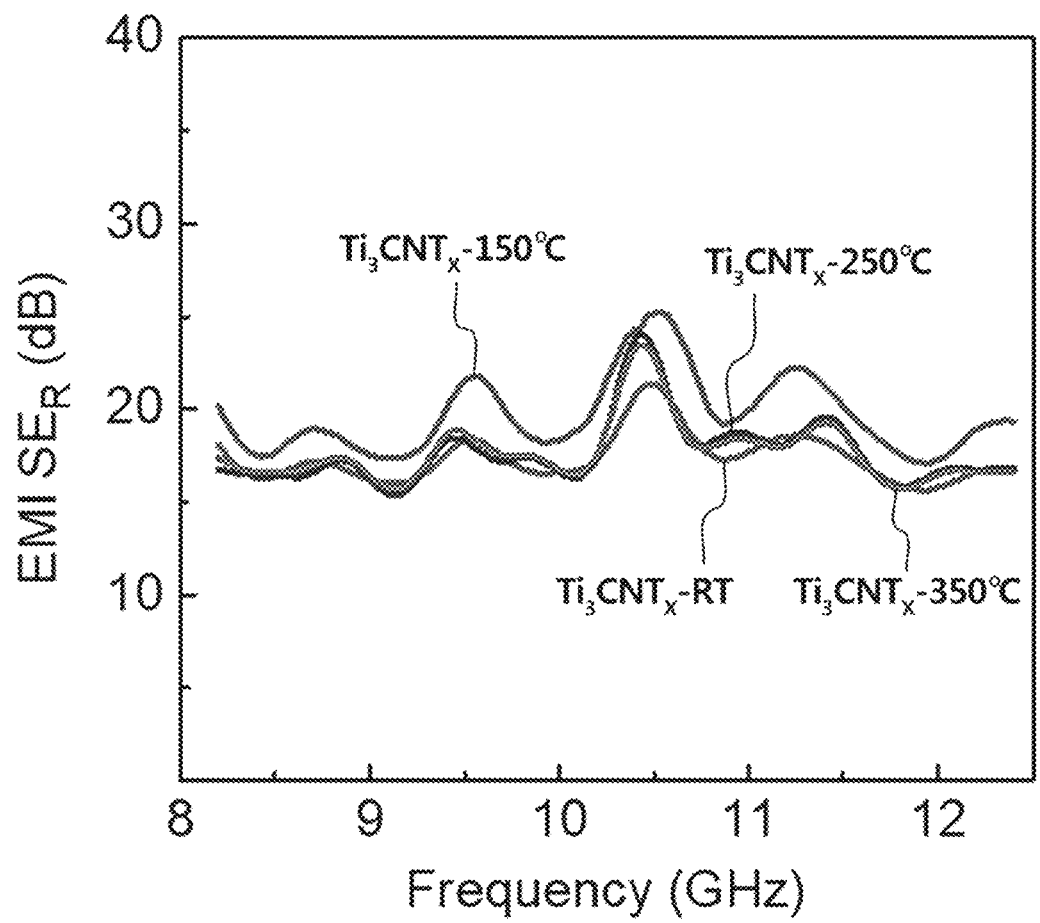
FIG. 16C shows reflection EMI SE ($SE_R$) of 40 μm-thick $Ti_3CNT_x$ MXene films annealed at different temperatures.
Figure 16D:
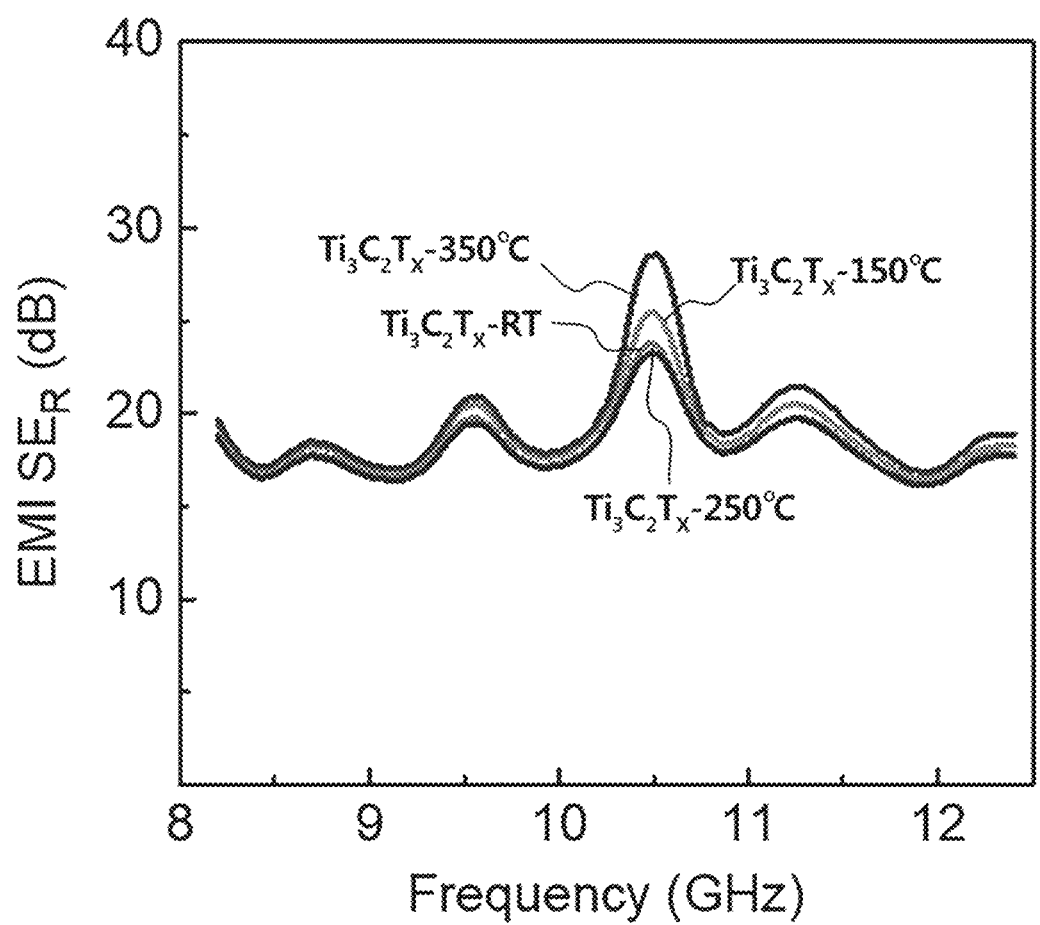
FIG. 16D shows the total EMI $SE_R$ of 40 μm-thick $Ti_3C_2T_x$ MXene films annealed at different temperatures.
Figure 16E:
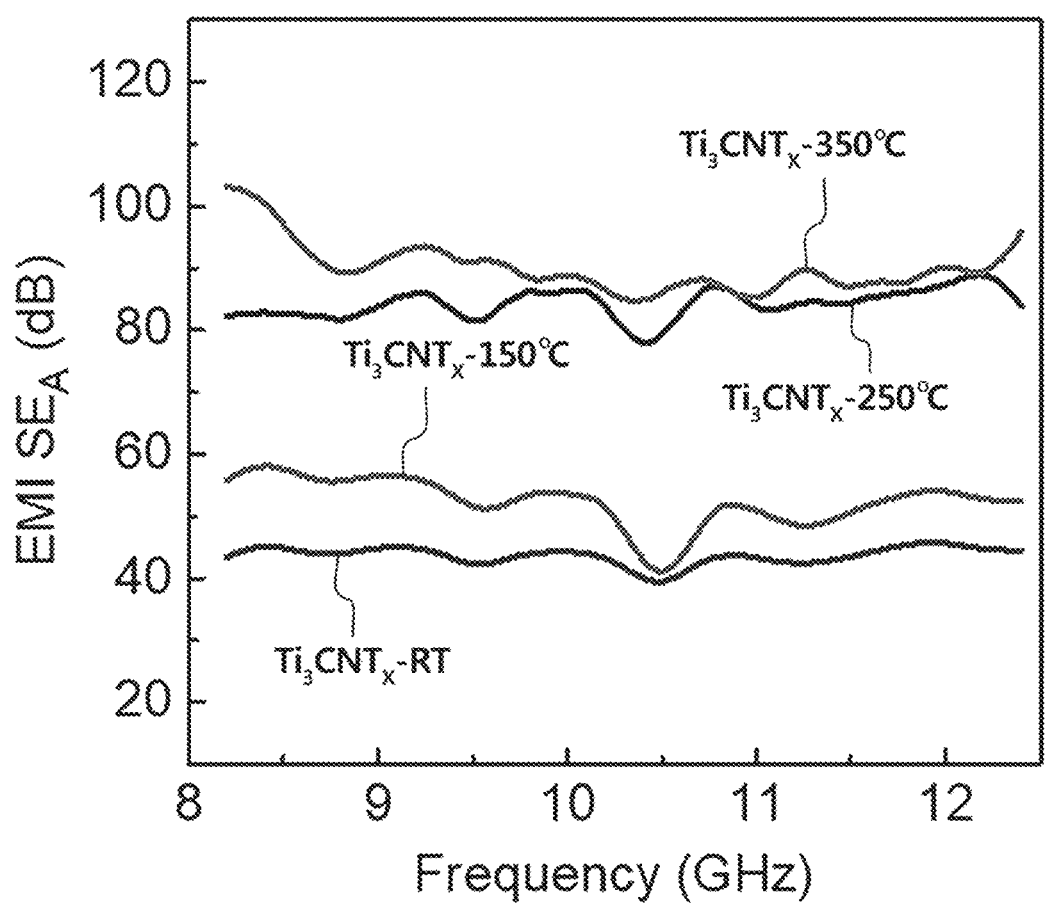
FIG. 16E shows absorption EMI SE ($SE_A$) of 40 μm-thick $Ti_3CNT_x$ MXene films annealed at different temperatures.
Figure 16F:
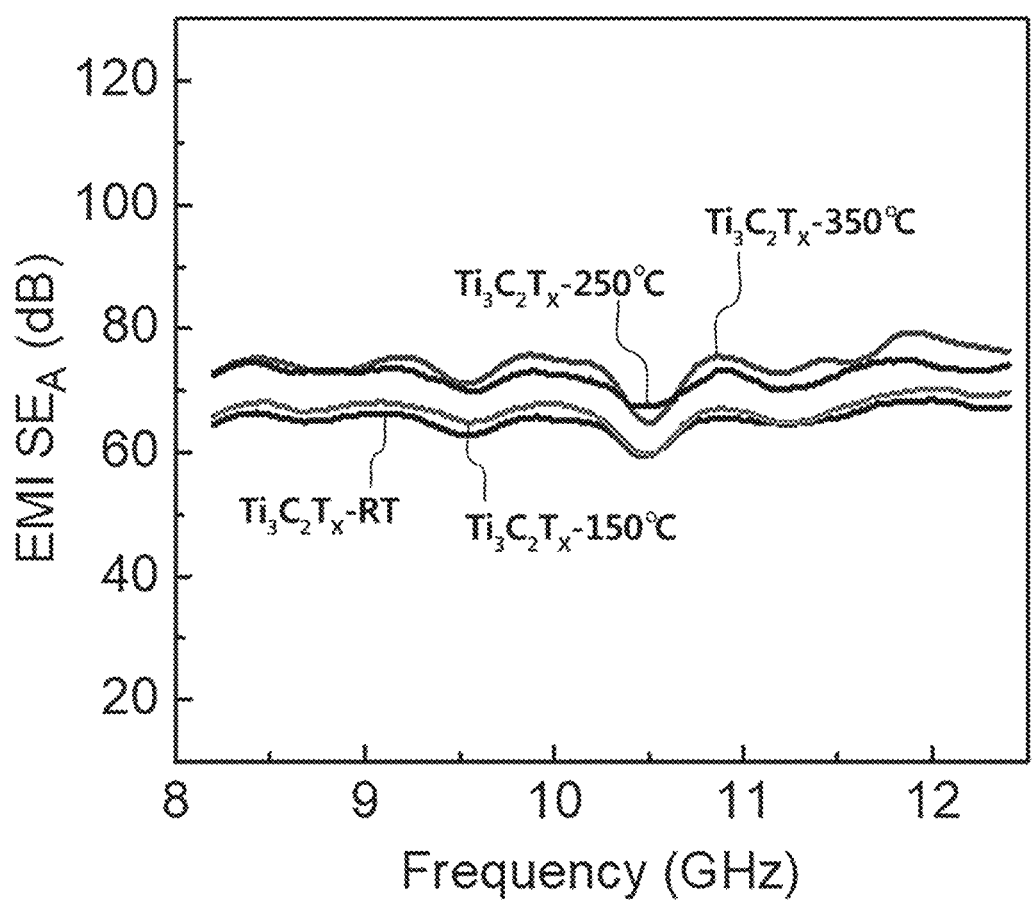
FIG. 16F shows EMI $SE_A$ of 40 μm-thick $Ti_3C_2T_x$ MXene films annealed at different temperatures.

FIGS. 16A and 16B show the total EMI shielding effectiveness ($SE_T$) of 40 μm-thick $Ti_3CNT_x$ and $Ti_3C_2T_x$ films in the X-band frequency range after annealing at various temperatures. The shielding effectiveness values due to reflection ($SE_R$) and absorption ($SE_A$) for both MXenes are shown in FIGS. 16C to 16F. As shown in FIG. 16A, as-synthesized $Ti_3CNT_x$ film without heat treatment shows an $SE_T$ of 61 dB, which dramatically rises to 77 dB, 99 dB and 116 dB at the annealing temperatures of 150° C., 250° C. and 350° C., respectively. In contrast, as shown in FIG. 16B, as-synthesized $Ti_3C_2T_x$ reveals an $SE_T$ of 84 dB, which gradually rises to 87 dB, 92 dB and 93 dB at the annealing temperatures of 150° C., 250° C. and 350° C., respectively.

Figure 16G:
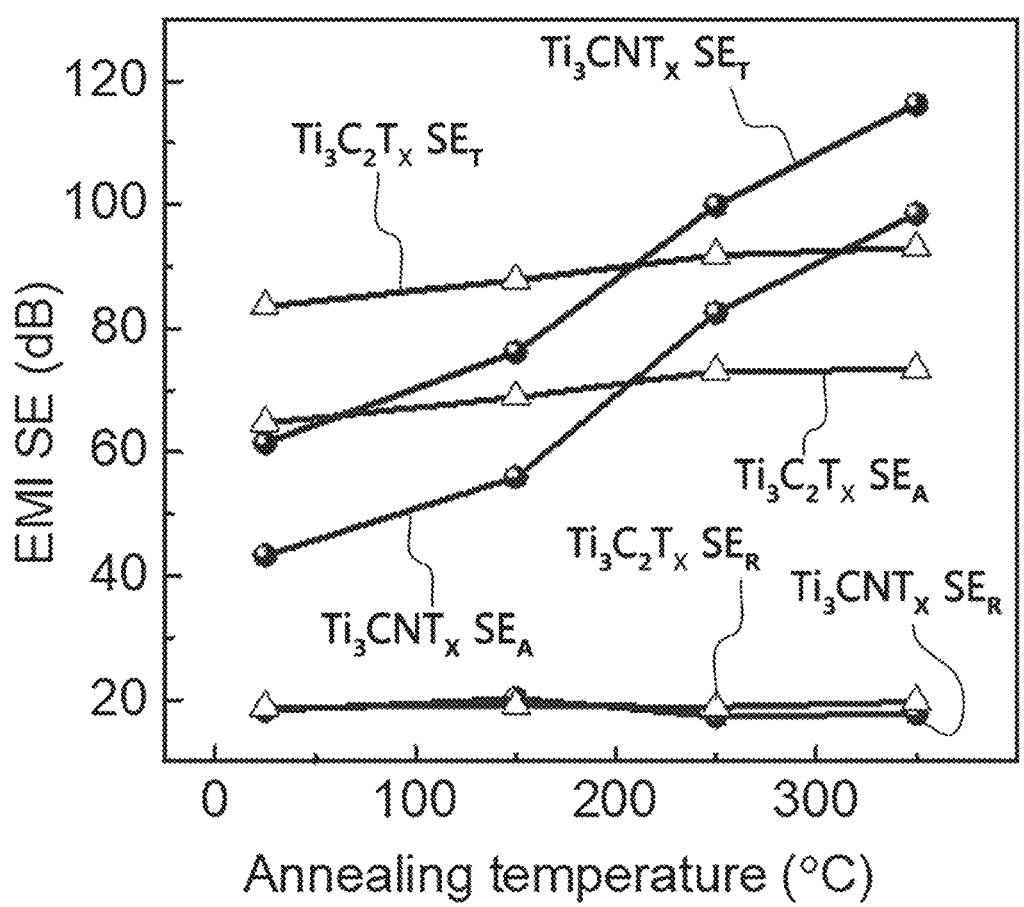
FIG. 16G shows the comparison results of EMI $SE_T$, $SE_R$, and $SE_A$ of 40 μm-thick $Ti_3CNT_x$ and $Ti_3C_2T_x$ MXene films annealed at different annealing temperatures.
Figure 16H:
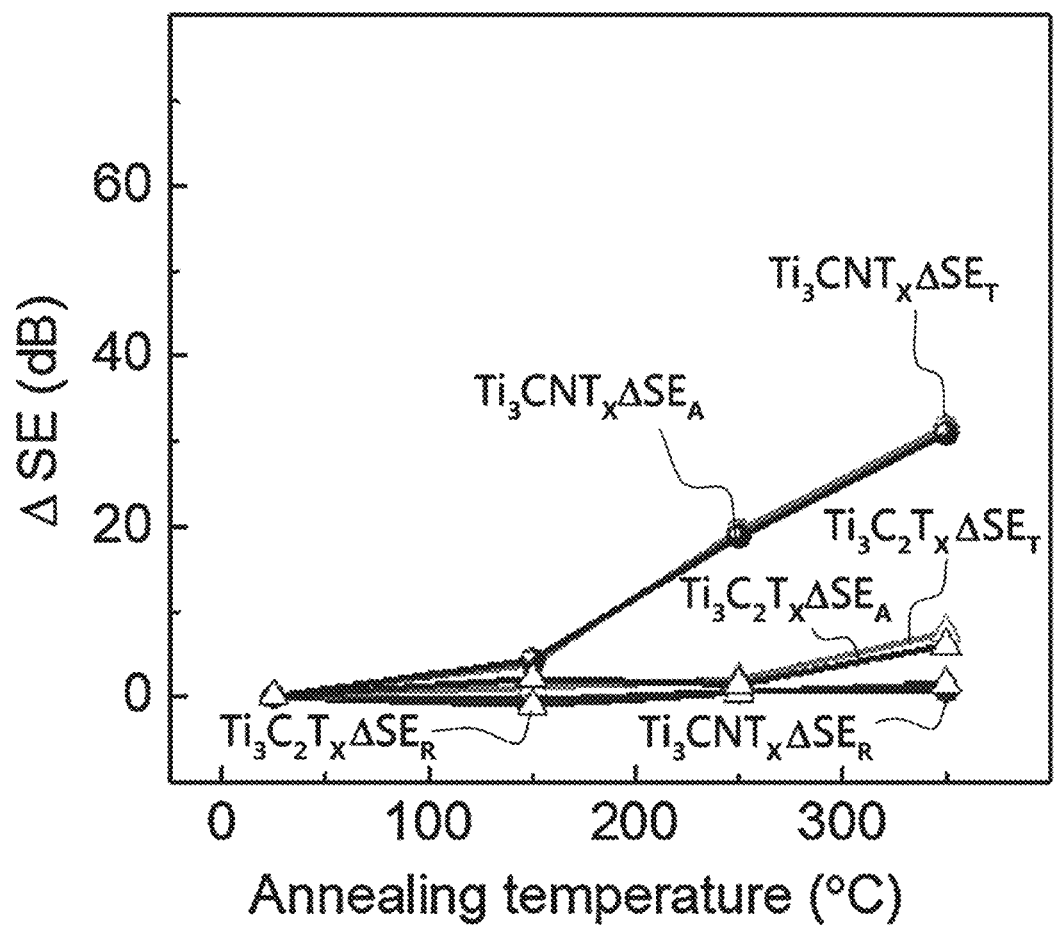
FIG. 16H shows the comparison of $\Delta SE_T$, $\Delta SE_R$, and $\Delta SE_A$ of 10 μm-thick $Ti_3CNT_x$ and $Ti_3C_2 T_x$ MXene films annealed at different temperatures.
Figure 16I:
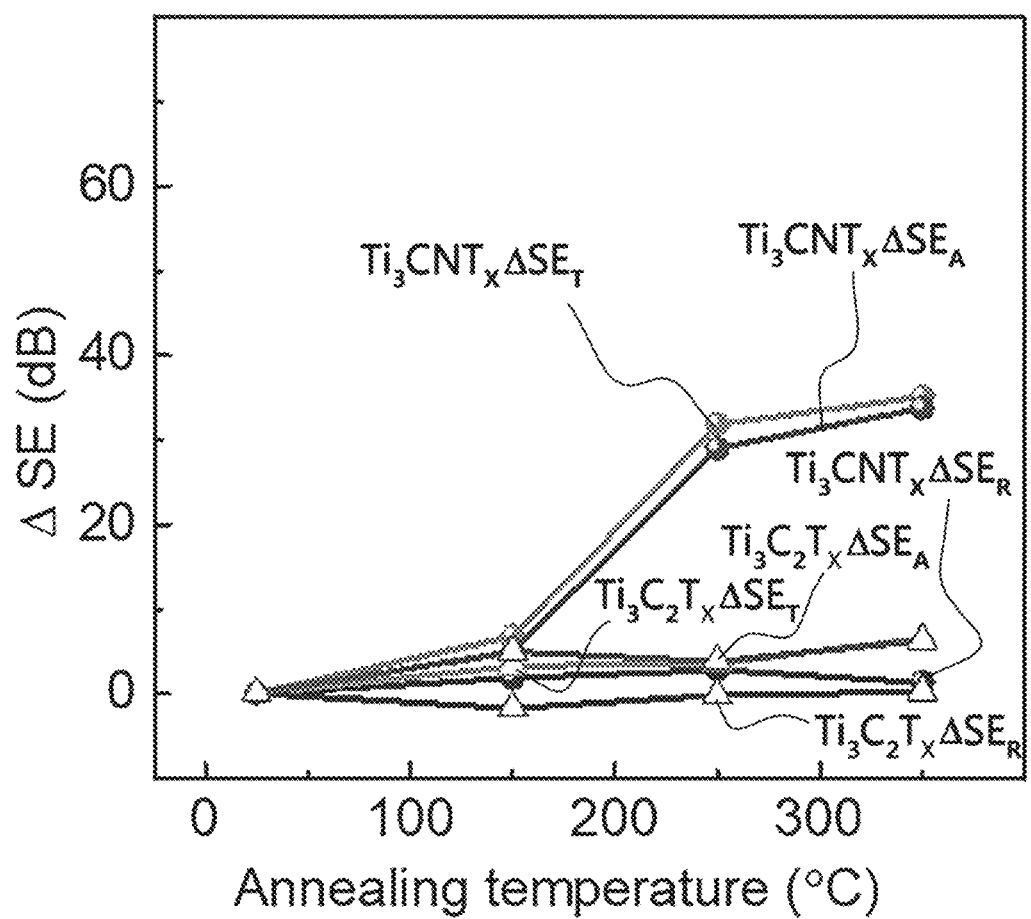
FIG. 16I shows the comparison of $\Delta SE_T$, $\Delta SE_R$, and $\Delta SE_A$ of 20 μm-thick $Ti_3CNT_x$ and $Ti_3C_2 T_x$ MXene films annealed at different temperatures.
Figure 16J:
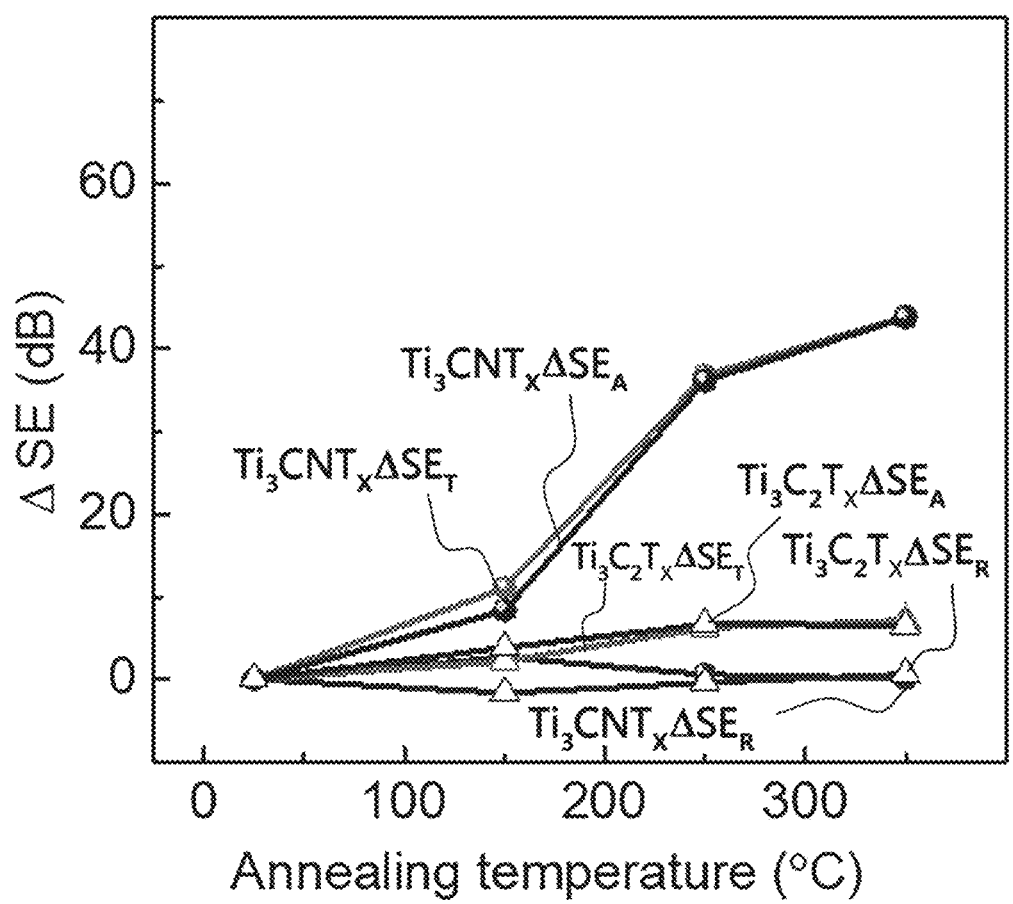
FIG. 16J shows the comparison of $\Delta SE_T$, $\Delta SE_R$, and $\Delta SE_A$ of 30 μm-thick $Ti_3CNT_x$ and $Ti_3C_2T_x$ MXene films annealed at different temperatures.

FIG. 16G summarizes the absolute shielding effectiveness $SE_T$, $SE_R$ and $SE_A$ for 40 μm-thick $Ti_3CNT_x$ and $Ti_3C_2T_x$ films annealed at various temperatures. The increments in $SE_T$, $SE_R$ and $SE_A$ values with the increasing film thickness (10 μm, 20 μm, 30 μm, and 40 μm) are expressed as $\Delta SE_T$, $\Delta SE_R$, and $\Delta SE_A$, respectively, as a function of annealing temperature in FIGS. 16H to 16K. ASE represents the extent of SE increase after annealing compared with as-synthesized materials.

Figure 16K:
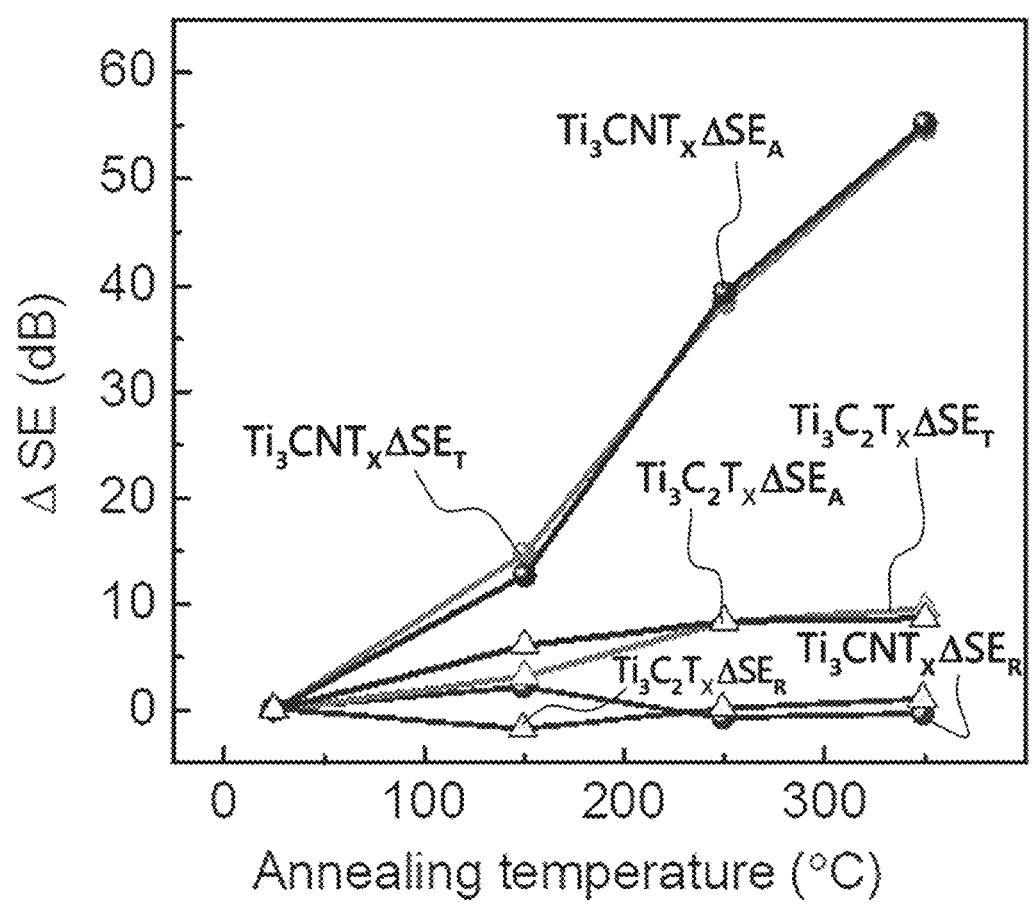
FIG. 16K shows the comparison of $\Delta SE_T$, $\Delta SE_R$, and $\Delta SE_A$ of 40 μm-thick $Ti_3CNT_x$ and $Ti_3C_2T_x$ MXene films annealed at different temperatures.

It can be seen from FIGS. 16A to 16F that the $SE_T$ and $SE_A$ of $Ti_3CNT_x$ films rapidly increase with increasing annealing temperature, while the SE, values rarely depend on annealing temperature, and $Ti_3C_2T_x$ films also reveal the same trend as $Ti_3CNT_x$ films. However, it is found that the increment rate in $Ti_3C_2T_x$ is much smaller than that in $Ti_3CNT_x$ at the same annealing conditions. As shown in FIG. 16K, $\Delta SE_T$ values for pristine and annealed films of 40 μm thickness after annealing at 350° C. reach 55 dB for $Ti_3CNT_x$ and 9 dB for $Ti_3C_2T_x$, which are equivalent to 90% and 12.6% improvement in $SE_T$ compared to the as-synthesized materials, respectively.

Figure 17A:
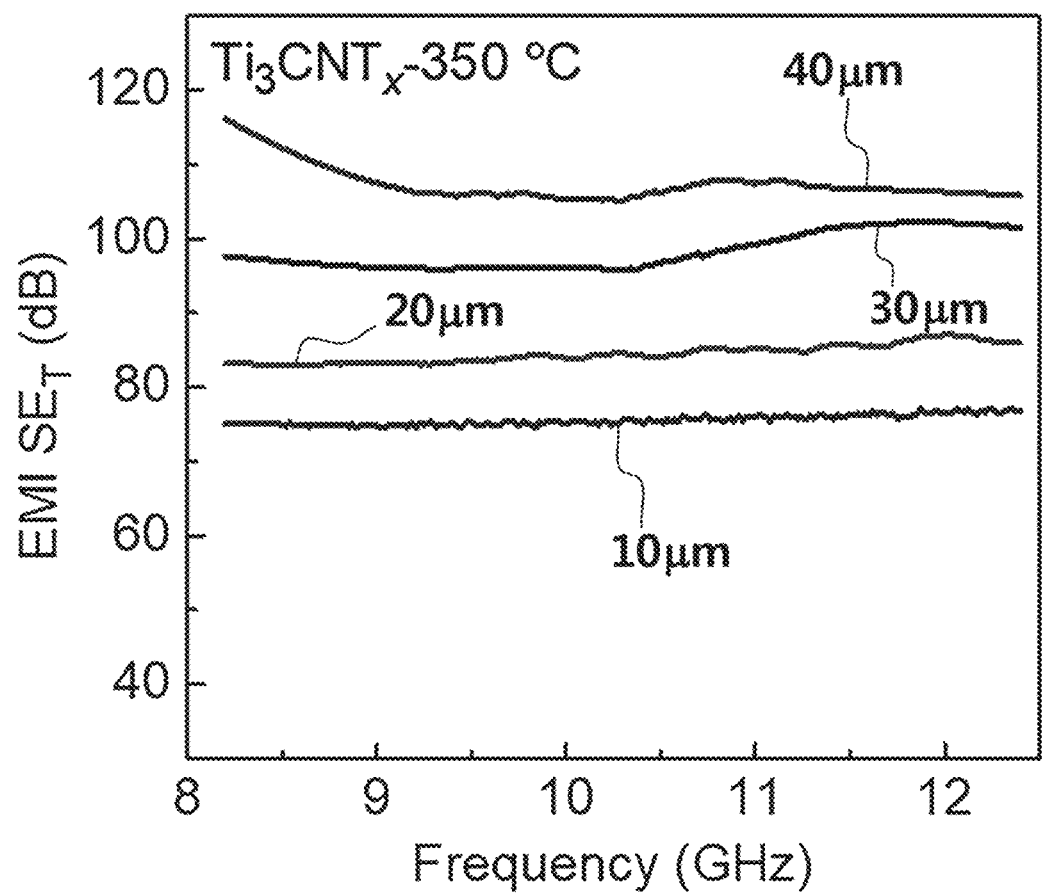
FIG. 17A shows EMI $SE_T$ of $Ti_3CNT_x$ MXene films having different thicknesses annealed at 350° C.
Figure 17B:
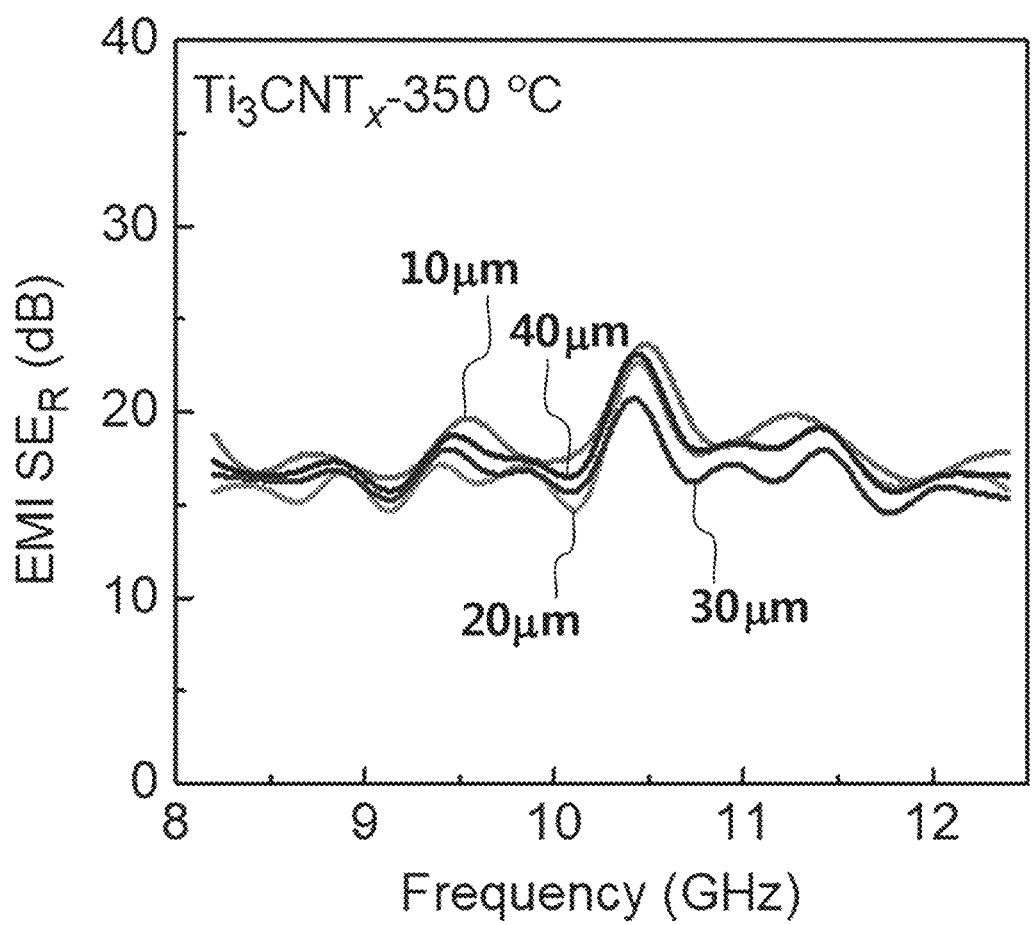
FIG. 17B shows EMI $SE_R$ of $Ti_3CNT_x$ MXene films having different thicknesses annealed at 350° C.
Figure 17C:
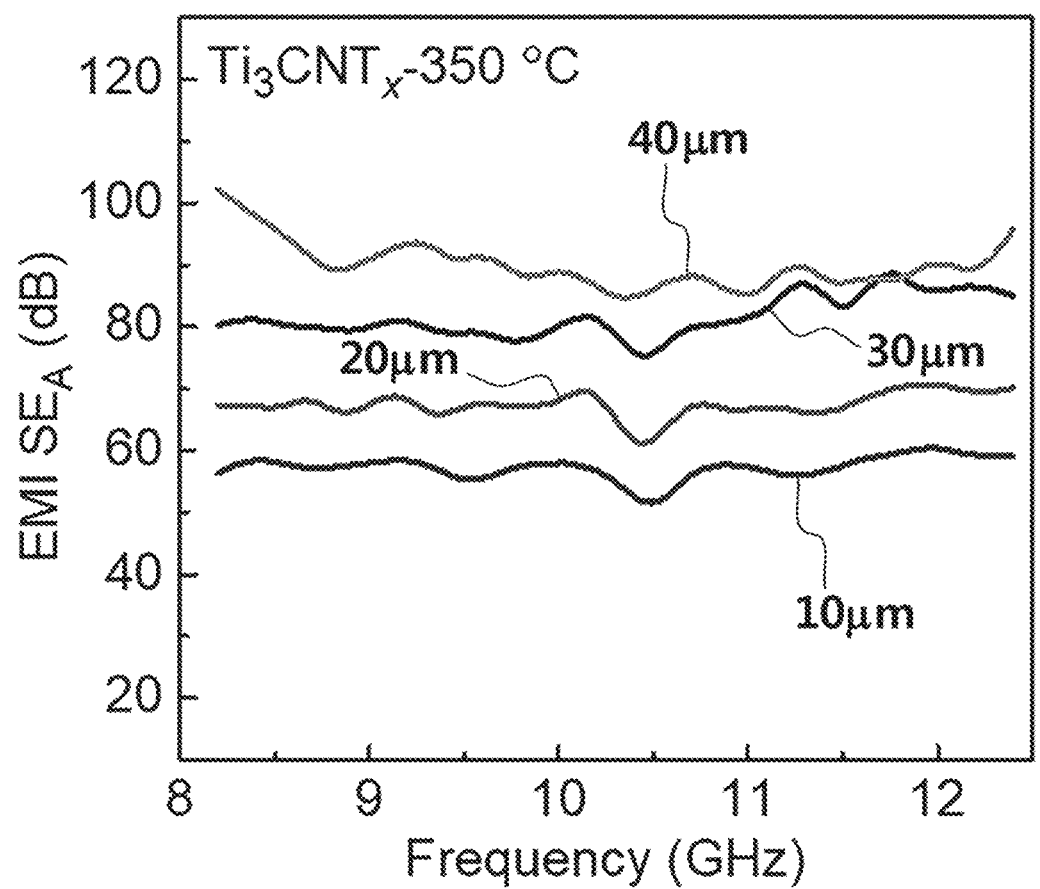
FIG. 17C shows EMI $SE_A$ of $Ti_3CNT_x$ MXene films having different thicknesses annealed at 350° C.
Figure 17D:
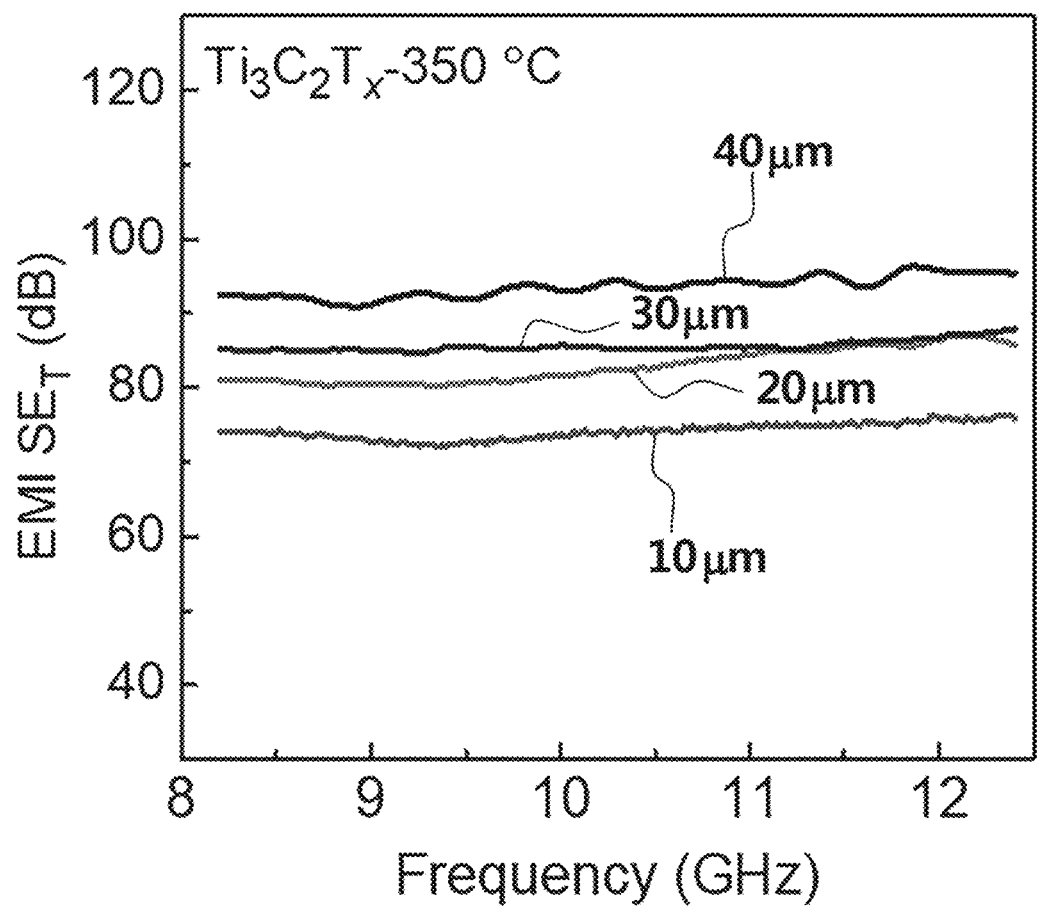
FIG. 17D shows EMI $SE_T$ of $Ti_3C_2T_x$ MXene films having different thicknesses annealed at 350° C.
Figure 17E:
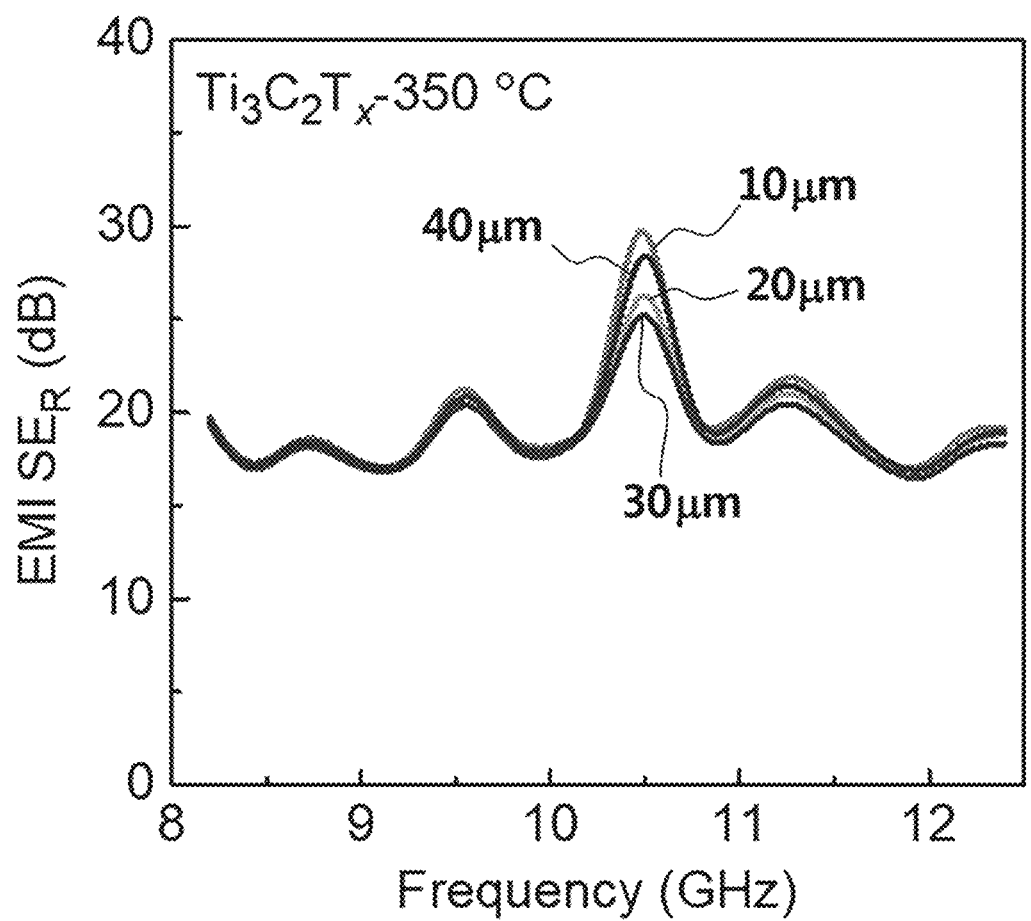
FIG. 17E shows EMI $SE_R$ of $Ti_3C_2T_x$ MXene films having different thicknesses annealed at 350° C.
Figure 17F:
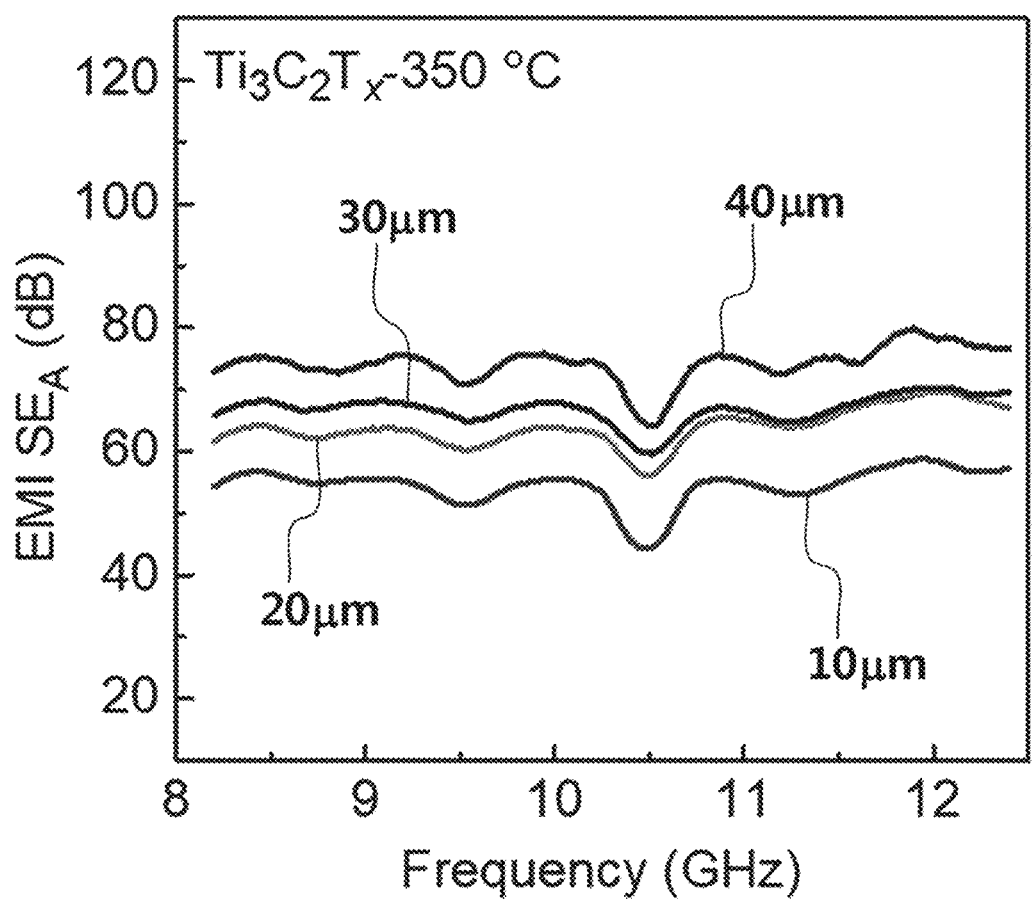
FIG. 17F shows EMI $SE_A$ of $Ti_3C_2T_x$ MXene films having different thicknesses annealed at 350° C.
Figure 17G:
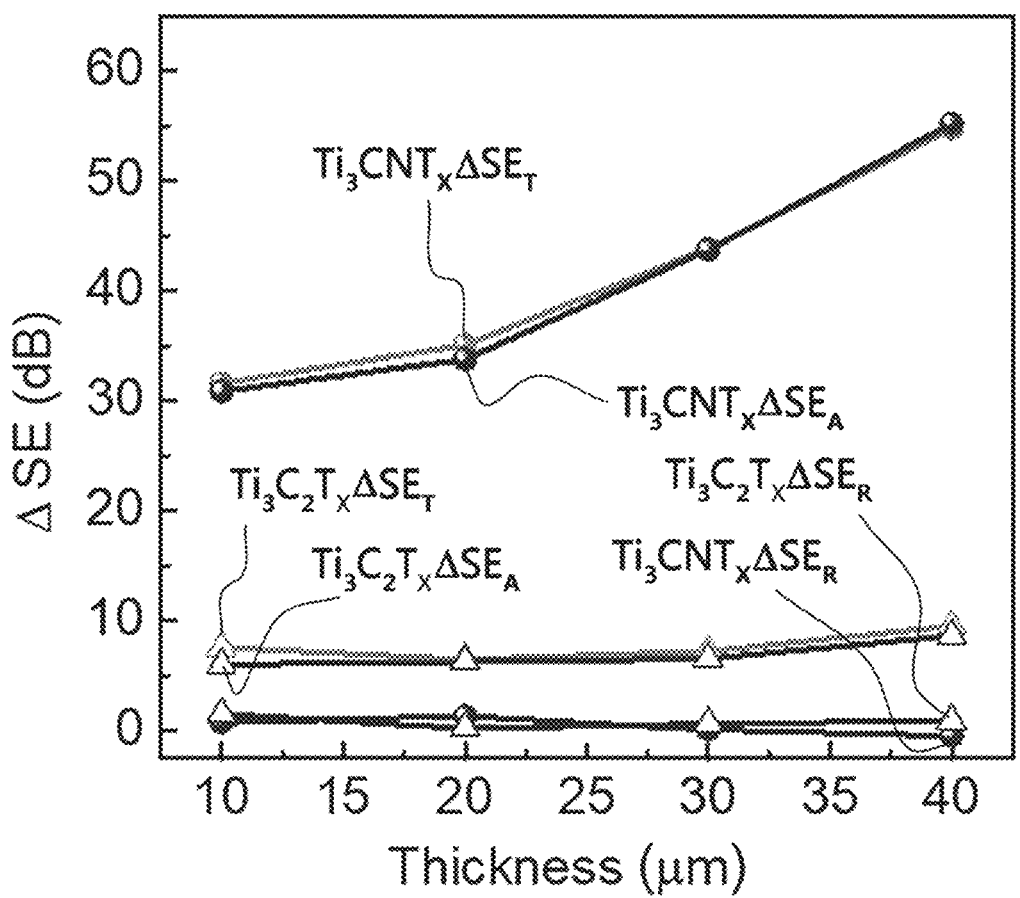
FIG. 17G shows the comparison of $\Delta SE_T$, $\Delta SE_R$, and $\Delta SE_A$ of $Ti_3CNT_x$ and $Ti_3C_2T_x$ MXene films having different thicknesses annealed at 350° C.

The thickness dependences at the annealing temperature of 350° C. are shown in FIGS. 17A to 17F. The temperature dependences of ASE for the samples with different thicknesses (as shown in FIG. 17G, each 10, 20, 30 and 40 μm) follow the same trend for both MXenes, $Ti_3CNT_x$ and $Ti_3C_2T_x$. However, at the same annealing temperature, as the sample thickness increases from 10 μm to 40 μm, in the case of $Ti_3CNT_x$, $\Delta SE_T$ increases substantially from 31.6 dB to 54.7 dB, while in the case of $Ti_3C_2T_x$, $\Delta SE_T$ just slightly increases from 6.0 dB to 8.6 dB. A difference in $\Delta SE_T$ between $Ti_3CNT_x$ and $Ti_3C_2T_x$ films becomes larger with increasing sample thickness. As a result, it can be seen that even though the as-synthesized $Ti_3CNT_x$ films always have smaller $SE_T$ and $SE_A$ values than the as-synthesized $Ti_3C_2T_x$ films, the annealed $Ti_3CNT_x$ films have larger $SE_T$ and $SE_A$ values than the annealed $Ti_3C_2T_x$ films. It can notably be seen that the enhancement in $SE_T$ and $\Delta SE_T$ of $Ti_3CNT_x$ films after annealing or in thicker samples is solely contributed by the $SE_A$ and $\Delta SE_A$ since the $SE_R$ values are almost independent of the annealing temperature.

Example 3.8 Influence of Annealing Time on $Ti_3CNT_x$ MXene Film

Figure 18A:
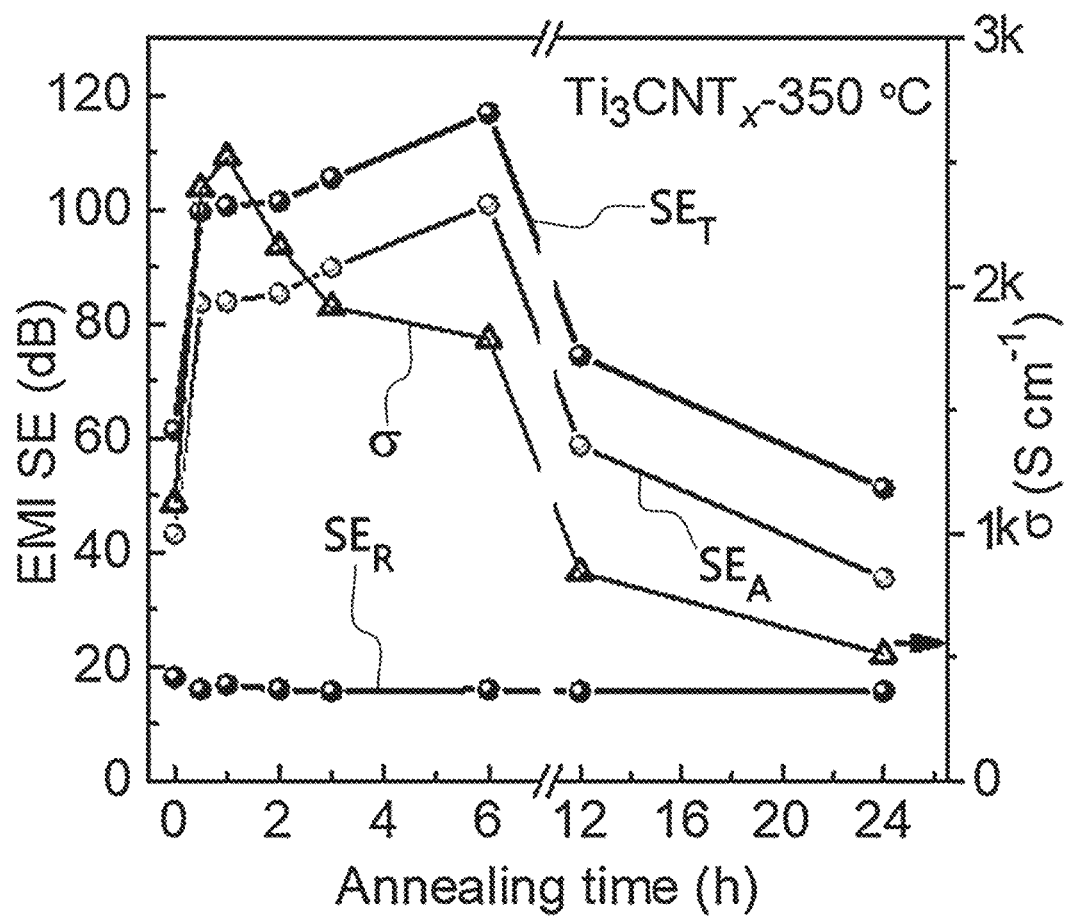
FIG. 18A shows absolute shielding effectiveness $SE_T$, $SE_R$, and $SE_A$, and electrical conductivity of 40 μm-thick $Ti_3CNT_x$ MXene films annealed at 350° C. for different annealing times.
Figure 18B:
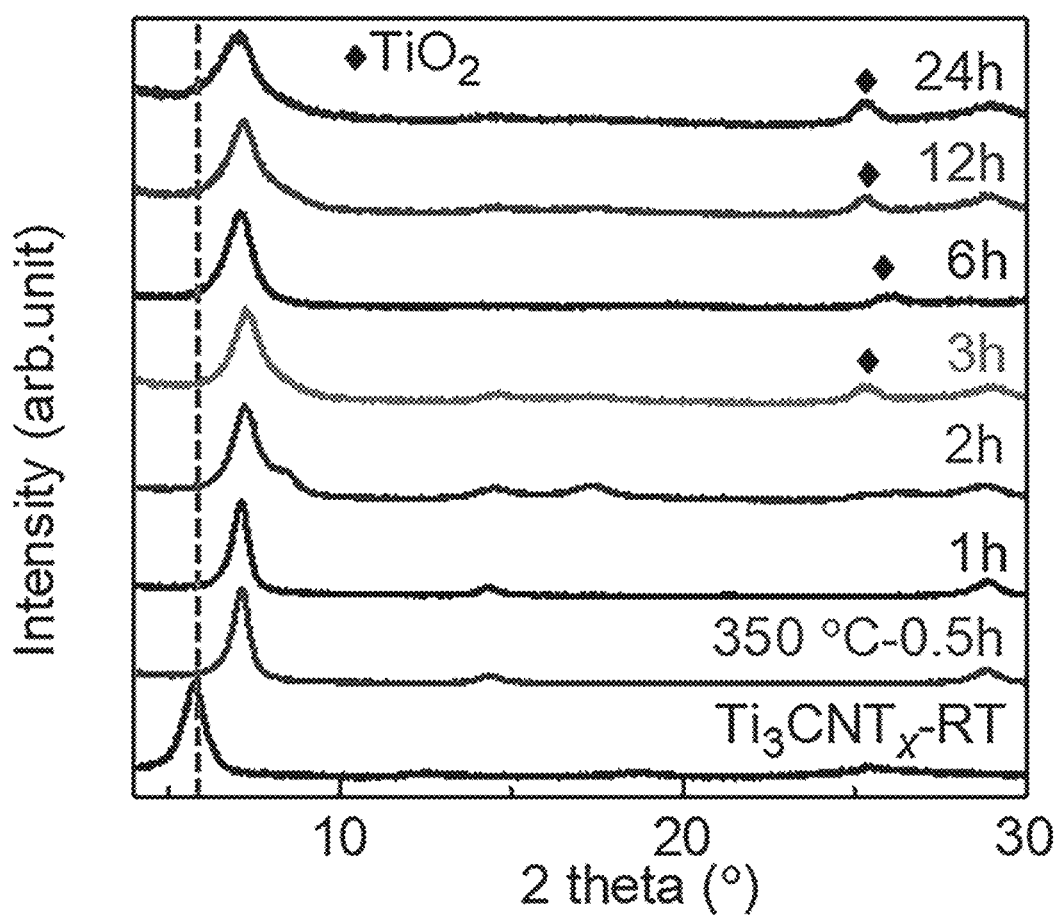
FIG. 18B shows XRD patterns of 40 μm-thick $Ti_3CNT_x$ MXene films annealed at 350° C. for different annealing times.
Figure 18C:
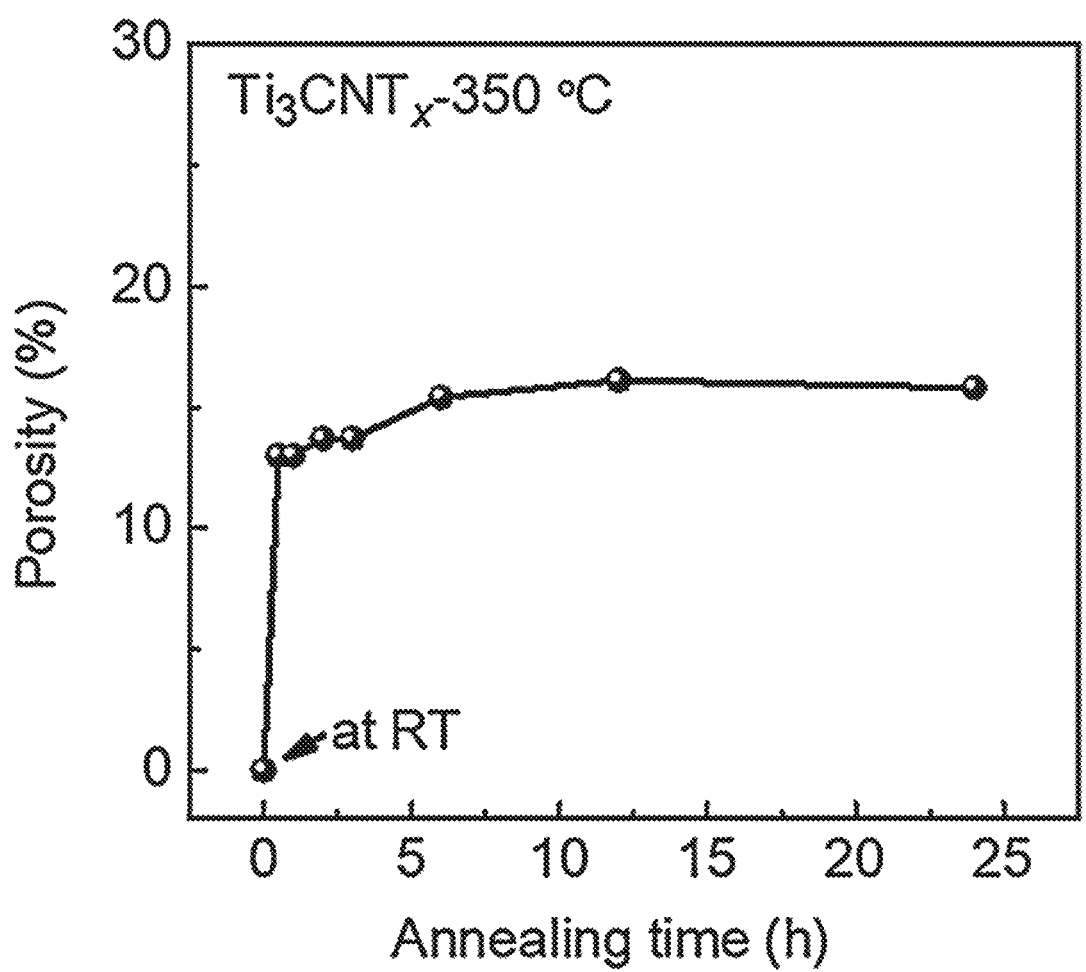
FIG. 18C shows induced porosity in 40 μm-thick $Ti_3CNT_x$ MXene films annealed at 350° C. for different annealing times.
Figure 18D:
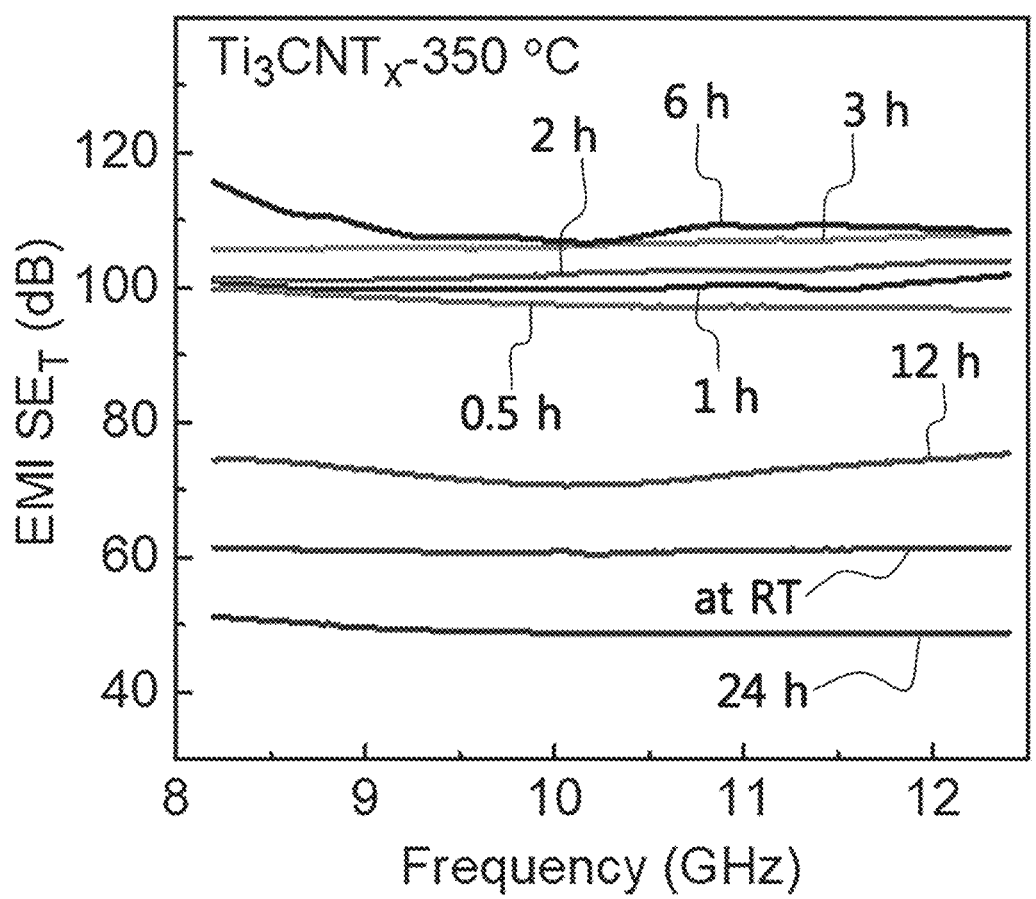
FIG. 18D shows EMI $SE_T$ of 40 μm-thick $Ti_3CNT_x$ MXene films annealed at 350° C. for different annealing times.
Figure 18E:
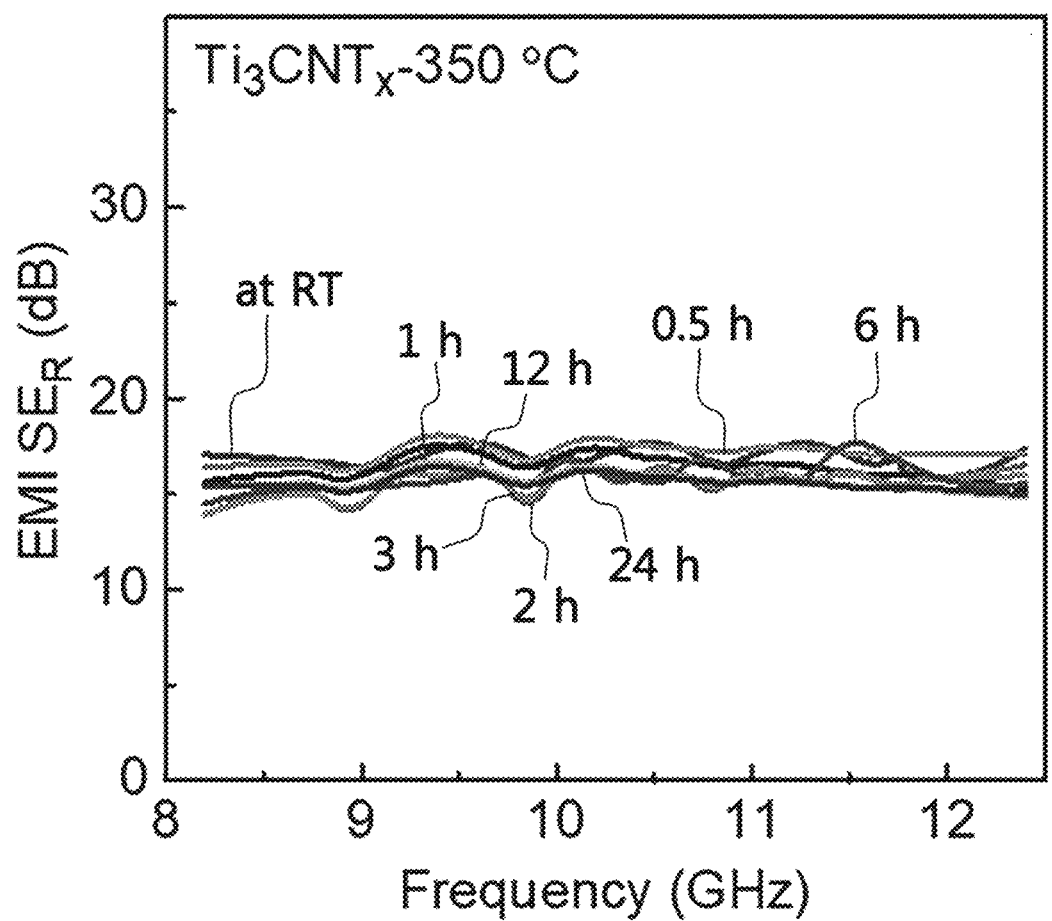
FIG. 18E shows EMI $SE_R$ of 40 μm-thick $Ti_3CNT_x$ MXene films annealed at 350° C. for different annealing times.

FIGS. 18A to 18F show the absolute shielding effectiveness $SE_T$, $SE_R$, and $SE_A$, and electrical conductivity (FIG. 18A), XRD patterns (FIG. 18B), induced porosity in the film (FIG. 18C), EMI $SE_T$ (FIG. 18D), EMI $SE_R$ (FIG. 18E) and EMI $SE_A$ (FIG. 18F) of 40 μm-thick $Ti_3CNT_x$ MXene films annealed at 350° C. for different times, respectively. As shown in FIGS. 18A to 18F, the annealing time also strongly affects the structure and shielding performance of $Ti_3CNT_x$ films. After annealing at 350° C. for 1 hour, the electrical conductivity of $Ti_3CNT_x$ film increases from 1125 S/cm to 2520 S/cm and gradually decreases until reaching 512 S/cm (FIG. 18A) in 24 hours, and this is caused by excessive oxidation (FIG. 18B). The EMI SE of $Ti_3CNT_x$ film also shows a similar tendency. However, when the electrical conductivity value is 1786 S/cm through appropriate oxidation after 6 hour-annealing, highest EMI SE of 116 dB is shown (FIG. 18D), confirming that 2D materials do not have a monotonous increment in EMI SE with increasing conductivity. Due to the saturated pore volume of all the samples treated at 350° C. for the annealing time of the range shown in FIG. 18C, all the annealed films showed similar $SE_R$ values (FIG. 18E), but they had a significant increase in $SE_A$ until the annealing time of up to 6 hours (FIG. 18F), showing extraordinarily improved absorption of electromagnetic waves.

Example 3.9 EMI Shielding Mechanism of $Ti_3CNT_x$ MXene Film

Figure 18F:
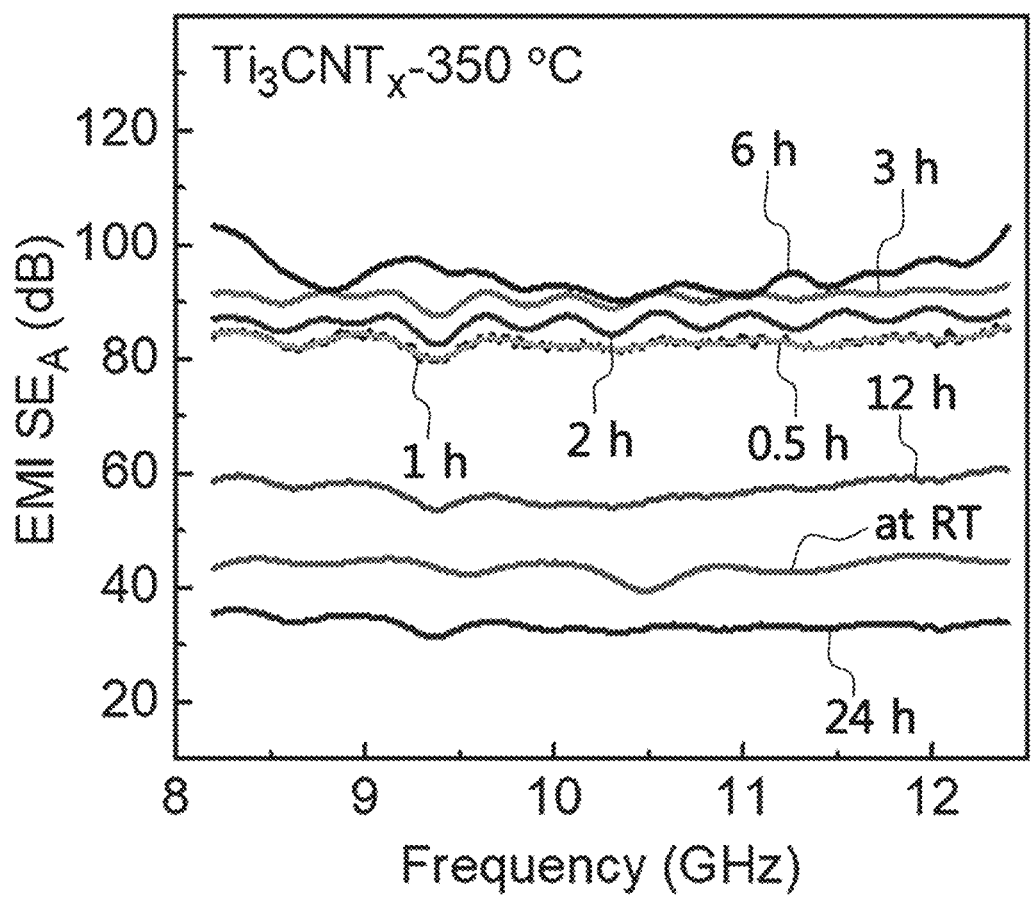
FIG. 18F shows EMI $SE_A$ of 40 μm-thick $Ti_3CNT_x$ MXene films annealed at 350° C. for different annealing times.

The dramatic increase in $SE_A$ as shown in FIG. 18F can partially be attributed to the improved electrical conductivity, induced porosity and dipolar polarizations in the annealed $Ti_3CNT_x$ laminate films. $SE_A$ is strongly proportional to the electrical conductivity, which is responsible for the rapid exponential decay in the strength of incoming EMWs in the form of heat due to resistance (ohmic) and eddy current losses (Equation 9). The porous structure provides extra interfaces for internal reflections that extend the path length of the EM wave during propagation in the film before transmission and provide a higher chance to interact with EMWs, resulting in extra attenuation by absorption (Equations 13 and 14). The remaining surface terminations residing on the $Ti_3CNT_x$ surface and formation of dielectric $TiO_2$ may also contribute to the enhanced absorption of EMWs by generating dipole polarization losses within the shield. On the contrary, reflection contribution $SE_R$ changes depending on electrical conductivity log (Equation 8), and in this case, the changes are very small. Accordingly, the $SE_R$ values of the two MXenes, $Ti_3CNT_x$ and $Ti_3C_2T_x$, show negligible changes after thermal annealing.

The $Ti_3CNT_x$ film annealed at 350° C. has much larger EMI $SE_A$ and $SE_T$ than the $Ti_3CNT_x$ film annealed at 250° C. despite its lower electrical conductivity. Moreover, the $Ti_3CNT_x$ film annealed at 350° C. has much larger EMI $SE_A$ and $SE_T$ than the $Ti_3C_2T_x$ film annealed at the same temperature, which has a much larger electrical conductivity. These results suggest a possible role of the induced porous structure coupled with partial oxidation in enhancing the electromagnetic absorption shielding efficiency, but a quantum mechanical approach is required for interaction of EMWs with nanometer-thin 2D metals, like MXenes, where macroscopic theories cannot be used.

Figure 19:
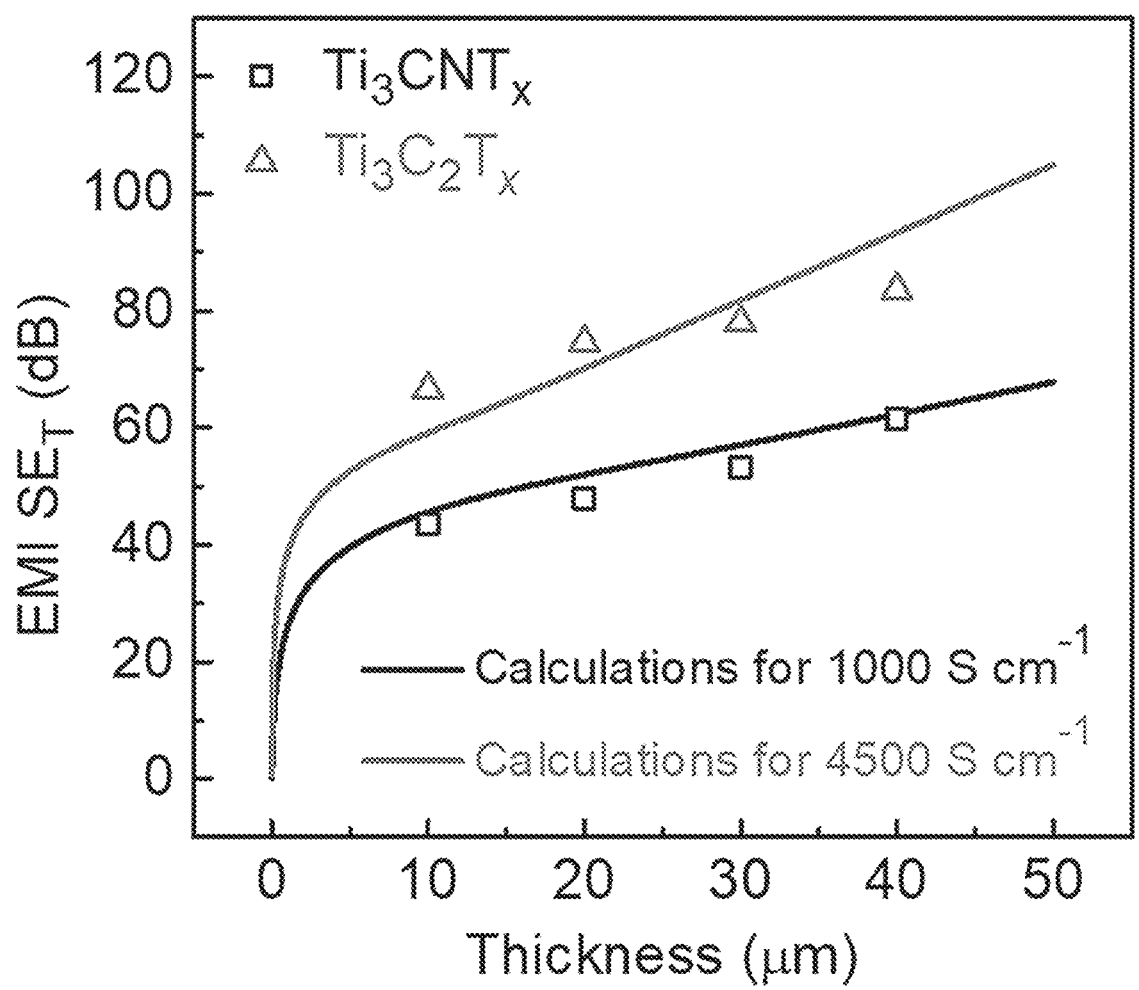
FIG. 19 shows the comparison between experimental EMI $SE_T$ and theoretical EMI $SE_T$ of as-synthesized $Ti_3CNT_x$ and $Ti_3C_2 T_x$ MXene films.
Figure 20A:
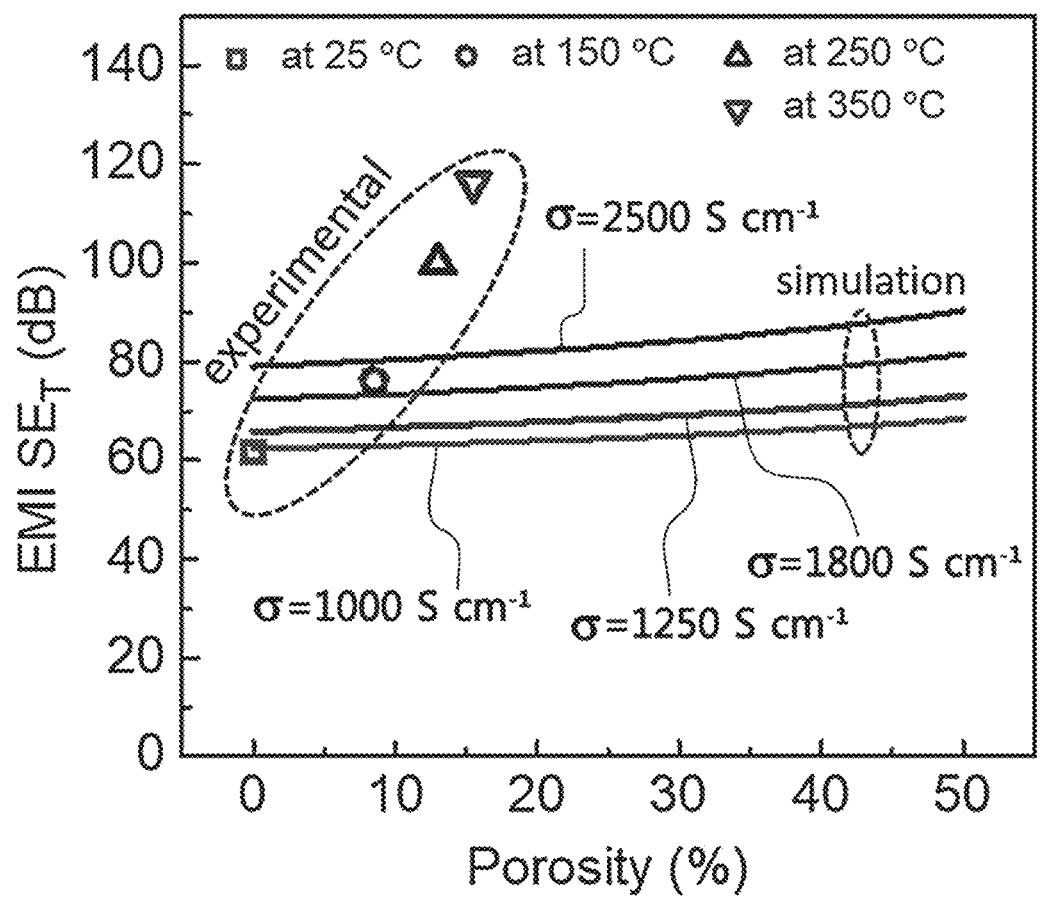
FIG. 20A shows the comparison between experimental EMI $SE_T$ values (indicated by symbols) and theoretical EMI $SE_T$ values (indicated by solid lines) of 40 μm-thick $Ti_3CNT_x$ MXene films annealed at 350° C.
Figure 20B:
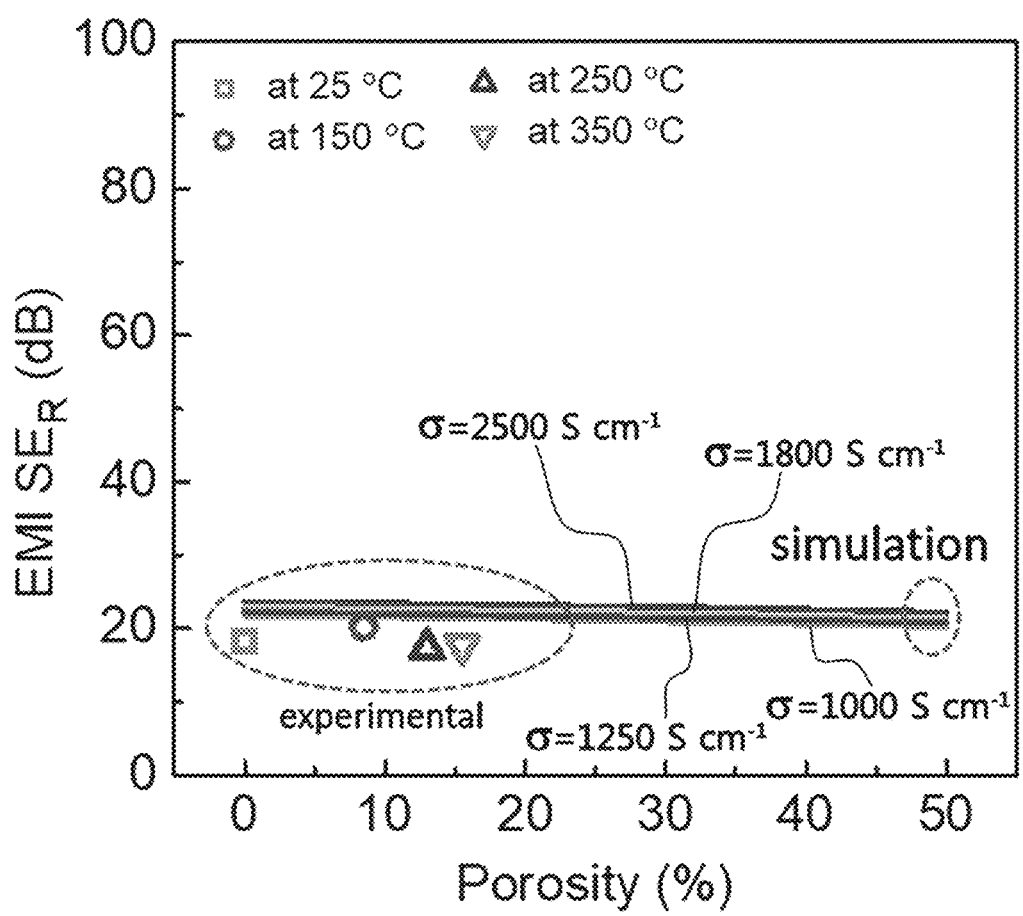
FIG. 20B shows the comparison between experimental EMI $SE_R$ values (indicated by symbols) and theoretical EMI $SE_R$ values (indicated by solid lines) of 40 μm-thick $Ti_3CNT_x$ MXene films annealed at 350° C.
Figure 20C:
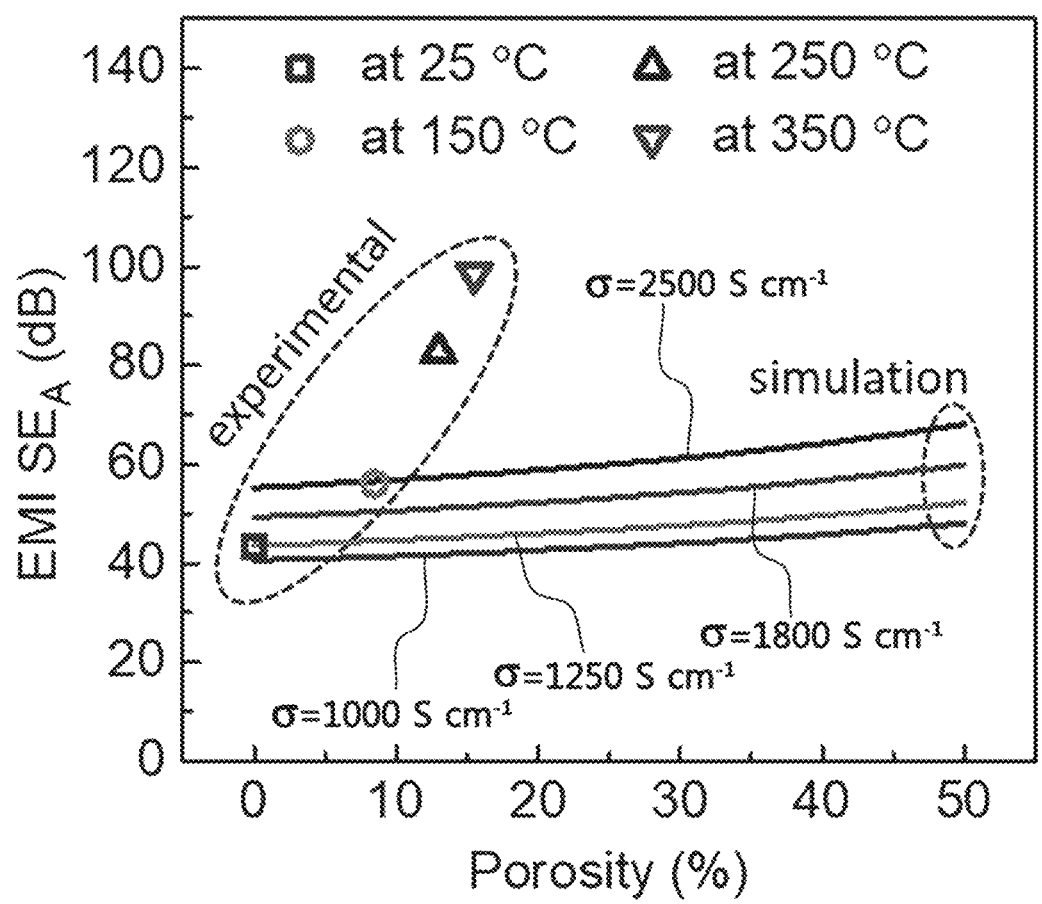
FIG. 20C shows the comparison between experimental EMI $SE_A$ values (indicated by symbols) and theoretical EMI $SE_A$ values (indicated by solid lines) of 40 μm-thick $Ti_3CNT_x$ MXene films annealed at 350° C.
Figure 21A:
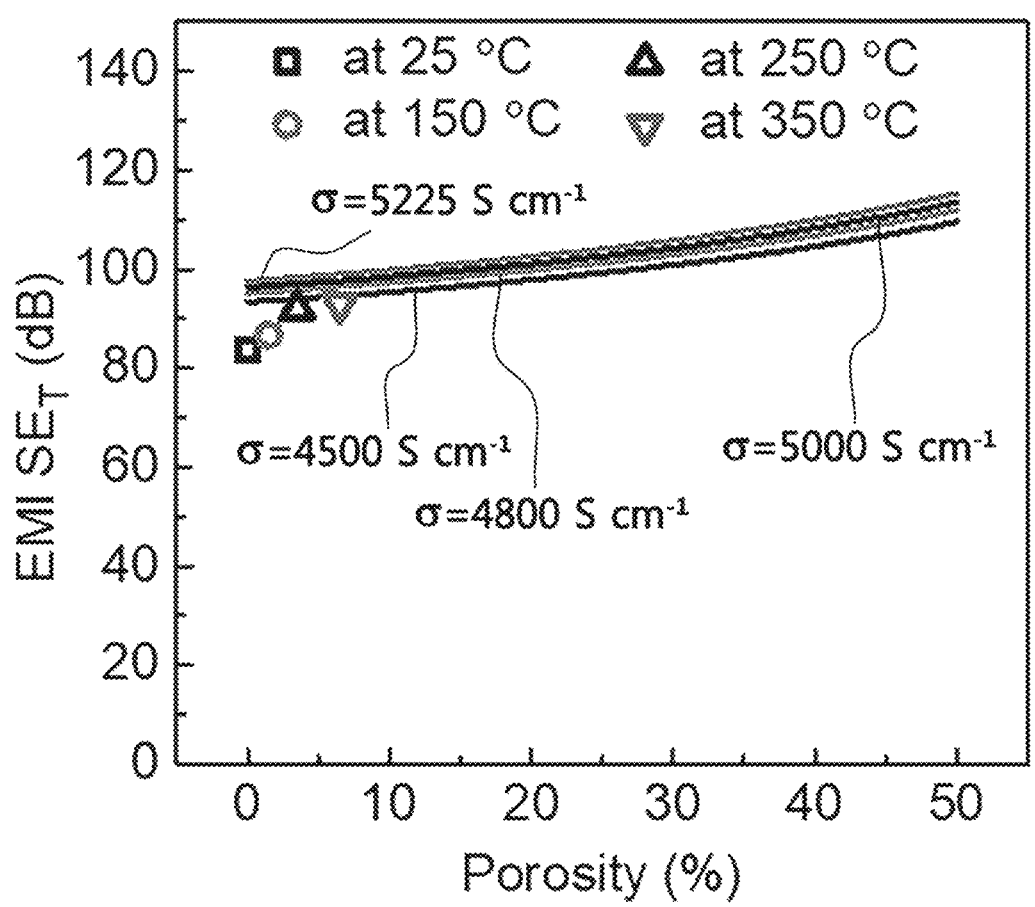
FIG. 21A shows the comparison between experimental EMI $SE_T$ values (indicated by symbols) and theoretical EMI $SE_T$ values (indicated by solid lines) of 40 μm-thick $Ti_3C_2T_x$ MXene films annealed at 350° C.
Figure 21B:
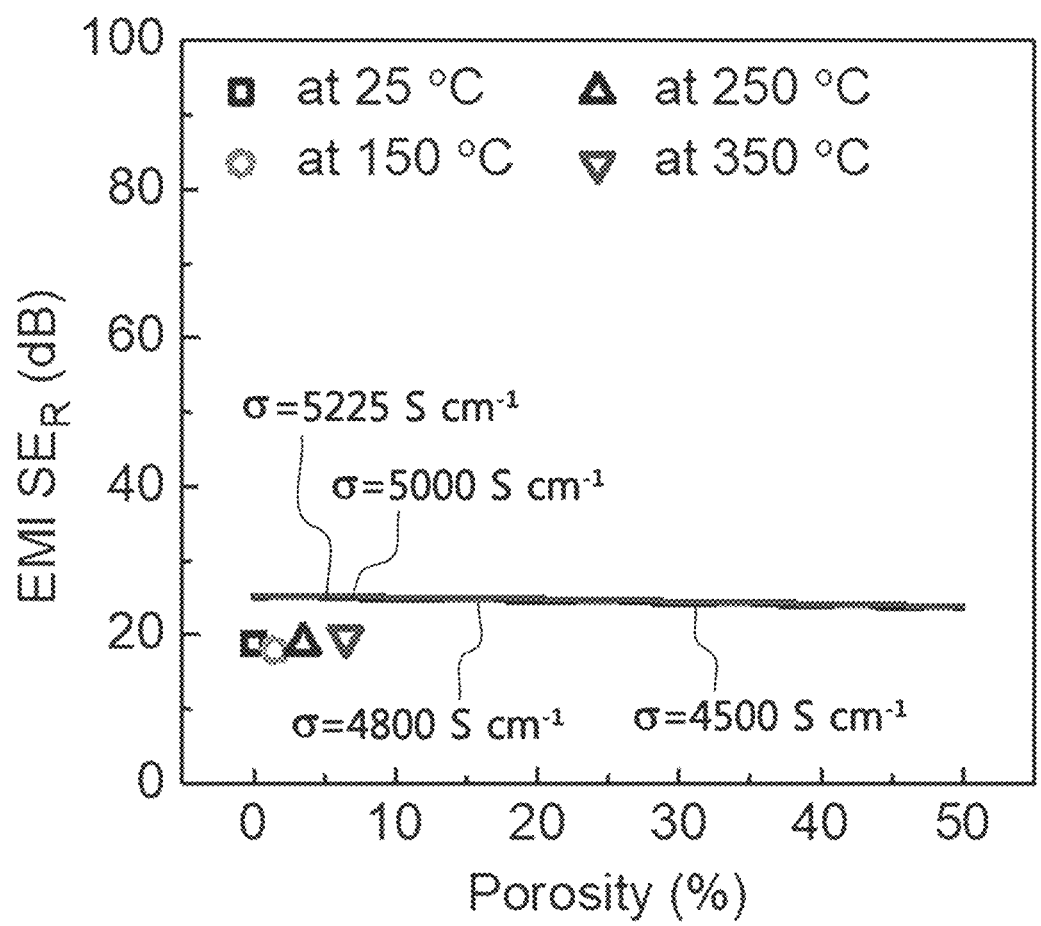
FIG. 21B shows the comparison between experimental EMI $SE_R$ values (indicated by symbols) and theoretical EMI $SE_R$ values (indicated by solid lines) of 40 μm-thick $Ti_3C_2T_x$ MXene films annealed at 350° C.
Figure 21C:
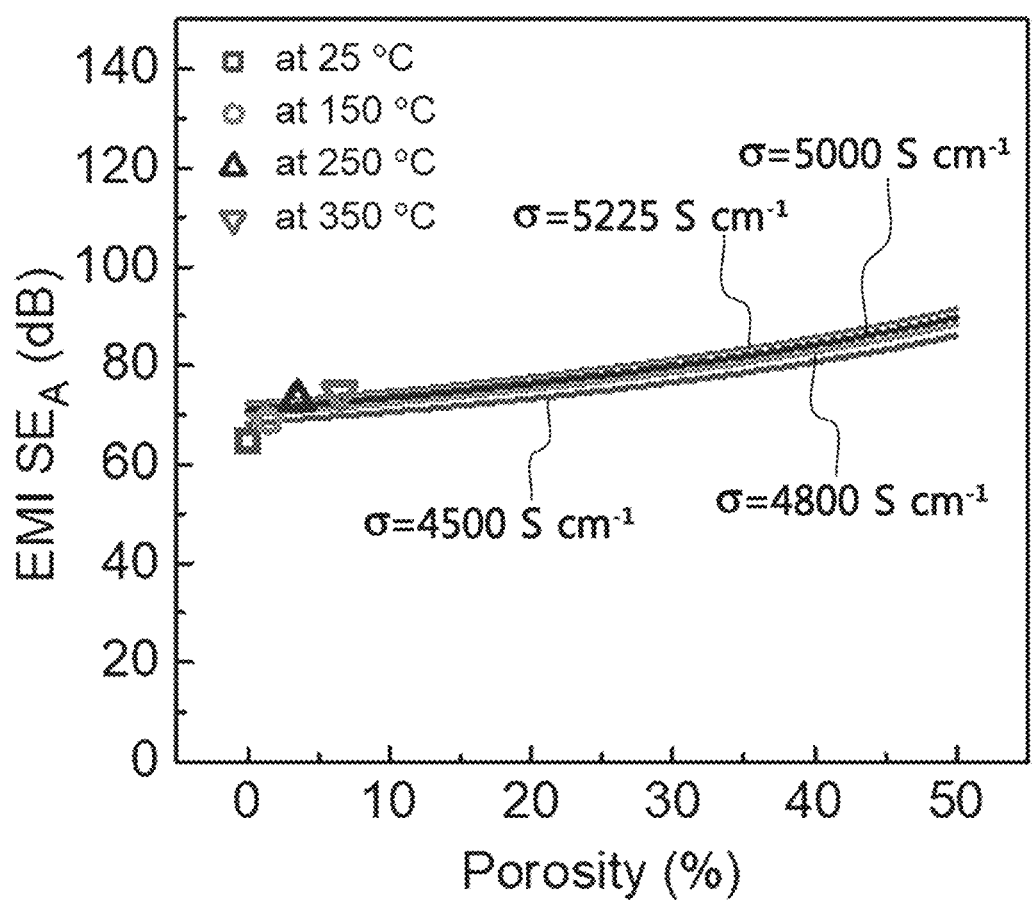
FIG. 21C shows the comparison between experimental EMI $SE_A$ values (indicated by symbols) and theoretical EMI $SE_A$ values (indicated by solid lines) of 40 μm-thick $Ti_3C_2T_x$ MXene films annealed at 350° C.

The experimental $SE_T$, $SE_R$, and $SE_A$ results for $Ti_3CNT_x$ and $Ti_3C_2T_x$ laminate films are compared with the theoretical calculations by the transfer matrix method (for data consistency, see FIG. 19) to investigate the effect of porosity (FIGS. 20A to 20C and FIGS. 21A to 21C). In the experimental data, each data point represents different annealing temperatures. The calculations assume that MXene films have the perfect laminate structure of 2D MXene sheets with infinite sheet area, and the effect of conductivity and porosity of perfect laminate structures were simultaneously considered. According to the calculations, as the conductivity and porosity increase, each of $SE_T$ and $SE_A$ increases, but $SE_R$ hardly changes. As shown in FIGS. 20A and 21A, the experimental $SE_T$ value of the as-synthesized (room temperature) $Ti_3CNT_x$ without heat treatment qualitatively agrees with the theoretical value in the same way as $SE_T$, $SE_R$, and $SE_A$ of the as-synthesized (room temperature) and heat-treated $Ti_3C_2T_x$ films. However, after annealing, a mismatch between experimental and theoretical $SE_T$ values of $Ti_3CNT_x$ MXene occurs and becomes more pronounced as the annealing temperature increases. Similarly, as shown in FIG. 20C, $SE_A$ values of $Ti_3CNT_x$ MXene also show a considerable mismatch between experimental and theoretical values at higher annealing temperatures, whereas as shown in FIG. 20B, all the experimental $SE_R$ values are consistent with the theoretical calculations. This indicates that the mismatch in $SE_T$ is because of the mismatch in $SE_A$, which originates from the unexpectedly large improvement in electromagnetic absorption shielding efficiency after annealing at high temperatures. This again stresses the limitations of traditional models and need for atomistic simulations.

The failure of theoretical prediction of the EMI shielding behavior of the annealed $Ti_3CNT_x$ films indicates that in addition to electrical conductivity and induced porosity, dipolar polarizations and low order of magnitude of MXenes should be considered. In particular, extraordinarily large absorption of annealed $Ti_3CNT_x$ films may be caused by the formation of similar structures to metamaterials from atomically thin MXene sheets after annealing. When loss components of effective dielectric constant and electromagnetic permeability of metamaterials increase, the absorption of electromagnetic radiation is improved. Accordingly, further studies are needed to understand the particular shielding mechanism of $Ti_3CNT_x$ responsible for experimentally observed large absorption ability of the annealed $Ti_3CNT_x$ samples.

Figure 22:
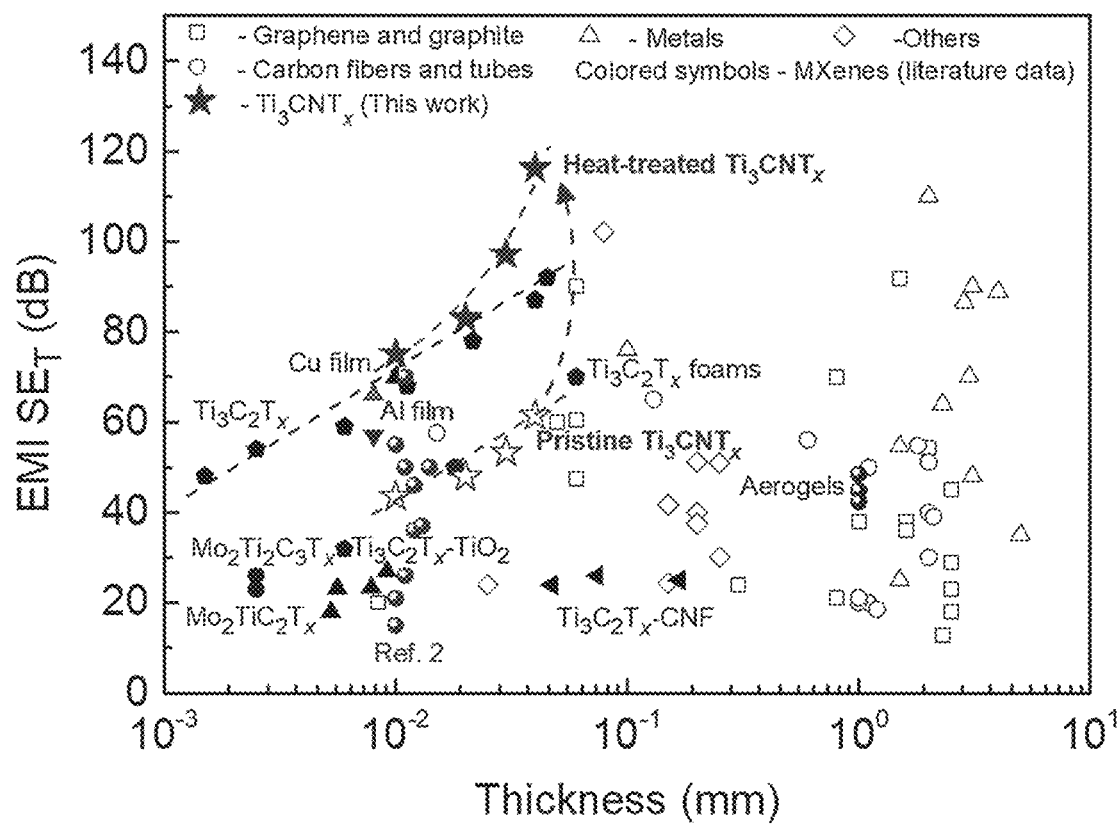
FIG. 22 shows the comparison of EMI $SE_T$ of the reported shielding materials and $Ti_3CNT_x$ MXene films.

The comparison results of EMI $SE_T$ of $Ti_3CNT_x$ films with the values reported in previous studies are shown in FIG. 22 and Table 1 below. Metal-based and carbon-based materials have been on the forefront in the last decade, and in this instance, SE in excess of 50 dB for a thickness between 50 to 100 μm has been considered sufficient for EMI shielding applications. However, difficulties in processing metals into high density thin films limit the use in high-tech mobile applications. The carbon-based materials having low electrical conductivity are difficult to process them to a small thickness and can only provide shielding efficiency. In contrast, as shown in FIG. 22 and Table 1 below, the heat-treated 40 μm-thick $Ti_3CNT_x$ MXene films show absorption dominant EMI SE of 116 dB, well above all materials produced to date, showing its strong potential for EMI shielding and related applications.

TABLE 1

| Type | Filler | Filler [wt. %] | Matrix | Thickness [cm] | EMI SE [dB] | Ref |
|---|---|---|---|---|---|---|
| Graphene and graphite | Graphene | Bulk | / | 0.005 | 60 | 1 |
| | Graphene | Bulk | / | 8.40 × 10$^{-4}$ | 20 | 2 |
| | Graphene(annealed) | Bulk | / | 0.006 | 90 | 3 |
| | Graphene/CNTs | Bulk | / | 0.16 | 38 | 4 |
| | Graphene/CNTs | Bulk | / | 0.16 | 36 | 5 |
| | rGO | 7 | PS | 0.25 | 45.1 | 6 |
| | rGO | 30 | PS | 0.25 | 29 | 7 |
| | rGO | 25 | PEDOT:PSS | 0.08 | 70 | 8 |
| | rGO | 3.07 | PDMS | 0.2 | 54.2 | 9 |
| | Graphene | 0.8 | PDMS | 0.1 | 20 | 10 |
| | rGO/Fe$_3$O$_4$ | 10 | PEI | 0.25 | 18 | 11 |
| | rGO | 10 | PEI | 0.23 | 12.8 | 12 |
| | rGO | 16 | PI | 0.08 | 21 | 13 |
| | rGO | 1 | PU | 0.25 | 23 | 14 |
| | rGO | 3 | Epoxy | 0.1 | 38 | 15 |
| | rGO/Fe$_3$O$_4$ | Bulk | / | 0.03 | 24 | 16 |
| | PEDOT:PSS | 4.6 | rGO | 0.15 | 91.9 | 17 |
| | EG | 98 | HANF | 0.006 | 60.4 | 18 |
| | | 90 | | 0.006 | 47.4 | |
| Carbon (fibres/ nanotubes) | Carbon | / | Bulk | 1 | 51 | 19 |
| | Carbon | / | PN resin | 0.2 | 51.2 | 20 |
| | Carbon foam | / | Bulk | 0.2 | 40 | 21 |
| | CB | 15 | ABS | 0.11 | 20 | 22 |
| | SWCNT | 30 | MWCNT | 0.013 | 65 | 23 |
| | SWCNT | 15 | Epoxy | 0.1 | 20 | 24 |
| | SWCNT | 7 | PS | 0.12 | 18.5 | 25 |
| | MWCNT | 25 | MCMB | 0.06 | 56 | 26 |
| | MWCNT | 15 | ABS | 0.11 | 50 | 22 |
| | MWCNT | 20 | PC | 0.21 | 39 | 27 |
| | MWCNT | 20 | PS | 0.2 | 30 | 28 |
| | MWCNT | 76.2 | WPU | 0.1 | 21.1 | 29 |
| | CNT | 20 | rGO | 0.0015 | 57.6 | 30 |
| | CNT sponge | 1 | PDMS | 0.18 | 54.8 | 31 |
| Metals | Al Foil | Bulk | / | 0.80 × 10$^{-3}$ | 66 | 32 |
| | Cu Foil | | | 0.001 | 70 | |
| | CuNi | Bulk | / | 0.15 | 25 | 33 |
| | CuNi-CNT | | | 0.15 | 54.6 | |
| | Copper | Bulk | / | 0.31 | 90 | 34 |
| | Cu coated beads | / | PCL | 0.2 | 110 | 35 |
| | Ni filament | 7 | PES | 0.285 | 86.6 | 36 |
| | Ag nanowire | 67 | Carbon | 0.3 | 70.1 | 37 |
| | Ag nanowire | 28.6 | WPU | 0.23 | 64 | 38 |
| | Ag nanowire | 4.5 | PI | 0.5 | 35 | 39 |
| | Ag nanowire | 4.5 | PI | 0.5 | 35 | 1 |
| | Ag nanofiber | / | Bulk | 0.01 | 76 | 40 |
| | | | | 0.10 × 10$^{-3}$ | 20 | |
| | SS | Bulk | / | 0.4 | 89 | 36 |
| | SS | 1.1 | PP | 0.31 | 48 | 34 |
| Others | Carbon Foam | Bulk | / | 0.2 | 51.2 | 41 |
| | Carbon Foam | Bulk | / | 0.2 | 40 | 21 |
| | Flexible graphite | Bulk | / | 0.31 | 130 | 42 |
| | | | | 0.079 | 102 | |
| | MoS$_2$ | 30 | Glass | 0.15 | 24.2 | 43 |
| | rGO/γ-Fe$_2$O$_3$ | 75 | PANI | 0.25 | 51 | 44 |
| | rGO/Fe$_3$O$_4$ | 66 | PANI | 0.25 | 30 | 45 |
| | rGO/Fe$_3$O$_4$ | Bulk | / | 0.025 | 24 | 16 |
| | rGO/CNT/Fe$_3$O$_4$ | Bulk | / | 0.2 | 37.5 | 46 |
| | rGO-BaTiO$_3$ | Bulk | / | 0.15 | 41.7 | 47 |

TABLE 1-continued

| Type | Filler | Filler [wt. %] | Matrix | Thickness [cm] | EMI SE [dB] | Ref |
|---|---|---|---|---|---|---|
| MXenes (literature data) | $Ti_3C_2T_x$ film | Bulk | / | $0.15 \times 10^{-3}$ | 48 | 32 |
| | | | | $0.25 \times 10^{-3}$ | 54 | |
| | | | | $0.60 \times 10^{-3}$ | 59 | |
| | | | | $1.12 \times 10^{-3}$ | 68 | |
| | | | | $2.15 \times 10^{-3}$ | 78 | |
| | | | | $4.0 \times 10^{-3}$ | 87 | |
| | | | | $4.50 \times 10^{-3}$ | 92 | |
| | $Ti_3C_2T_x$ film | 90 | SA | $0.80 \times 10^{-3}$ | 57 | 32 |
| | $Mo_2Ti_2C_3T_x$ film | Bulk | / | $0.25 \times 10^{-3}$ | 26 | 32 |
| | $Mo_2Ti_2C_2T_x$ film | | | $0.25 \times 10^{-3}$ | 23 | |
| | MXene foam | Bulk | / | $6.00 \times 10^{-3}$ | 70 | 48 |
| | | | | $1.80 \times 10^{-3}$ | 50 | |
| | | | | $0.60 \times 10^{-3}$ | 32 | |
| | $Ti_3C_2T_x$ | 50 | cellulose | $16.7 \times 10^{-3}$ | 25 | 49 |
| | | 80 | | $7.40 \times 10^{-3}$ | 26 | |
| | | 90 | | $4.70 \times 10^{-3}$ | 24 | |
| | $TiO_2$-$Ti_3C_2$/graphene | / | / | $9.17 \times 10^{-4}$ | 27 | 50 |
| | | | | $7.82 \times 10^{-4}$ | 23.4 | |
| | | | | $5.59 \times 10^{-4}$ | 23.3 | |
| | | | | $5.25 \times 10^{-4}$ | 18 | |
| | $Ti_3C_2$/SWCNT | / | PVA/PSS | $2.07 \times 10^{-5}$ | 3.39 | 51 |
| | $Ti_3C_2$/MWCNT | | | $1.70 \times 10^{-5}$ | 2.81 | |
| | $Ti_3C_2T_x$ aerogel | Bulk | — | 0.10 | 44.8 | 52 |
| | $Ti_2CT_x$ aerogel | | | 0.10 | 48.5 | |
| | $Ti_3CNT_x$ aerogel | | | 0.10 | 42.3 | |
| | $Ti_2CT_x$ | Bulk | / | $1.1 \times 10^{-3}$ | 50 | 53 |
| | $V_2CT_x$ | | / | $1.2 \times 10^{-3}$ | 46 | |
| | $Nb_2CT_x$ | | / | $1.0 \times 10^{-3}$ | 15 | |
| | $Ti_yNb_{2-y}CT_x$ | | / | $1.4 \times 10^{-3}$ | 50 | |
| | $Nb_yV_{2-y}CT_x$ | | / | $1.2 \times 10^{-3}$ | 36 | |
| | $Ti_3C_2T_x$ | | / | $1.4 \times 10^{-3}$ | 70 | |
| | $Ti_3CNT_x$ | | / | $1.0 \times 10^{-3}$ | 55 | |
| | $Mo_2TiC_2T_x$ | | / | $1.0 \times 10^{-3}$ | 21 | |
| | $Nb_4C_3T_x$ | | / | $1.1 \times 10^{-3}$ | 26 | |
| | $Mo_2Ti_2C_3T_x$ | | / | $1.3 \times 10^{-3}$ | 37 | |
| | $Ti_3C_2T_x$ ultrathin film | | / | $5.5 \times 10^{-6}$ | 20 | 54 |
| nes (this work | *Pristine $Ti_3CNT_x$ | Bulk | / | 0.001 | 43.5 | This study |
| | | | | 0.002 | 47.9 | |
| | | | | 0.003 | 53.3 | |
| | | | | 0.004 | 61.4 | |
| | *Heat-treated $Ti_3CNT_x$ | Bulk | / | 0.001 | 75.1 | |
| | | | | 0.002 | 83.0 | |
| | | | | 0.003 | 97.1 | |
| | | | | 0.004 | 116.2 | |
| | *Pristine $Ti_3C_2T_x$ | Bulk | / | 0.001 | 66.5 | |
| | | | | 0.002 | 74.6 | |
| | | | | 0.003 | 77.9 | |
| | | | | 0.004 | 83.5 | |
| | *Heat-treated $Ti_3C_2T_x$ | Bulk | / | 0.001 | 74.1 | |
| | | | | 0.002 | 81.1 | |
| | | | | 0.003 | 85.2 | |
| | | | | 0.004 | 93.0 | |

*CNT: carbon nanotube; rGO: reduced graphene oxide; EG: expanded graphite; CB: carbon black; SWCNT: single-wall carbon nanotube; MWCNT: multi-wall carbon nanotube; PS: polystyrene; PEDOT:PSS: poly(3,4-ethylenedioxythiophene) poly(styrenesulfonate); PEI: polyethylenimine; PI: polyimide; PU: polyurethane; WPU: water-borne polyurethane; HANF: hydrated aramid nanofiber; MCMB: meso-carbon microbead; ABS: acrylonitrile-butadiene-styrene; PDMS: polydimethylsiloxane; PCL: poly(ε-caprolactone); PES: polyethersulfone; PP: polypropylene; PANI: polyaniline; PN resin: phthalonitrile resin; PC: polycarbonate; PVA/PSS: poly(vinyl alcohol)/poly(sodium 4-styrene sulfonate); SS: stainless steel; SA: sodium alginate.

Example 3.10 Dimensional Stability of $Ti_3CNT_x$ MXene Film

Figure 23A:
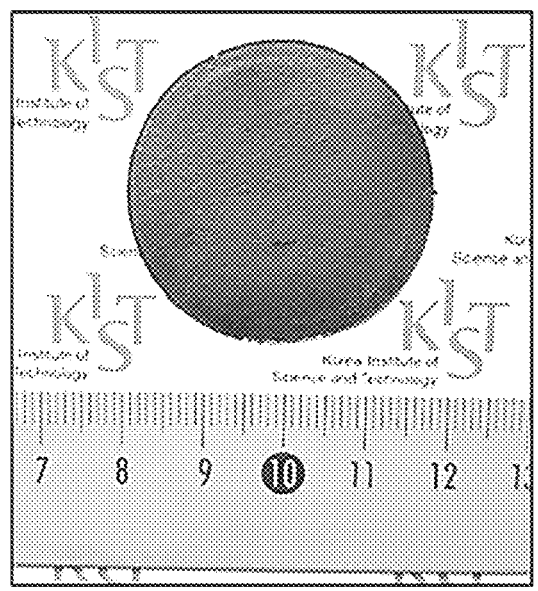
FIG. 23A shows the dimensional stability of $Ti_3CNT_x$ MXene film before annealing.
Figure 23B:
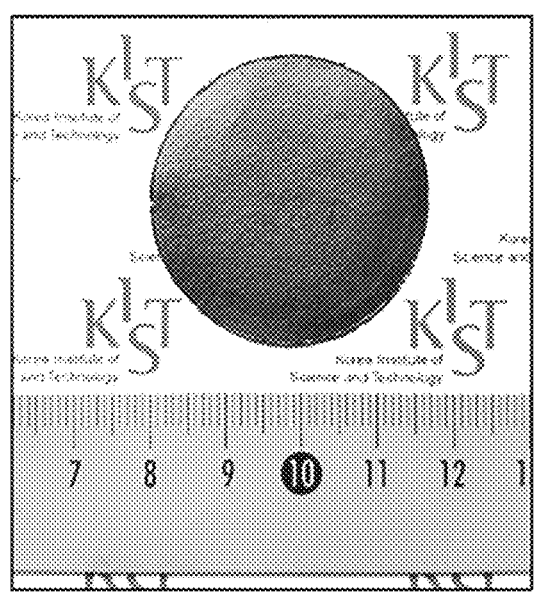
FIG. 23B shows the dimensional stability of $Ti_3CNT_x$ MXene film annealed at 350° C.
Figure 23C:
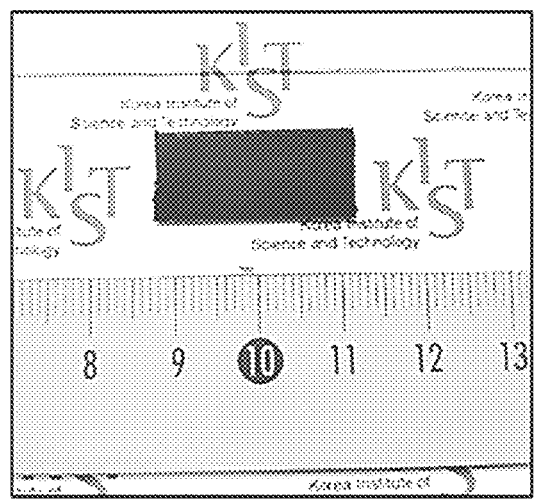
FIG. 23C shows the dimensional stability and adhesive strength of $Ti_3CNT_x$ MXene film spray-coated on a glass substrate before annealing.
Figure 23D:
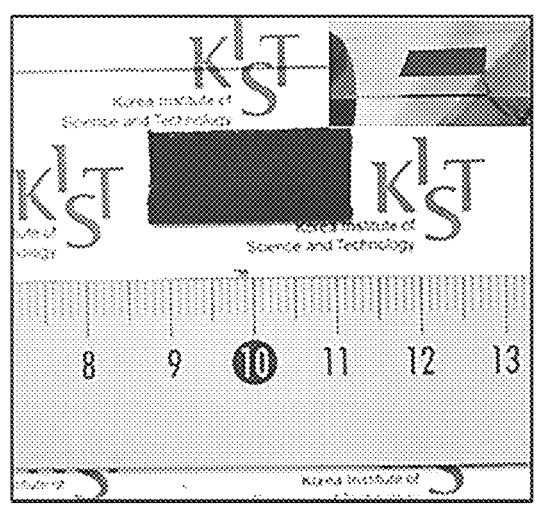
FIG. 23D shows the dimensional stability and adhesive strength of $Ti_3CNT_x$ MXene film spray-coated on a glass substrate, annealed at 350° C.
Figure 23E:
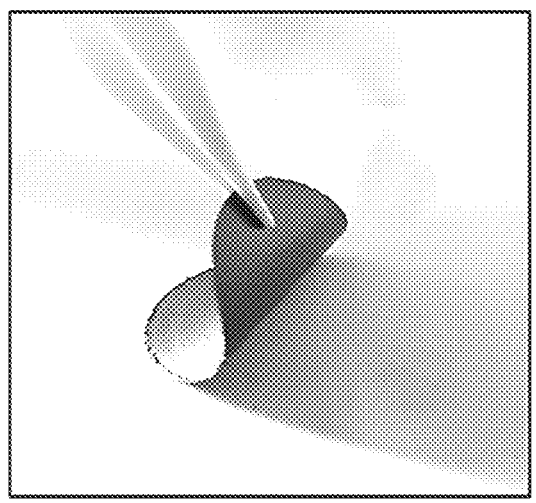
FIG. 23E shows the mechanical flexibility of $Ti_3CNT_x$ MXene film before annealing.
Figure 23F:
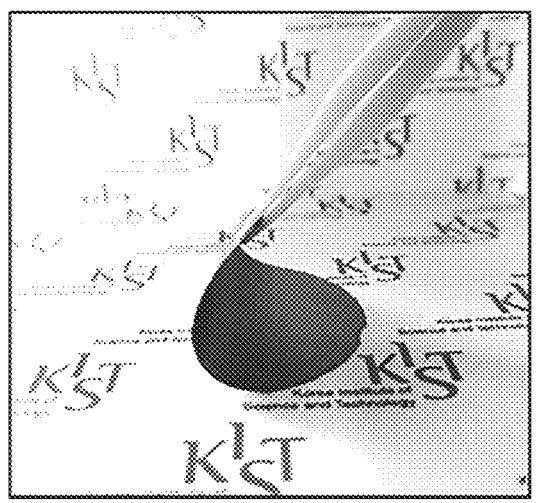
FIG. 23F shows the mechanical flexibility of $Ti_3CNT_x$ MXene film annealed at 350° C.

FIG. 23A shows the dimensional stability of $Ti_3CNT_x$ film before annealing, and FIG. 23B shows the dimensional stability of $Ti_3CNT_x$ MXene film annealed at 350° C. FIG. 23C shows the dimensional stability and adhesive strength of $Ti_3CNT_x$ MXene film spray-coated on the glass substrate before annealing, and FIG. 23D shows the dimensional stability and adhesive strength of $Ti_3CNT_x$ MXene film spray-coated on the glass substrate, annealed at 350° C. FIG. 23E shows the mechanical flexibility of $Ti_3CNT_x$ MXene film before annealing, and FIG. 23F shows the mechanical flexibility of $Ti_3CNT_x$ MXene film annealed at 350° C.

It can be seen from FIGS. 23A to 23F that the annealed $Ti_3CNT_x$ MXene films have low weight and high EMI SE as well as sufficient mechanical strength and flexibility. It is expected that dimensional stability and good adhesion of the annealed $Ti_3CNT_x$ MXene films guarantees the possibility of post-processing heat treatment for thermally stable systems and will be promising in the applications of high-tech flexible mobile electronic devices due to sufficient mechanical flexibility.

What is claimed is:

1. A heat-treated transition metal carbonitride MXene film having a laminated porous structure of at least two layers of transition metal carbonitride 2-dimensional (2D) MXenes comprising a 2D array of crystalline cells having an empirical formula of $M_{n+1}X_n$, each X is positioned within an octahedral array of M, M is a transition metal selected from the group consisting of Group IIIB metal, Group IVB metal, Group VB metal and Group VIB metal, X is a solid solution of C and N, and n is 1, 2 or 3;

wherein said heat-treated transition metal carbonitride MXene film has been annealed at 100-500° C.;

wherein said heat-treated transition metal carbonitride MXene film has a surface electrical conductivity of 1100 S/cm or more;

wherein said heat-treated transition metal carbonitride MXene film is a free-standing film;

wherein said heat-treated transition metal carbonitride MXene film has an electronic interference (EMI) shielding effectiveness (SE) of greater than 90 dB; and wherein said heat-treated transition metal carbonitride MXene film has a d-spacing of 1.21 to 1.36 nm.

2. The heat-treated transition metal carbonitride MXene film according to claim 1, wherein the heat-treated transition metal carbonitride 2D MXenes have an empirical formula of $M'_2M''_nX_{n+1}$, wherein each X is positioned within an octahedral array of M' and M'', M' and M'' are different transition metals selected from M, and n is 1 or 2.

3. The heat-treated transition metal carbonitride MXene film according to claim 1, wherein porosity of the MXene film is 2-90% (v/v).

4. The heat-treated transition metal carbonitride MXene film according to claim 1, wherein surface electrical conductivity of the MXene film is 40-1100-5000 S/cm.

5. The heat-treated transition metal carbonitride MXene film according to claim 1, wherein the MXene film exhibits electromagnetic interference (EMI) shielding effectiveness (SE) of greater than 90-200 dB.

6. The heat-treated transition metal carbonitride MXene film according to claim 1, wherein a thickness of the MXene film is 0.1-5,000 μm.

7. The heat-treated transition metal carbonitride MXene film according to claim 1, wherein the annealing is performed for 0.1-24 hours.

8. The heat-treated transition metal carbonitride MXene film according to claim 1, wherein the MXene film is for EMI shielding and electromagnetic absorption.

9. A polymer composite for electromagnetic interference (EMI) shielding and electromagnetic absorption, comprising the heat-treated transition metal carbonitride MXene film according to claim 1.

10. The polymer composite for EMI shielding and electromagnetic absorption according to claim 9, wherein the heat-treated transition metal carbonitride MXene film is sandwiched between polymers.

11. A method for producing the heat-treated transition metal carbonitride MXene film according to claim 1, the method comprising:

obtaining a MXene aqueous solution containing dispersed 2-dimensional (2D) MXenes from MAX through an acid etching process;

filtering the obtained MXene aqueous solution through a vacuum filtration process to produce a free-standing film; and annealing the produced free-standing film at a temperature of 100-500° C. for 0.1-24 hours to obtain a heat-treated transition metal carbonitride MXene film, wherein M is at least one transition metal selected from the group consisting of Group IIIB metal, Group IVB metal, Group VB metal and Group VIB metal, A is any one selected from Group 13 or 14 elements, and X represents carbon and nitrogen.

12. The method according to claim 11, wherein the annealing is performed under a continuous argon (Ar) flow condition.

13. An electromagnetic interference (EMI) shielding method, comprising:

superposing a coating comprising the heat-treated transition metal carbonitride MXene film according to claim 1 on at least one surface of an object in a contact or non-contact manner.

* * * * *